(12) United States Patent
Katagiri et al.

(10) Patent No.: US 12,353,264 B2
(45) Date of Patent: Jul. 8, 2025

(54) SEMICONDUCTOR DEVICE AND CONTROL SYSTEM

(71) Applicant: SEMICONDUCTOR ENERGY LABORATORY CO., LTD., Atsugi (JP)

(72) Inventors: Haruki Katagiri, Kanagawa (JP); Yosuke Tsukamoto, Kanagawa (JP); Daisuke Furumatsu, Kanagawa (JP); Kyoichi Mukao, Kanagawa (JP); Motohiro Endo, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 633 days.

(21) Appl. No.: 17/636,039

(22) PCT Filed: Aug. 20, 2020

(86) PCT No.: PCT/IB2020/057819
§ 371 (c)(1),
(2) Date: Feb. 17, 2022

(87) PCT Pub. No.: WO2021/038393
PCT Pub. Date: Mar. 4, 2021

(65) Prior Publication Data
US 2022/0334632 A1    Oct. 20, 2022

(30) Foreign Application Priority Data

Aug. 30, 2019  (JP) .................................. 2019-158041

(51) Int. Cl.
*G06F 1/3215* (2019.01)
*G06F 1/3234* (2019.01)
(Continued)

(52) U.S. Cl.
CPC .......... *G06F 1/3215* (2013.01); *G06F 1/3234* (2013.01); *G06F 1/324* (2013.01);
(Continued)

(58) Field of Classification Search
CPC ...... G06F 1/3234; G06F 1/3296; G06F 1/325; G06F 1/3215; G06F 1/324; G06F 1/3275;
(Continued)

(56) References Cited

U.S. PATENT DOCUMENTS

2010/0244942 A1  9/2010  Okano
2011/0016973 A1  1/2011  Hamatani et al.
(Continued)

FOREIGN PATENT DOCUMENTS

CN     102474516 A    5/2012
JP     2006-201948 A  8/2006
(Continued)

OTHER PUBLICATIONS

International Search Report (Application No. PCT/IB2020/057819) Dated Nov. 10, 2020.
(Continued)

*Primary Examiner* — Terrell S Johnson
(74) *Attorney, Agent, or Firm* — NIXON PEABODY LLP; Jeffrey L. Costellia

(57) ABSTRACT

A semiconductor device includes a sensor circuit including a sensor element, and a processing unit comprising a power management unit and an arithmetic processing circuit. The power management unit has a function of controlling power supply to the arithmetic processing circuit. The sensor circuit has a function of judging a sensed signal of the sensor element and supplying an interrupt signal to the processing unit in accordance with the judgment result. The power management unit has a function of restarting or stopping power supply to the arithmetic processing circuit in accordance with the interrupt signal.

10 Claims, 38 Drawing Sheets

(51) Int. Cl.
*G06F 1/324* (2019.01)
*G06F 1/3287* (2019.01)
*G06F 1/3296* (2019.01)
*H10B 10/00* (2023.01)
*H10B 12/00* (2023.01)

(52) U.S. Cl.
CPC .......... *G06F 1/3296* (2013.01); *H10B 10/00* (2023.02); *G06F 1/325* (2013.01); *G06F 1/3275* (2013.01); *G06F 1/3287* (2013.01); *H10B 12/00* (2023.02)

(58) Field of Classification Search
CPC ....... G06F 1/3287; H10B 41/70; H10B 10/00; H10B 12/00; H01L 29/423; H01L 29/7869; H01L 29/78696; H01L 29/417; H01L 29/78648; H01L 29/49; H01L 27/0688; H01L 21/8258
See application file for complete search history.

(56) References Cited

U.S. PATENT DOCUMENTS

| | | | |
|---|---|---|---|
| 2011/0030039 | A1 | 2/2011 | Bilange |
| 2015/0370313 | A1* | 12/2015 | Tamura ............... H01L 29/7869 713/323 |
| 2016/0277040 | A1 | 9/2016 | Tong et al. |
| 2017/0177067 | A1* | 6/2017 | Okada .................. G06F 1/3212 |
| 2019/0092104 | A1* | 3/2019 | Ahmed ................. G06F 1/3287 |

FOREIGN PATENT DOCUMENTS

| | | |
|---|---|---|
| JP | 2010-093347 A | 4/2010 |
| JP | 2014-060784 A | 4/2014 |
| JP | 2016-042352 A | 3/2016 |
| KR | 2012-0047989 A | 5/2012 |
| KR | 2017-0023813 A | 3/2017 |
| TW | 201604684 | 2/2016 |
| WO | WO-2009/078081 | 6/2009 |
| WO | WO-2009/123022 | 10/2009 |
| WO | WO-2011/014698 | 2/2011 |
| WO | WO-2015/083598 | 6/2015 |
| WO | WO-2015/193777 | 12/2015 |

OTHER PUBLICATIONS

Written Opinion (Application No. PCT/IB2020/057819) Dated Nov. 10, 2020.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

\* cited by examiner $a = x_1 w_1 + x_2 w_2 + b$

FIG. 30A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 30B
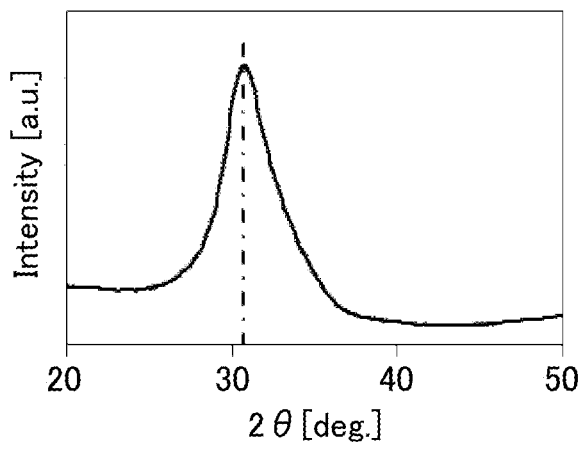
FIG. 30C
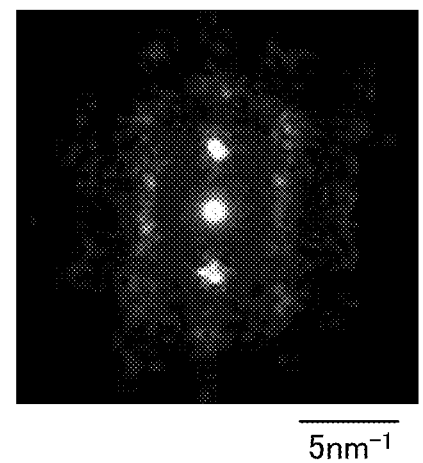

SEMICONDUCTOR DEVICE AND CONTROL SYSTEM

TECHNICAL FIELD

One embodiment of the present invention relates to a semiconductor device. Another embodiment of the present invention relates to a control system.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter. Another embodiment of the present invention relates to a method for controlling a semiconductor device, a method for controlling a system including a semiconductor device, or the like.

In this specification and the like, a semiconductor device generally means a device that can function by utilizing semiconductor characteristics. Thus, a semiconductor element such as a transistor or a diode and a circuit including a semiconductor element are semiconductor devices. A display device, a light-emitting device, a lighting device, an electro-optical device, a communication device, an electronic device, and the like may include a semiconductor element or a semiconductor circuit. Therefore, a display device, a light-emitting device, a lighting device, an electro-optical device, an imaging device, a communication device, an electronic device, and the like are referred to as a semiconductor device in some cases.

BACKGROUND ART

Information terminals that are easy to carry, typified by smartphones, tablet terminals, and the like, have come into widespread use. With the widespread use of information terminals, various communication standards have been established. For example, the use of an LTE-Advanced standard called the fourth-generation mobile communication system (4G) has started.

With the development of information technology such as IoT (Internet of Things), the amount of data handled in information terminals has been recently showing an increasing tendency. In addition, the transmission speed of electronic devices such as information terminals needs to be improved.

In order to be compatible with various kinds of information technology such as IoT, a new communication standard called the fifth-generation mobile communication system (5G) that achieves higher transmission speed, more simultaneous connections, and shorter delay time than 4G has been examined. Note that 5G uses communication frequencies of a 3.7 GHz band, a 4.5 GHz band, and a 28 GHz band.

A 5G compatible semiconductor device is manufactured using a semiconductor containing one kind of element such as Si as its main component or a compound semiconductor containing a plurality of kinds of elements such as Ga and As as its main components. Furthermore, an oxide semiconductor, which is one kind of metal oxide, has attracted attention.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

As techniques for reducing power consumption of semiconductor devices, power gating (PG), clock gating (CG), and voltage scaling are known, for example. Patent Document 1 discloses a technique for effectively reducing power consumption among DVFS (Dynamic Voltage and Frequency Scaling) techniques and PG techniques, for example.

REFERENCE

Patent Document

[Patent Document 1] PCT International Publication No. 2009/078081

Non-Patent Document

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

An object of one embodiment of the present invention is to provide a novel semiconductor device or an operation method of a novel semiconductor device. Another object of one embodiment of the present invention is to provide a novel system including a semiconductor device or an operation method of a novel system including a semiconductor device. Another object of one embodiment of the present invention is to reduce power consumption, for example, to reduce power in a resting state. Another object of one embodiment of the present invention is to shorten time needed for processing of returning to a normal state from a resting state or to reduce energy needed for this processing. Another object of one embodiment of the present invention is to reduce power consumption of a circuit controlling a sensor element. Another object of one embodiment of the present invention is to enhance safety of a subject monitored by a sensor element. Another object of one embodiment of the present invention is to provide a system that monitors a subject in a simple way. Another object of one embodiment of the present invention is to provide a semiconductor device with low power consumption. Another object of one embodiment of the present invention is to provide a control circuit with low power consumption. Another object of one embodiment of the present invention is to provide a highly safe system.

Note that the description of a plurality of objects does not preclude the existence of each object. One embodiment of the present invention does not necessarily achieve all of these objects. Objects other than those listed above will be apparent from the description of the specification, the drawings, the claims, and the like, and such objects could be objects of one embodiment of the present invention.

Means for Solving the Problems

One embodiment of the present invention is a semiconductor device including a sensor circuit, a power management unit, and an arithmetic processing circuit. The sensor circuit includes a sensor element. The power management unit has a function of controlling power supply to the arithmetic processing circuit. The arithmetic processing circuit includes a first circuit including a first storage circuit and a second circuit including a second storage circuit. The first circuit has a function of retaining first data during a period where electric power is supplied to the arithmetic processing circuit. The second circuit has a function of reading out the first data retained in the first storage circuit and writing the first data to the second storage circuit during the period where electric power is supplied to the arithmetic processing circuit, and a function of retaining the first data in the second storage circuit during a period where power supply to the arithmetic processing circuit is stopped. The sensor circuit has a function of judging a sensed signal of the sensor element and supplying second data to the power management unit in accordance with a judgment result. The power management unit has a function of restarting or stopping power supply to the arithmetic processing circuit in accordance with the second data. Power supply to a circuit means to supply electric power to a circuit, for example.

In the above structure, the second circuit preferably has a function of reading out the first data from the second storage circuit and supplying the first data to the first storage circuit after power supply to the arithmetic processing circuit restarts.

In the above structure, it is preferable that an antenna and a secondary battery be included, the power management unit have a function of supplying power to the arithmetic processing circuit from the secondary battery, and the arithmetic processing circuit include a modulation circuit and a demodulation circuit.

In the above structure, the sensor element preferably has a function of measuring one or more selected from force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, vibration, odor, and infrared rays.

Another embodiment of the present invention is a semiconductor device including a sensor circuit, a power management unit, and an arithmetic processing circuit. The sensor circuit includes an acceleration sensor. The power management unit has a function of controlling power supply to the arithmetic processing circuit. The arithmetic processing circuit includes a first circuit including a first storage circuit and a second circuit including a second storage circuit. The first circuit has a function of retaining first data in the first storage circuit during a period where electric power is supplied to the arithmetic processing circuit. The second circuit has a function of reading out the first data retained in the first storage circuit and writing the first data to the second storage circuit during the period where electric power is supplied to the arithmetic processing circuit, and a function of retaining the first data in the second storage circuit during a period where power supply to the arithmetic processing circuit is stopped. The sensor circuit has a function of judging a sensed signal of the acceleration sensor and supplying second data to the power management unit in accordance with a judgment result. The power management unit has a function of restarting or stopping power supply to the arithmetic processing circuit in accordance with the second data.

Another embodiment of the present invention is a control system including the above-described semiconductor device and a control device. The acceleration sensor has a function of sensing vibration of an object. The control device has a function of controlling the object. The sensor circuit has a function of judging the sensed signal of the acceleration sensor and restarting power supply to the arithmetic processing circuit in the case where the sensor circuit determines that the acceleration sensor senses abnormal vibration of the object. The arithmetic processing circuit has a function of analyzing the sensed signal of the acceleration sensor as power supply is restarted and supplying third data to the control device in accordance with an analysis result. The control device has a function of controlling the object in accordance with the second data.

In the above structure, it is preferable that the semiconductor device include an antenna, the arithmetic processing circuit include a modulation circuit and a demodulation circuit, and the third data be supplied from the semiconductor device to the control device via wireless communication.

In the above structure, it is preferable that the semiconductor device include a secondary battery and the power management unit have a function of supplying power from the secondary battery to the arithmetic processing circuit.

Effect of the Invention

One embodiment of the present invention can provide a novel semiconductor device or an operation method of a novel semiconductor device. One embodiment of the present invention can provide a novel system including a semiconductor device or an operation method of a novel system including a semiconductor device. One embodiment of the present invention can reduce power consumption, for example, reduce power in a resting state. One embodiment of the present invention can shorten time needed for processing of returning to a normal state from a resting state or reduce energy needed for this processing. One embodiment of the present invention can reduce power consumption of a circuit controlling a sensor element. One embodiment of the present invention can enhance safety of a subject monitored by a sensor element. One embodiment of the present invention can provide a system that monitors an object in a simple way. One embodiment of the present invention can provide a semiconductor device with low power consumption. One embodiment of the present invention can provide a control circuit with low power consumption. One embodiment of the present invention can provide a highly safe system.

Note that the description of these effects does not preclude the existence of other effects. One embodiment of the present invention does not have to achieve all the effects described as examples. In one embodiment of the present invention, other objects, effects, and novel features are apparent from the description of this specification and the drawings.

BRIEF DESCRIPTION OF THE DRAWINGS

FIG. 30A is a table showing classifications of crystal structures of IGZO. FIG. 30B is a graph showing an XRD spectrum of a CAAC-IGZO film. FIG. 30C is an image showing a nanobeam electron diffraction pattern of a CAAC-IGZO film.

MODE FOR CARRYING OUT THE INVENTION

Figure 1:
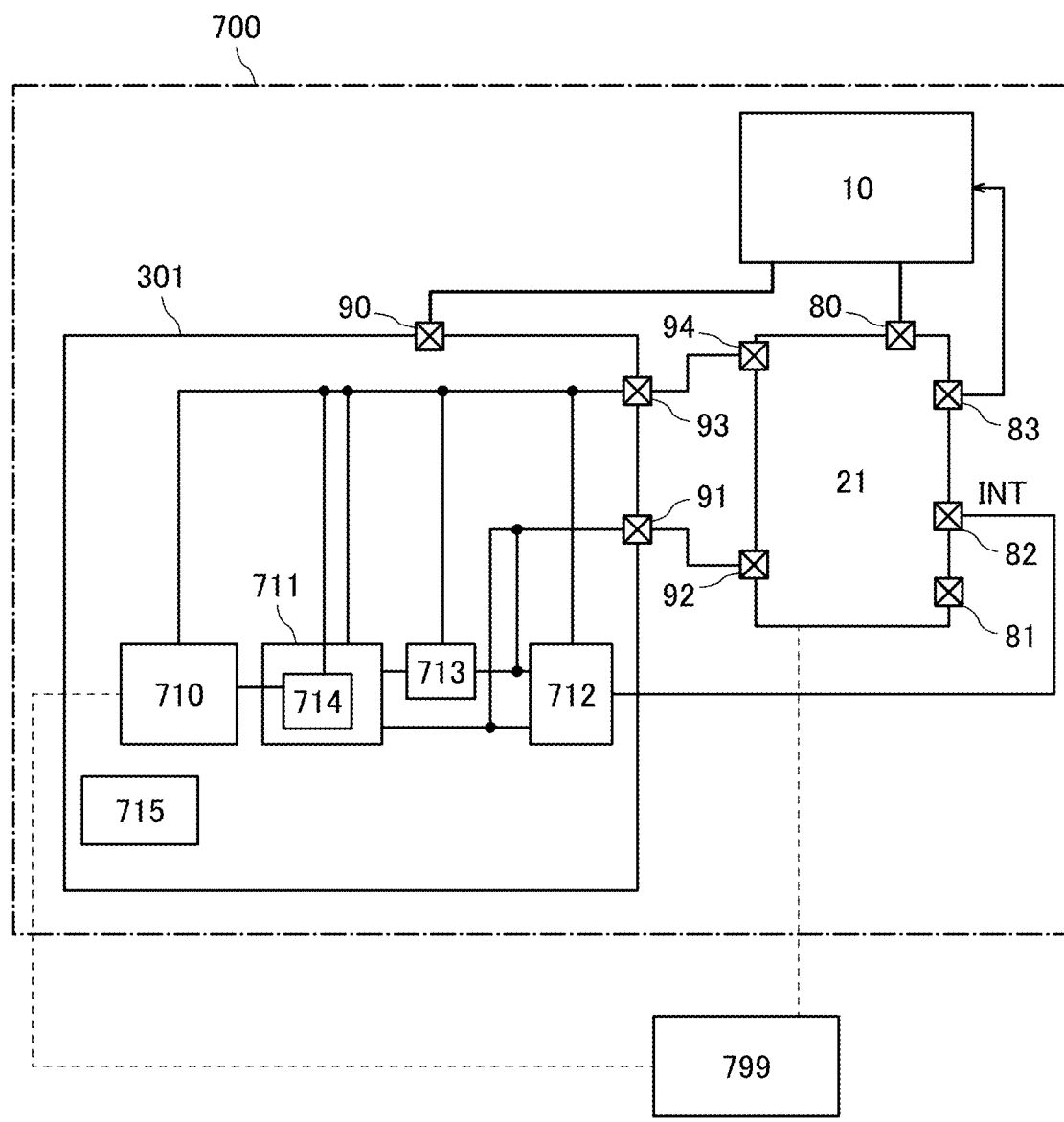
FIG. 1 is a block diagram illustrating a structure example of a semiconductor device.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

In addition, the position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in drawings and the like. For example, in an actual manufacturing process, a resist mask or the like might be unintentionally reduced in size by treatment such as etching, which might not be reflected in the drawings for easy understanding.

Furthermore, in a top view (also referred to as a "plan view"), a perspective view, or the like, the description of some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs a current, inputs or outputs a voltage, or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

In addition, functions of a source and a drain are interchanged with each other depending on operation conditions and the like, for example, when a transistor of different polarity is employed or when the current direction is changed in a circuit operation; therefore, it is difficult to define which is the source or the drain. Thus, the terms "source" and "drain" can be interchangeably used in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit.

Furthermore, in this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

In addition, a voltage refers to a potential difference between a certain potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that a "semiconductor" has characteristics of an "insulator" when conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" described in this specification can be replaced with each other in some cases.

Furthermore, a "semiconductor" has characteristics of a "conductor" when conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high power supply potential (hereinafter, also referred to as "power supply potential VDD", "VDD", "H potential", or "H") is a power supply potential higher than a low power supply potential (hereinafter, also referred to as "power supply potential VSS", "VSS", "L potential", or "L"). VSS refers to a power supply potential at a potential lower than VDD. A ground potential (hereinafter, also simply referred to as "GND" or "GND potential") can be used as VDD or VSS. For example, in the case where VDD is a ground potential, VSS is a potential lower than the ground potential, and in the case where VSS is a ground potential, VDD is a potential higher than the ground potential.

In addition, in this specification and the like, a gate refers to part or the whole of a gate electrode and a gate wiring. A gate wiring refers to a wiring for electrically connecting at least one gate electrode of a transistor to another electrode or another wiring.

Furthermore, in this specification and the like, a source refers to part or the whole of a source region, a source electrode, or a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

Moreover, in this specification and the like, a drain refers to part or the whole of a drain region, a drain electrode, or a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the potentials of a wiring, an electrode and the like, "H" representing an H potential or "L" representing an L potential is sometimes written near the wiring, the electrode, and the like. In addition, enclosed "H" or "L" is sometimes written near a wiring, an electrode, and the like whose potential changes. Moreover, a symbol "x" is sometimes written on a transistor in an off state.

Note that a terminal may refer to a group of a plurality of terminals. Each terminal included in a group of a plurality of terminals is supplied with an independent signal, for example, and each terminal is electrically connected to one or more wirings.

A transistor includes three terminals (nodes) called a gate, a source, and a drain. The gate is a terminal that functions as a control terminal for controlling the conduction state of the transistor. Depending on the type of the transistor and the levels of potentials supplied to respective terminals (nodes), one of a pair of input/output terminals (nodes) functioning as a source and a drain serves as a source and the other serves as a drain. In general, in an n-channel transistor, a node to which a lower potential is supplied is called a source, and a node to which a higher potential is supplied is called a drain. Conversely, in a p-channel transistor, a node to which a lower potential is supplied is called a drain, and a node to which a higher potential is supplied is called a source. In this specification, two terminals (nodes) other than a gate are referred to as a first terminal (node) and a second terminal (node) in some cases.

In this specification, for easy understanding of a circuit structure and its operation, description is sometimes made on the case where one of two input/output terminals (nodes) of a transistor is fixed as a source and the other is fixed as a drain. It is needless to say that, depending on a driving method, the magnitude relationship between potentials applied to three terminals of the transistor might be changed, and the source and the drain might be interchanged with each other. Thus, in one embodiment of the present invention, the distinction between the source and the drain of the transistor is not limited to that described in this specification and the drawings.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where an embodiment in which a connection portion is specified is disclosed in this specification and the like, it can sometimes be determined that one embodiment of the invention in which a connection portion is not specified is disclosed in this specification and the like. In particular, in the case where the number of portions to which the terminal is connected is more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function is specified, one embodiment of the present invention can be clear. Furthermore, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Embodiment 1

In this embodiment, a semiconductor device of one embodiment of the present invention and an application example of the semiconductor device are described.

<Structure Example of Semiconductor Device>

A semiconductor device 700 illustrated in FIG. 1 includes a processing unit (PU) 21, a sensor circuit 301, and a power supply circuit 10.

The PU 21 includes a terminal 80, a terminal 81, a terminal 82, a terminal 83, a terminal 92, and a terminal 94. The PU 21 has a function of executing an instruction included in a program or the like. When the PU 21 has a structure including a transistor including an oxide semiconductor in a channel formation region (hereinafter, an OS transistor), power consumption in a resting state can be extremely low. Furthermore, it is possible to greatly shorten time needed to return to a normal state from a resting state. Detailed description of the PU 21 is made later. A PU 20 to be described later may be used instead of the PU 21. As described later, the PU 20 and the PU 21 each include a processor core, a power management unit, a clock control circuit, a power switch, and the like. The processor core is a circuit capable of executing an instruction and can be referred to as an arithmetic processing circuit.

The sensor circuit 301 includes a sensor element 710, a sensing portion 711, a terminal 90, a terminal 91, and a terminal 93.

The sensor circuit 301 has a function of supplying a signal based on a sensing result of the sensor element 710 to the PU 21. The PU 21 has a function of processing an instruction using the signal supplied from the sensor circuit 301. The PU 21 has a function of supplying a control signal for controlling each circuit included in the sensor circuit 301.

The sensor circuit 301 may include one or both of a judgment circuit 712 and an analog-digital converter circuit 713.

A signal sensed by the sensor element 710 is supplied to the sensing portion 711. The sensing portion 711 has a function of supplying the sensed signal from the sensor element 710 to the terminal 91 and circuits such as the judgment circuit 712 and the analog-digital converter circuit 713. The sensed signal supplied to the terminal 91 is supplied from the terminal 91 to the terminal 92 of the PU 21. The sensing portion 711 may perform processing such as amplification or compressing on the sensed signal and then supply the processed sensed signal to each circuit or the terminal.

The sensor element 710 preferably has a function of measuring one or more selected from force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, vibration, odor, and infrared rays.

The sensor element 710 has a function of measuring a parameter indicating the state of an object 799.

The PU 21 preferably has a function of supplying a control signal to the object 799. The PU 21 may be electrically connected to the object 799. Furthermore, the PU 21 may have a function of supplying a control signal to the object 799 wirelessly.

The sensor element 710 included in the semiconductor device 700 may or may not be electrically connected to the object 799.

The semiconductor device 700 is preferably provided in contact with the object 799, for example. Alternatively, the semiconductor device 700 is preferably provided in the vicinity of the object 799. The distance between the semiconductor device 700 and the object 799 is determined depending on the detectable range of a signal. For example, in the case where vibration of the object 799 is sensed, the semiconductor device 700 is preferably provided in contact with the object 799. Alternatively, the semiconductor device 700 is preferably provided at a distance of 5 mm or less. For example, in the case where sensing data is supplied from the object 799 to the semiconductor device 700 via wireless communication, the semiconductor device 700 is provided in a range where the wireless communication is possible.

The semiconductor device 700 can monitor a signal sensed by the sensor element 710.

Monitoring a signal refers to comparing a sensed signal with reference data, for example. Alternatively, monitoring a signal refers to determining whether a sensed signal is out of a desired range, for example. Determining whether a sensed signal is out of a desired range can be performed by comparing the sensed signal with reference data, for example. Alternatively, features of sensed waveforms are extracted, specifically, a frequency component is extracted, and analyzed, for example.

Reference data can be stored in a memory included in the semiconductor device 700. For example, reference data is stored in a cache included in the PU 21. When a backup circuit including an OS transistor is provided in the cache and data is saved there, data can be retained for a long time even when power supply is stopped or supply of a clock signal is stopped. After power supply is restarted, saved data can be restored at high speed. The cache and the backup circuit are described in detail later.

In addition, the sensed signal can also be stored in the cache.

In the monitoring process, the sensed signal is examined and a control signal based on the examination result is supplied to the object 799 from the PU 21. With the supplied control signal, the object 799 continues the operation, limits the operation, or stops the operation, for example.

The PU 21 may include a neural network. Monitoring and examining a signal may be performed by an arithmetic operation using the neural network. Learning of the neural network may be performed in the PU 21, or a result of learning may be stored in a memory of the PU 21 in advance.

For example, abnormal waveforms are learned as learning data and sensed signals are analyzed using the neural network.

A structure example of the neural network is described in detail later.

The sensed signal does not need to be always monitored; power gating of the processor core of the PU 21 is performed during a period in which monitoring is not performed, and the PU 21 is set to a resting state, whereby power consumption can be reduced.

In the case where the PU 21 is in a resting state, the sensor circuit 301 may also be in a resting state. Specifically, for example, power supply from the power supply circuit 10 is stopped.

Alternatively, in the case where the PU 21 is in a resting state, the sensor circuit 301 may be in a normal state. As described later, when a signal is supplied from the sensor circuit 301, the PU 21 can be returned to a normal state from a resting state.

The sensor circuit 301 preferably includes the judgment circuit 712. The judgment circuit 712 judges a signal from the sensor element 710. The judgment circuit 712 compares the signal from the sensor element 710 with desired data, for example. As an example of abnormality sensed by the judgment circuit 712, the case can be given in which a signal sensed by the sensor element 710 has a value outside a desired range.

During a period in which the sensor element 710 included in the sensor circuit 301 performs sensing, saving sequence is executed and power gating of the processor core or the like included in the PU 21 is performed, whereby the PU 21 can be set to a resting state.

The PU 21 can determine, on the basis of the judgment result of the judgment circuit 712, whether or not to return to a normal state from a resting state. Specifically, for example, in the case where a signal supplied to the sensing portion 711 from the sensor element 710 is determined to be abnormal in the judgment circuit 712, the judgment circuit 712 supplies a signal INT that is a signal for requesting interrupt processing to the terminal 82. With the signal INT, the PU 21 returns to a normal state and starts to monitor the sensed signal from the sensing portion 711.

The PU 21 of one embodiment of the present invention can shorten time needed to return to a normal state from a resting state. That is, the PU 21 can return to a normal state immediately after time when the judgment circuit 712 senses abnormality, and sensing of a signal can start immediately. Thus, an abnormal signal can be obtained even when abnormality occurs in a short time.

The sensor circuit 301 may include the analog-digital converter circuit 713. The analog-digital converter circuit 713 converts an analog signal supplied to the sensing portion 711 from the sensor element 710 into a digital signal and then supplies the digital signal to the judgment circuit 712 and the terminal 91. The signal supplied to the terminal 91 is supplied to the terminal 92 of the PU 21.

The PU 21 may include an analog-digital converter circuit. A signal supplied from the sensor circuit 301 may be processed by the analog-digital converter circuit included in the PU 21.

The sensing portion 711 may include a sample-and-hold circuit 714. The sample-and-hold circuit has a function of retaining a signal sensed by the sensor element 710. An example of the sample-and-hold circuit 714 using an OS transistor is described later.

The sensor circuit 301 may include a memory 715. When the memory 715 has a structure using an OS transistor, a memory that can read out data at high speed and retain data for a long time can be achieved. An example of the memory having the structure using an OS transistor is described later.

The PU 21 preferably has a function of supplying control signals for controlling circuits such as the sensor element 710, the sensing portion 711, the judgment circuit 712, the analog-digital converter circuit 713, the sample-and-hold circuit 714, and the memory 715 included in the sensor circuit 301. The signals are supplied from the terminal 94 of the PU 21 to the terminal 93 of the sensor circuit 301, and then supplied from the terminal 93 to the respective circuits, for example.

The terminal 90 is a terminal through which power is supplied from the power supply circuit 10 to the sensor circuit 301.

When a secondary battery is used as a power source of the power supply circuit 10, the power supply circuit 10 can be easily integrated with the PU 21 and the sensor circuit 301. In addition, the power consumption of the PU 21 is reduced by bringing the PU 21 into a resting state, whereby the capacity of the secondary battery can be small. Easy integration and a small capacity of the secondary battery enable miniaturization of the semiconductor device 700.

The semiconductor device of one embodiment of the present invention has features of being small and low power consumption. Thus, the semiconductor device of one embodiment of the present invention can be easily provided for a variety of objects.

The semiconductor device of one embodiment of the present invention preferably has a wireless communication function using Bluetooth (registered trademark), Wi-Fi (registered trademark), 4G, 5G, or the like.

Figure 2A:
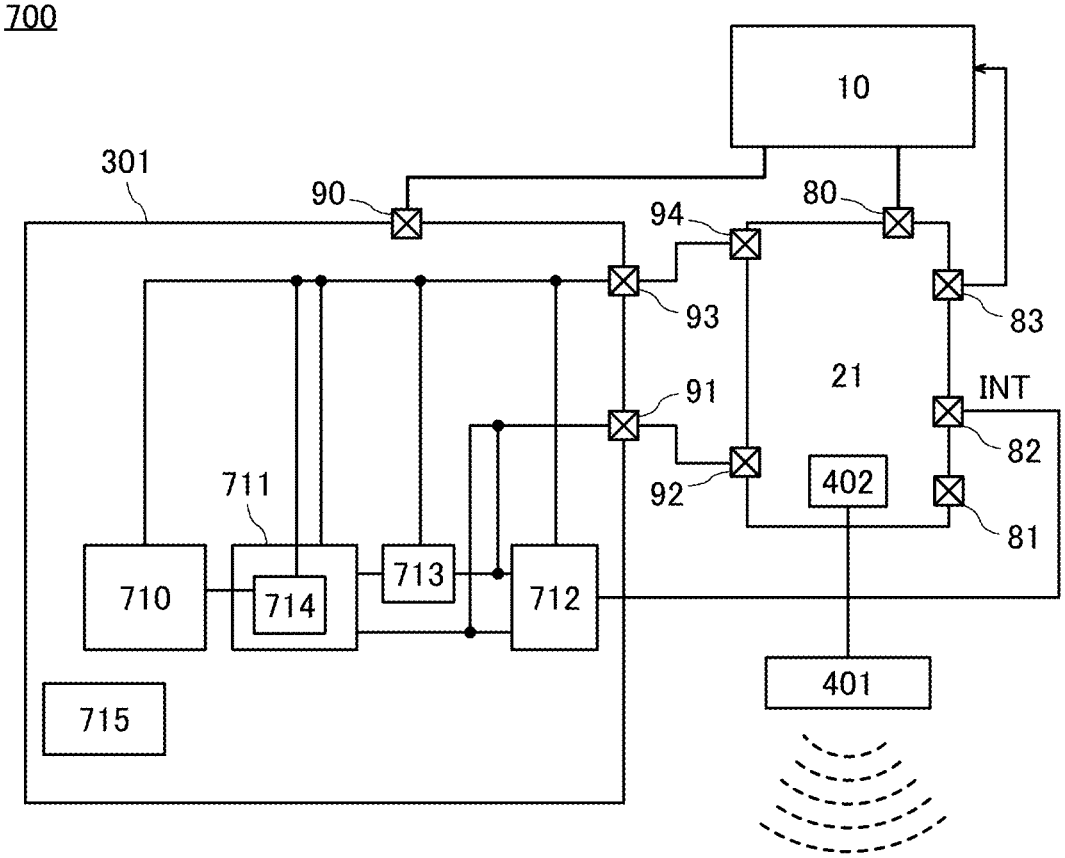
FIG. 2A is a block diagram illustrating a structure example of a semiconductor device.

The semiconductor device 700 illustrated in FIG. 2A as an example includes a communication circuit 402 in the PU 21. The communication circuit 402 has a function of modulating a signal, a function of demodulating a signal, and the like. The communication circuit 402 is electrically connected to an antenna 401.

Figure 2B:
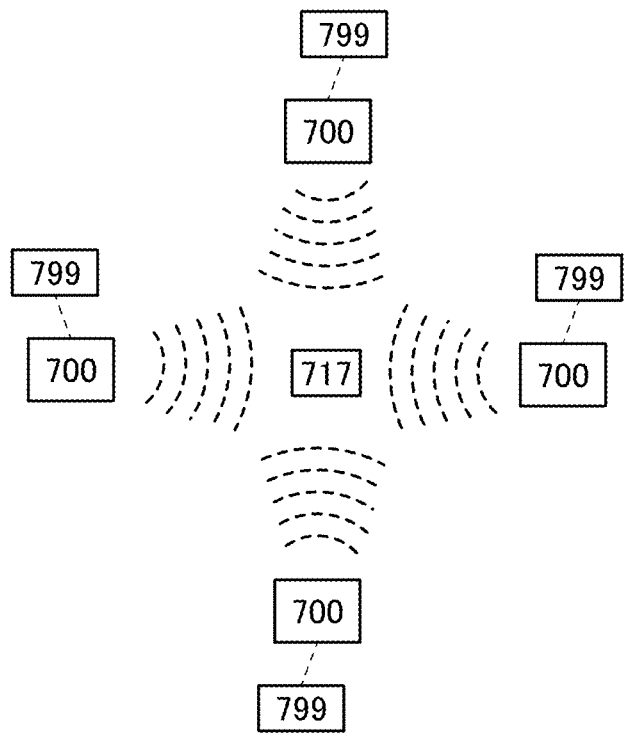
FIG. 2B is a diagram illustrating a structure example of one embodiment of the present invention.

FIG. 2B illustrates an example in which the semiconductor device 700 having a wireless communication function is provided for each of a plurality of objects 799. A control device 717 illustrated in FIG. 2B can wirelessly transmit and receive signals to and from the plurality of provided semiconductor devices 700. Each semiconductor device 700 can perform wireless communication with the control device 717 using the above-described antenna 401. In the case where wireless communication is performed, wire connection between the control device 717 and the semiconductor device 700 becomes unnecessary; thus, degree of flexibility of providing the semiconductor device 700 can be increased, and the plurality of semiconductor devices 700 can be easily controlled by one control device 717.

In the case where the power supply circuit 10 incorporated in the semiconductor device 700 includes a secondary battery, the secondary battery may be charged by wireless power feeding.

Figure 3:
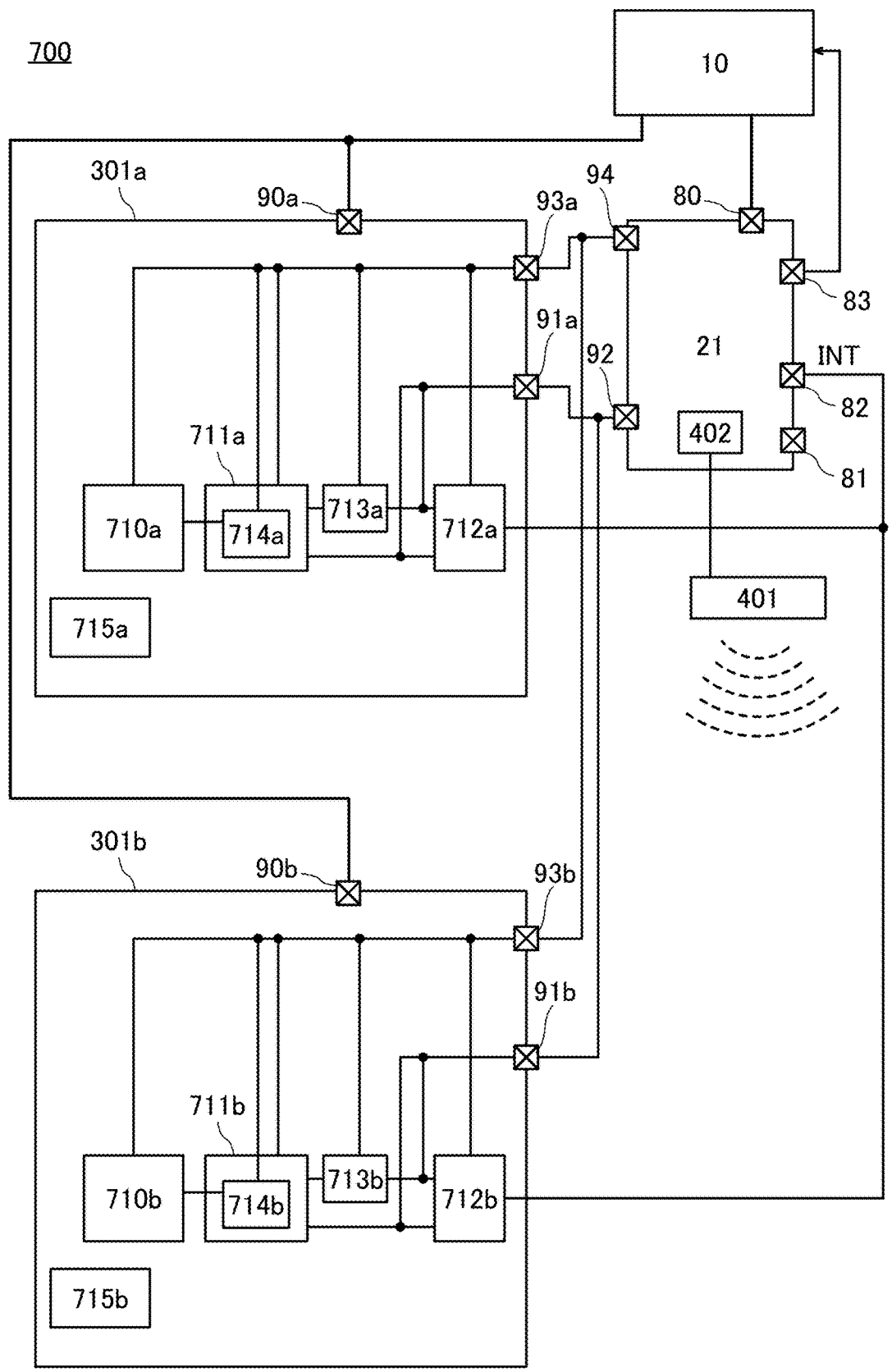
FIG. 3 is a block diagram illustrating a structure example of a semiconductor device.

The semiconductor device 700 may include a plurality of sensor circuits 301. FIG. 3 illustrates an example in which the semiconductor device 700 includes two sensor circuits 301 (hereinafter, a sensor circuit 301a and a sensor circuit 301b). Note that "a" is added to the end of reference numeral of a circuit, a terminal, and the like included in the sensor circuit 301a, and "b" is added to the end of reference numeral of a circuit, a terminal, and the like included in the sensor circuit 301b.

From the terminal 94 included in the PU 21, control signals are supplied to circuits included in the sensor circuit 301a through a terminal 93a and to circuits included in the sensor circuit 301b through a terminal 93b. Signals from a sensing portion 711a and an analog-digital converter circuit 713a are supplied to the terminal 94 through the terminal 93a, and signals from a sensing portion 711b and an analog-digital converter circuit 713b are supplied to the terminal 94 through the terminal 93b.

The signal INT that is a signal for requesting interrupt processing is supplied to the terminal 82 from each of a judgment circuit 712a and a judgment circuit 712b.

Figure 4:
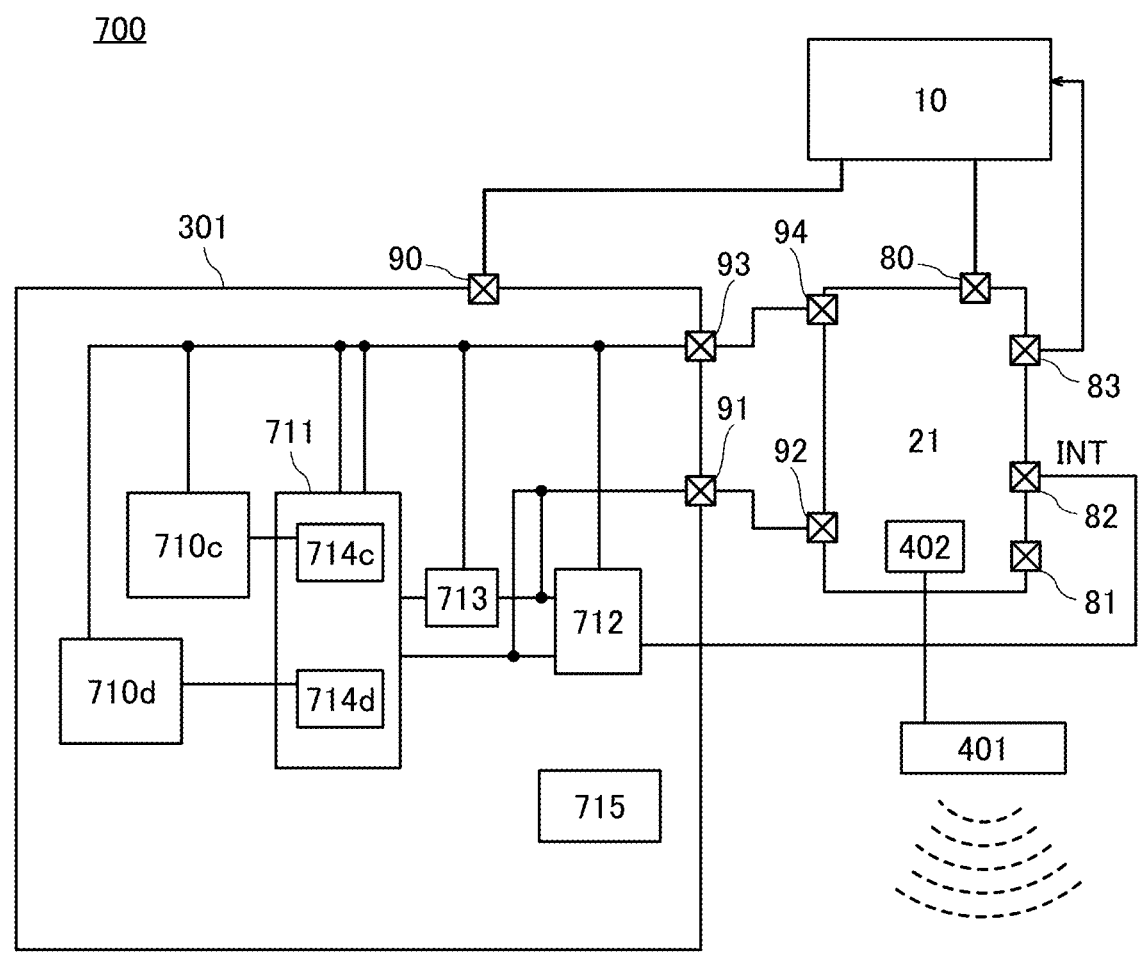
FIG. 4 is a block diagram illustrating a structure example of a semiconductor device.

The sensor circuit 301 may include a plurality of sensor elements 710. FIG. 4 illustrates an example in which the sensor circuit 301 includes two sensor elements 710 (hereinafter, a sensor element 710c and a sensor element 710d).

Sensed signals of the sensor element 710c and the sensor element 710d are supplied to the sensing portion 711. FIG. 4 illustrates an example in which the sensing portion 711 includes two sample-and-hold circuits 714 (hereinafter, a sample-and-hold circuit 714c and a sample-and-hold circuit 714d). A sensed signal of the sensor element 710c is supplied to the sample-and-hold circuit 714c and a sensed signal of the sensor element 710d is supplied to the sample-and-hold circuit 714d.

<Operation Example of Semiconductor Device>

Figure 5:
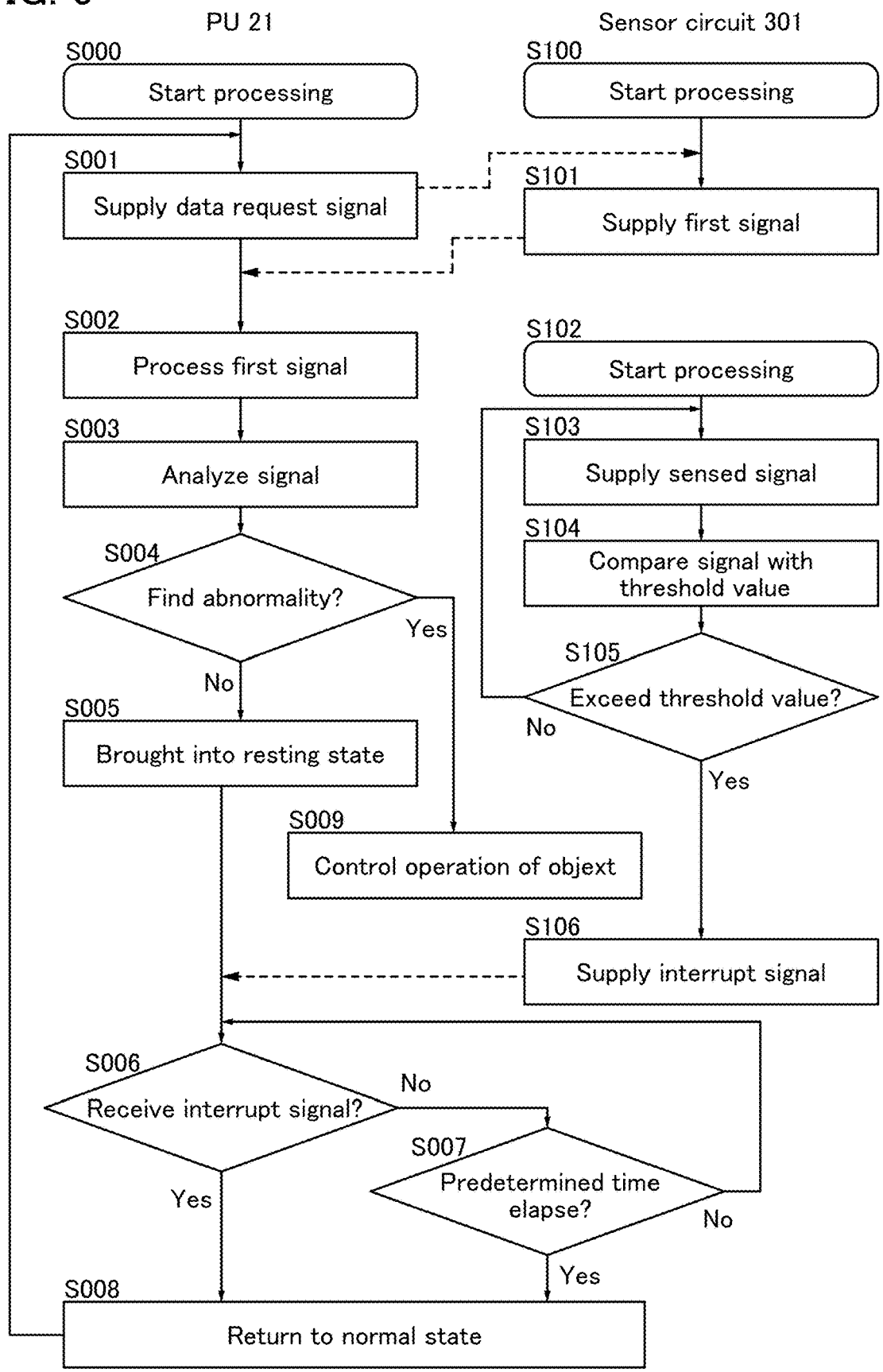
FIG. 5 is a flow chart showing an operation example of a semiconductor device.

Next, an operation example of the semiconductor device of one embodiment of the present invention is described with reference to FIG. 5.

Step S000 to Step S009 are steps describing the operation of the PU 21, and Step S100 to Step S106 are steps describing the operation of the sensor circuit 301.

First, Step S000 to Step S009 and Step S100 and Step 101 are described.

Processing in the PU 21 starts in Step S000. Processing in the sensor circuit 301 starts in Step S100.

A data request signal is supplied from the PU 21 to the sensor circuit 301 in Step S001. A first signal is supplied from the sensor circuit 301 to the PU 21 in Step S101. The first signal is the sensed signal of the sensor element 710 that has been processed in the sensing portion 711, the analog-digital converter circuit 713, and the like.

Next, the first signal is processed in Step S002. Examples of the signal processing include extraction of a frequency component, noise removal, Fourier transform, and waveform differentiation. Note that the process may proceed to Step S003 without performing Step S002.

Next, the processed signal is analyzed in Step S003. As the signal analysis, for example, comparison with reference data is performed. Alternatively, statistical processing of a signal is performed, for example. As the statistical processing, the maximum value, the minimum value, the median value, the average value, the standard deviation, or the like is calculated and compared with reference data, for example. Alternatively, analysis using a neural network is performed, for example.

Next, in Step S004, the process proceeds to Step S009 in the case where abnormality is found as a result of the analysis in Step S003, or the process proceeds to Step S005 in the case where abnormality is not found.

The operation of an object is controlled in Step S009. For example, the control device 717 is supplied with a signal informing abnormality to control the operation of the object. Furthermore, abnormality may be indicated with an indicator in the semiconductor device 700 or the control device 717. Examples of the indicator include turning on or blinking of a lamp, input of a message to a display screen, and generating a warning sound.

The PU 21 is brought into a resting state in Step S005.

Next, in Step S006, the process proceeds to Step S007 in the case where the PU 21 does not receive an interrupt signal. The process proceeds to Step S008 in the case where the PU 21 receives an interrupt signal, and the PU 21 returns to a normal state and the process returns to Step S001.

In Step S007, in the case where a predetermined time elapses from Step S005, the process proceeds to Step S008: the PU 21 returns to a normal state and the process returns to Step S001. In the case where a predetermined time does not elapse, the process returns to Step S006. The elapsed time from Step S005 can be measured using a timer circuit.

By executing Step S001 to Step S008, the PU 21 can return to a normal state from a resting state at certain intervals and receive the sensed signal from the sensor circuit 301 in the case where an interrupt signal is not supplied from the sensor circuit 301. In the case where an interrupt signal is supplied from the sensor circuit 301, the PU 21 can return to a normal state quickly, the process can return to Step S001, and the sensed signal from the sensor circuit 301 can be received. The semiconductor device of one embodiment of the present invention has a short time needed to return to a normal state from a resting state. After an interrupt signal from the sensor circuit 301 is received, the PU 21 can return to a normal state quickly and process and analyze the signal from the sensor circuit 301, for example.

Next, Step S102 to Step S106 are described.

The sensor circuit 301 starts processing in Step S102. The sensor element 710 performs sensing.

Next, the sensor element 710 supplies a sensed signal to the sensing portion 711 in Step S103.

Next, the sensed signal is supplied to the judgment circuit 712 and the judgment circuit 712 judges the sensed signal in Step S104. Here, the sensed signal is compared with a threshold value stored in advance in the judgment circuit 712 or a memory. Note that the sensed signal may be processed by an analog-digital converter circuit and then supplied to the judgment circuit 712.

Next, in Step S105, in the case where the sensed signal exceeds the threshold value as the result of the judgment in Step S104, the process proceeds to Step S106. In the case where the sensed signal does not exceed the threshold value, the process returns to Step S103.

Next, the sensor circuit 301 supplies an interrupt signal to the PU 21 in Step S106.

Figure 6A:
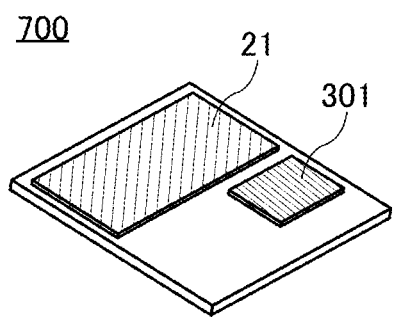
FIG. 6A is a diagram illustrating a structure example of a semiconductor device.

FIG. 6A is an example of a perspective view of the semiconductor device 700 on which the PU 21 and the sensor circuit 301 are mounted. In the semiconductor device 700 illustrated in FIG. 6A, the PU 21 and the sensor circuit 301 are provided over one substrate.

Figure 6B:
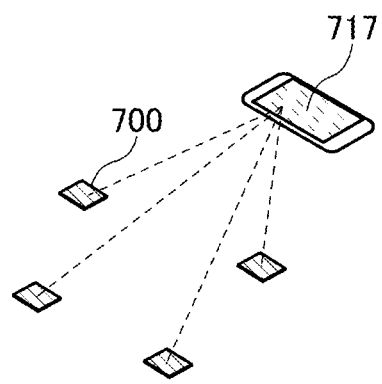
FIG. 6B is a diagram illustrating an example in which a plurality of semiconductor devices are controlled by a control device.

FIG. 6B is an example of a perspective view of the control device 717 and the plurality of semiconductor devices 700 controlled by the control device 717.

Figure 6C:
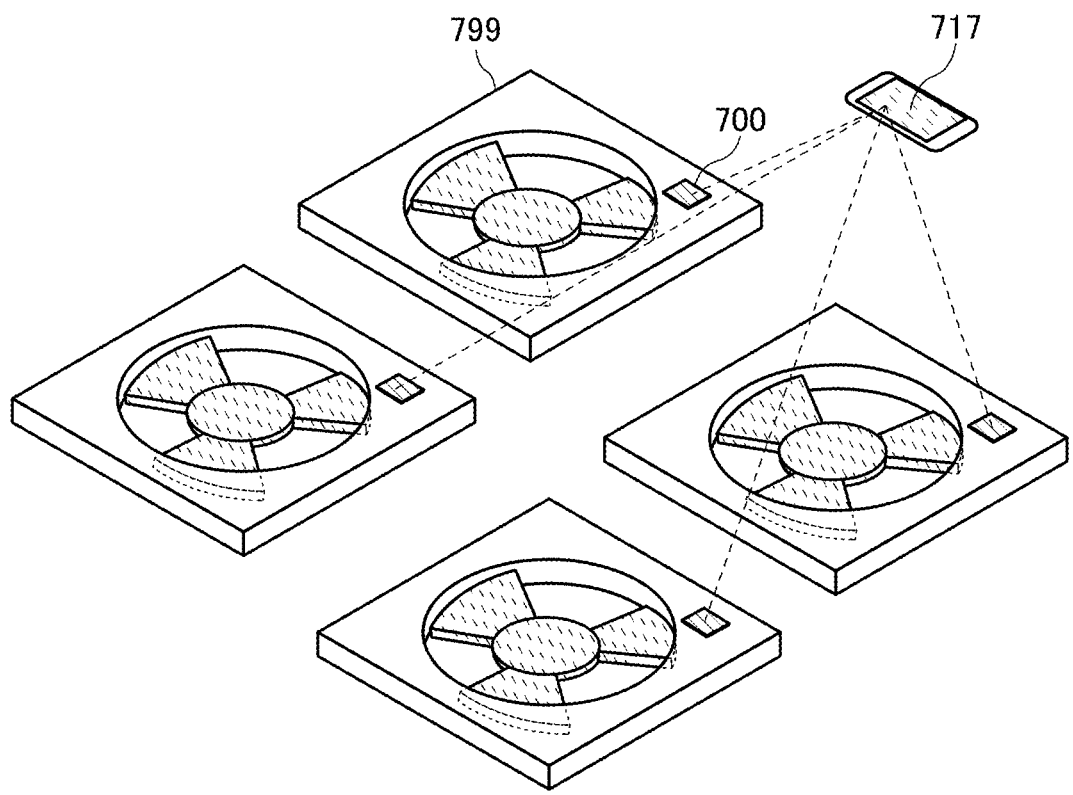
FIG. 6C is a diagram illustrating an example in which a plurality of semiconductor devices and a plurality of objects are controlled by a control device.

FIG. 6C is a perspective view of an example in which a fan is used as an example of the object 799, the semiconductor device 700 is provided for each of a plurality of fans, and the control device 717 controls each semiconductor device 700.

The semiconductor device 700 includes an acceleration sensor as the sensor element 710. As a signal from the sensor element, data of a change in acceleration over time can be obtained. Fast Fourier transform can be performed as processing performed on the obtained data.

The acceleration sensor can sense vibration accompanying rotation of the fan. In the case where abnormality occurs, for example, in a motor for driving a rotating portion of the fan, a signal obtained from the sensor element changes. In the case where the PU 21 included in the semiconductor device 700 analyzes the sensed signal obtained from the sensor element and determines that abnormality occurs, the PU 21 transmits a signal to the control device 717. At this time, abnormality may be indicated with an indicator in the semiconductor device 700 or the control device 717. The control device 717 limits the operation of the object 799 in which abnormality is occurring. For example, the rotational frequency of the fan is changed, or the rotation of the fan is stopped.

Figure 7A:
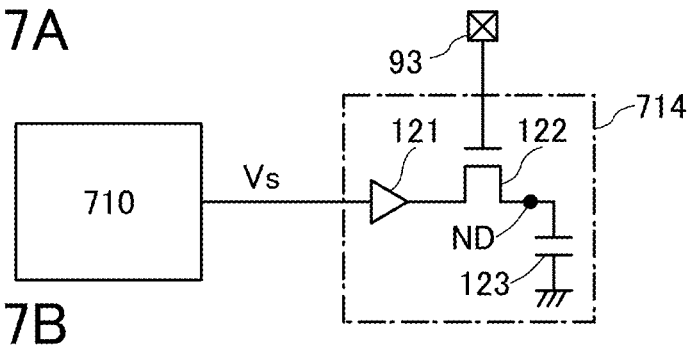
FIG. 7A illustrates a structure example of a circuit of one embodiment of the present invention.

FIG. 7A shows an example of the sample-and-hold circuit 714. The sample-and-hold circuit 714 illustrated in FIG. 7A includes a buffer circuit 121, a transistor 122, and a capacitor 123. Note that a node at the other of a source and a drain of the transistor 122 is referred to as a node ND for description.

A potential Vs that is a signal from the sensor element 710 is supplied to the buffer circuit of the sample-and-hold circuit 714. The buffer circuit 121 has a function of amplifying a signal such as analog data input to the sample-and-hold circuit 714 and outputting the amplified signal. Note that the buffer circuit 121 may be provided on the gate side of the transistor 122.

An OS transistor is preferably used as the transistor 122. The OS transistor has an extremely low off-state current. The capacitor 123 has a function of retaining electric charge corresponding to a potential Vin, which is an analog potential, in the node ND when the transistor 122 is turned off.

An analog potential obtained in the sensor element may be constant or may be always variable. When sampling of a variable analog potential is performed, the sampling may be performed with the use of a correlated double sampling (CDS) circuit. The correlated double sampling circuit is used to remove noise by obtaining a relative difference between potentials at two timings.

Figure 7B:
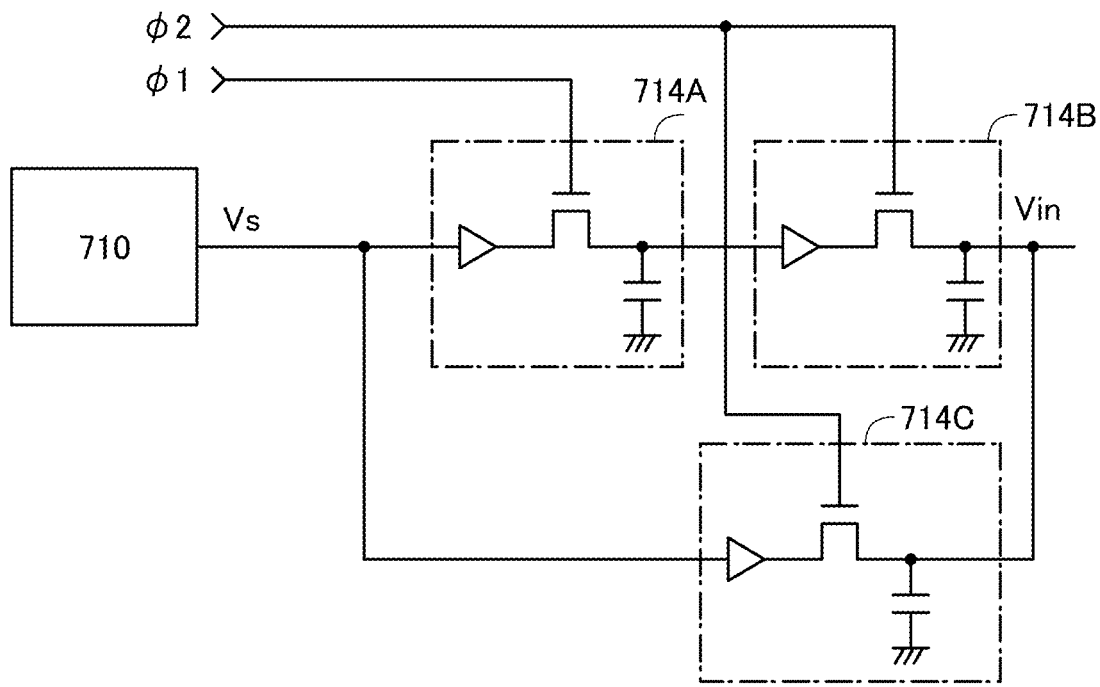
FIG. 7B illustrates a structure example of a circuit of one embodiment of the present invention.

FIG. 7B illustrates an example of the correlated double sampling circuit. The correlated double sampling circuit includes a plurality of sample-and-hold circuits 714A to 714C. A control signal $\phi 1$ is supplied to a transistor in the sample-and-hold circuit 714A, and a control signal $\phi 2$ is supplied to transistors in the sample-and-hold circuits 714B and 714C.

The use of OS transistors as transistors that are turned off by the control signal $\phi 1$ and 02 can reduce changes in the potential sampled for obtaining the difference. Thus, the accuracy of the correlated double sampling circuit can be improved. In addition, after sampling of a potential is performed once, power supply to buffer circuits in the sample-and-hold circuits 714A to 714C can be stopped, so that power consumption can be reduced.

Figure 7C:
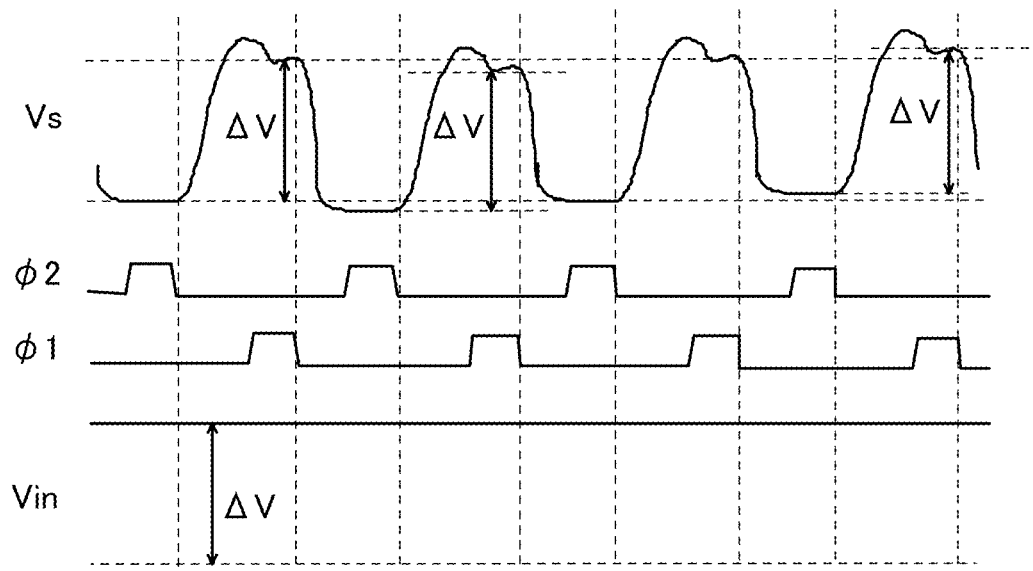
FIG. 7C is a diagram showing an operation example of the circuit of one embodiment of the present invention.

FIG. 7C is a timing chart showing an operation example of the correlated double sampling circuit illustrated in FIG. 7B. Note that the potential Vs is a variable potential obtained in the sensor element 710, and the potential Vin is an analog potential obtained through the correlated double sampling circuit. As shown in FIG. 7C, even when the potential Vs is variable, performing sampling to obtain the difference in a regular cycle makes it possible to obtain the potential Vin as an analog potential that is constant at a voltage $\Delta V$.

Structure Example 1 of Processing Unit

The processing unit 20 and the processing unit 21 are described below as processing units capable of power gating. The processing unit 20 and the processing unit 21 can each be used as the processing unit included in the above-described semiconductor device 700. A power management mechanism and the like of the processing unit 20 and the processing unit 21 are also described.

Figure 8A:
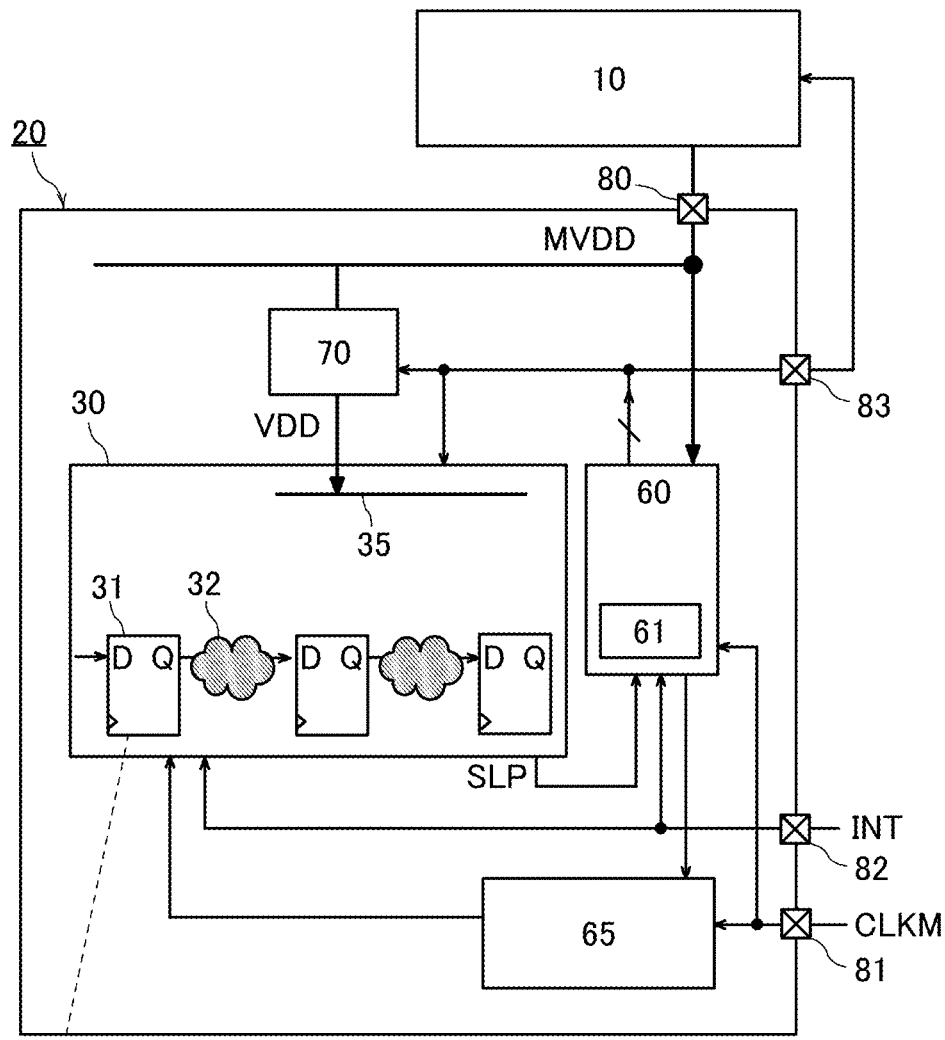
FIG. 8A and FIG. 8B are block diagrams illustrating structure examples of a semiconductor device.

FIG. 8A illustrates the power supply circuit 10 and the processing unit (PU) 20. The PU 20 is a circuit having a function of executing an instruction. The PU 20 includes a plurality of functional circuits integrated over one chip. The PU 20 includes a processor core 30, a power management unit (PMU) 60, a clock control circuit 65, a power switch (PSW) 70, and the terminal 80 to the terminal 83. FIG. 8A illustrates an example in which the power supply circuit 10 and the PU 20 are provided over different chips. The terminal 80 is a terminal to which a power supply potential MVDD is input from the power supply circuit 10. The terminal 81 is a terminal to which a reference clock signal CLKM is input from the outside. The terminal 82 is a terminal to which the signal INT is input from the outside. The signal INT is an interrupt signal for requesting interrupt processing. The signal INT is input to the processor core 30 and the PMU 60. The terminal 83 is a terminal to which a control signal generated in the PMU 60 is output, and is electrically connected to the power supply circuit 10.

In the semiconductor device of one embodiment of the present invention, the number of bits processed in an arithmetic circuit and the like of the processing unit of one embodiment of the present invention can be 8 bits, 16 bits, 32 bits, 64 bits, or the like.

<Processor Core 30 and Storage Circuit 31>

The processor core 30 is a circuit capable of processing an instruction and can be referred to as an arithmetic processing circuit. The processor core 30 includes a storage circuit 31, a plurality of combinational circuits 32, and the like, and a variety of functional circuits are formed using these circuits. For example, the storage circuit 31 is included in a register.

Figure 8B:
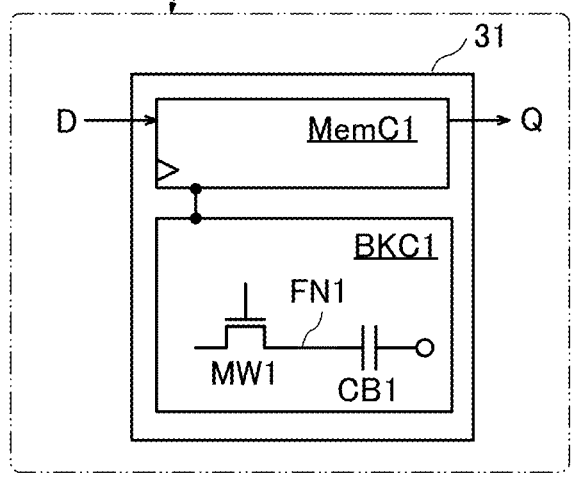

As illustrated in FIG. 8B, the storage circuit 31 includes a circuit MemC1 and a circuit BKC1. The circuit MemC1 has a function of retaining data generated in the processor core 30, and can be formed using a flip-flop circuit (FF) or a latch circuit, for example. The circuit BKC1 can function as a backup circuit of the circuit MemC1, and can retain data for a long time even when power supply is stopped or supply of a clock signal is stopped. The use of the storage circuit 31 enables power gating of the processor core 30. This is because the state of the processor core 30 at the time of power-off can be retained by saving data of the circuit MemC1 to the circuit BKC1 in the storage circuit 31 before power-off. When the power supply is restarted, data retained in the circuit BKC1 is written to the circuit MemC1; thus, the state of the processor core 30 at the time of power-off can be restored. Consequently, the PU 20 can perform normal processing immediately after the power supply is restarted.

The circuit BKC1 includes at least a retention circuit including one transistor (MW1) and one capacitor (CB1). The retention circuit illustrated in FIG. 8B has a circuit structure similar to a 1T1C (one transistor and one capacitor) memory cell structure of a standard DRAM (dynamic random access memory), and can perform write and read operations as in the standard DRAM. By control of the conduction state of the transistor MW1, charging and discharging of the capacitor CB1 are controlled. When the transistor MW1 is turned off, a node FN1 is brought into an electrically floating state. Fluctuation in the potential of the node FN1 can be inhibited by a significant reduction in the drain current of the transistor MW1 in an off state (off-state current); thus, the data retention time of the circuit BKC1 can be made longer. The data retention time of the circuit BKC1 is determined by the leakage current of the transistor MW1, the capacitance of the capacitor CB1, and the like. The use of the transistor MW1 having an extremely low off-state current eliminates the necessity of refreshing the circuit BKC1 while the PU 20 operates. Thus, the circuit BKC1 can be used as a nonvolatile storage circuit.

A transistor including an oxide semiconductor (OS), which is one kind of metal oxide, in a semiconductor layer where a channel is formed (such a transistor is also referred to as an "OS transistor" or "OS-FET") is preferably used as the transistor MW1. An oxide semiconductor has a band gap of 2 eV or more and thus has an extremely low off-state current. In an OS transistor, a normalized off-state current per micrometer of channel width at a source-drain voltage of 10 V can be less than or equal to $10 \times 10^{21}$ A (10 zA (zeptoamperes)). When the transistor MW1 is an OS transistor, the circuit BKC1 can substantially function as a nonvolatile storage circuit while the PU 20 operates. OS transistors are described in Embodiment 2.

An oxide semiconductor film used for a semiconductor layer where a channel is formed may be formed of a single oxide semiconductor film or stacked oxide semiconductor films. An oxide semiconductor included in the semiconductor layer where a channel is formed is preferably an oxide containing one or more elements selected from In, Ga, Sn, and Zn. As such an oxide, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used.

Data is written with voltage in the circuit BKC1; thus, the write power of the circuit BKC1 can be lower than that of an MRAM (magnetoresistive RAM) in which writing is performed with current. Furthermore, unlike in a flash memory, the number of data rewriting times is not limited because data is retained by the load capacitance of the node FN1.

In the circuit BKC1, energy required for data writing corresponds to energy required for charging and discharging of charge in the capacitor CB1. By contrast, in a memory circuit including a two-terminal memory element such as an MRAM, energy required for data writing corresponds to energy consumed when current flows to the memory element. In the MRAM, energy required for data writing is high because current continuously flows during a data writing period. As compared with such an MRAM, the circuit BKC1 can reduce energy consumed by data writing. Thus, as compared with a memory circuit in which a backup circuit is formed using an MRAM, the storage circuit 31 can frequently perform voltage scaling and power gating for reducing consumed energy, which leads to a reduction in the power consumption of the PU 20.

<Power Management>

The PMU 60 has a function of controlling a power gating operation, a clock gating operation, a voltage scaling operation, and the like. Specifically, the PMU 60 has a function of controlling the power supply circuit 10, a function of controlling the storage circuit 31, a function of controlling the clock control circuit 65, and a function of controlling the PSW 70. Thus, the PMU 60 has a function of generating control signals for controlling these circuits (the power supply circuit 10, the storage circuit 31, the clock control circuit 65, and the PSW 70). The PMU 60 includes a circuit 61. The circuit 61 has a function of measuring time. The PMU 60 has a function of performing power management on the basis of data on time obtained by the circuit 61.

The PSW 70 has a function of controlling supply of a power supply potential MVDD to the PU 20 in response to a control signal of the PMU 60. Here, a power supply potential supplied to the PU 20 through the PSW 70 is referred to as the power supply potential VDD. The processor core 30 may include a plurality of power domains. In that case, supply of power to the plurality of power domains may be controlled independently by the PSW 70. In addition, the processor core 30 may include a power domain that does not require power gating. In that case, a power supply potential may be supplied to this power domain without through the PSW 70.

The clock control circuit 65 has a function of generating and outputting a gated clock signal by input of the reference clock signal CLKM. The clock control circuit 65 has a function of stopping supply of a clock signal to the processor core 30 in response to a control signal of the PMU 60. The power supply circuit 10 has a function of changing the magnitude of the power supply potential VDD in response to a control signal of the PMU 60.

A signal SLP output from the processor core 30 to the PMU 60 is a trigger signal for transferring the processor core 30 to a resting state. When the signal SLP is input to the PMU 60, the PMU 60 generates a control signal for transition to a resting state and outputs the control signal to a functional circuit to be controlled. The power supply circuit 10 makes the power supply potential MVDD lower than that in a normal operation in response to a control signal of the PMU 60. After the processor core 30 is in the resting state for a certain period of time, the PMU 60 controls the PSW 70 and stops power supply to the processor core 30. When the processor core 30 is transferred from a normal state to the resting state, the PMU 60 performs a voltage scaling operation for lowering the power supply potential VDD of the processor core 30. When the period of the resting state exceeds the set time, the PMU 60 performs a power gating operation for stopping supply of the power supply potential VDD to the processor core 30 in order to further reduce the power consumption of the processor core 30. Power management of the semiconductor device illustrated in FIG. 8 is described below with reference to FIG. 9 and FIG. 10.

FIG. 9 schematically shows changes in the potential of a power supply line 35. The power supply potential VDD is supplied to the power supply line 35 through the PSW 70. The horizontal axis in each diagram shows the time elapsing between transition from the normal state to the resting state, and t0, t1, and the like each represent time. FIG. 9A shows an example in which only power gating is executed in the resting state, and FIG. 9B shows an example in which only voltage scaling is executed in the resting state. FIG. 9C and FIG. 9D each show an example in which voltage scaling and power gating are executed. In the normal state, the magnitude of the power supply potential MVDD supplied from the power supply circuit 10 is VH1.

In the following description, the power mode of the PU 20 is divided into three modes: a power-on mode, a power-off mode, and a low-power mode. The power-on mode is a mode in which the power supply potential VDD that enables normal processing is supplied to the PU 20. The power-off mode is a mode in which the supply of the power supply potential VDD is stopped by the PSW 70. The low-power mode is a mode in which the power supply potential VDD lower than that in the power-on mode is supplied.

Figure 9A:
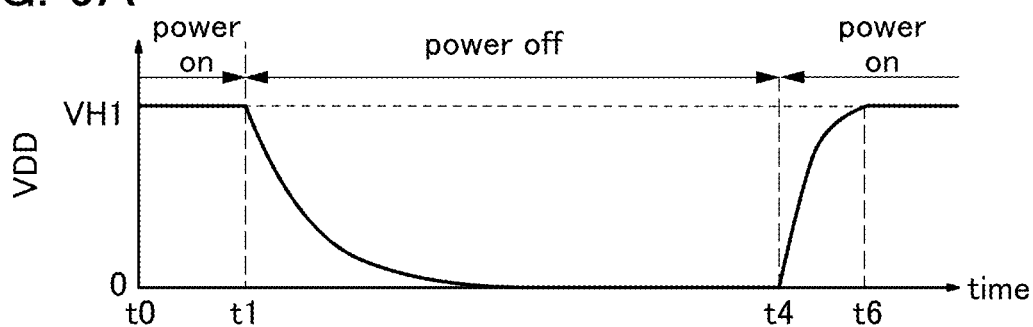
FIG. 9A to FIG. 9D are diagrams showing power management operation examples of a semiconductor device.
Figure 10:
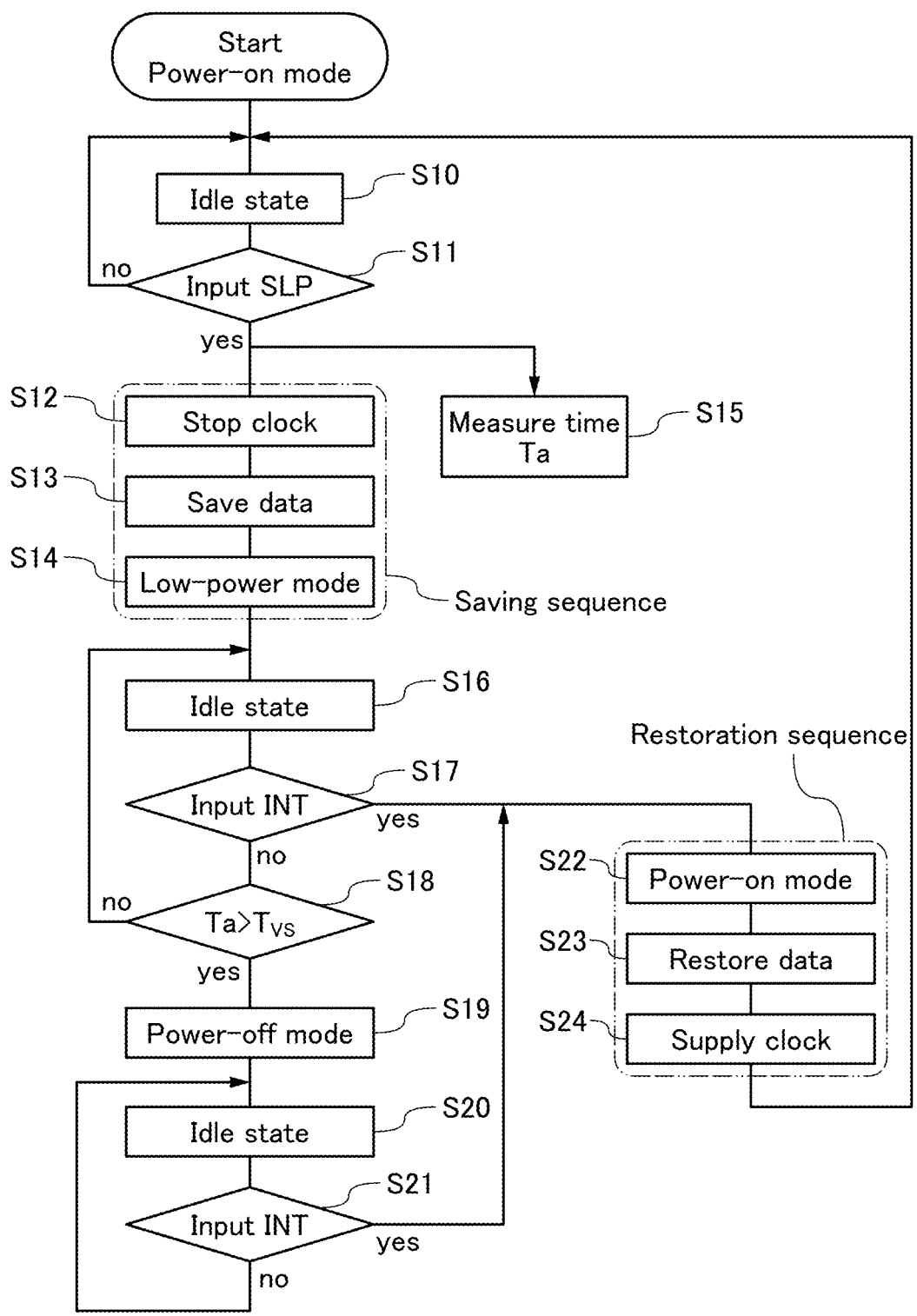
FIG. 10 is a flow chart showing a power management operation example of a semiconductor device.

The example in FIG. 9A is described. At the time t0, processing for transition to the resting state is started in the processor core 30. For example, backup of the storage circuit 31 is performed. The PMU 60 controls the PSW 70 and stops supply of power to the processor core 30 at the time t1. A power supply line 35 is self-discharged and its potential is decreased to 0 V. Consequently, leakage current of the processor core 30 in the resting state can be significantly lowered, so that power consumption in the resting state (hereinafter, referred to as standby power in some cases) can be reduced. In the case where the processor core 30 returns to the normal state in response to an interrupt request or the like from the outside, the PMU 60 controls the PSW 70 and restarts the supply of VDD. Here, at time t4, the supply of VDD is restarted. The potential of the power supply line 35 increases and becomes VH1 at time t6.

Figure 9B:
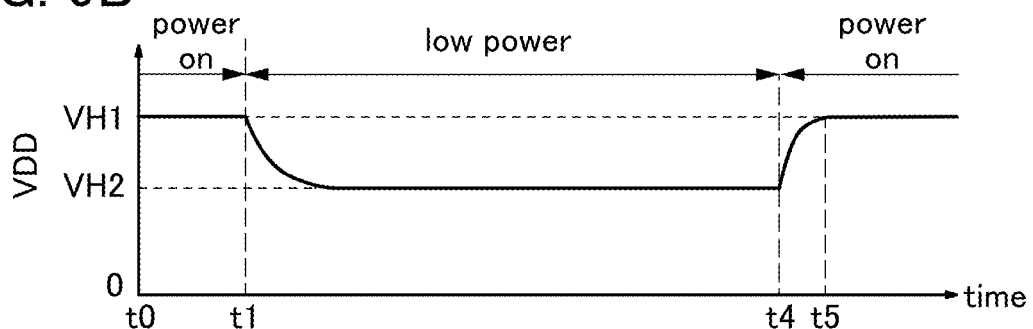

In the case of the example in FIG. 9B, voltage scaling is performed; thus, at the time t1, the PMU 60 controls the power supply circuit 10 and lowers the power supply potential MVDD to VH2. The potential of the power supply line 35 eventually becomes VH2. At the time t4, when the power supply potential MVDD returns from VH2 to VH1, the potential of the power supply line 35 increases and becomes VH1 at time t5.

In the case of the example in FIG. 9A, time taken for the return from the resting state to the normal state (overhead time) is time taken to increase the potential of the power supply line 35 from 0 V to VH1, and an energy overhead required for the return is energy required to charge the load capacitance of the power supply line 35 from 0 V to VH1. When the period of the power-off mode (t1 to t4) is sufficiently long, power gating is effective in reducing standby power of the PU 20. By contrast, when the period (t1 to t4) is short, power required for the return to the normal state is higher than power reduced by power-off; therefore, the effect of power gating cannot be obtained.

Figure 9C:
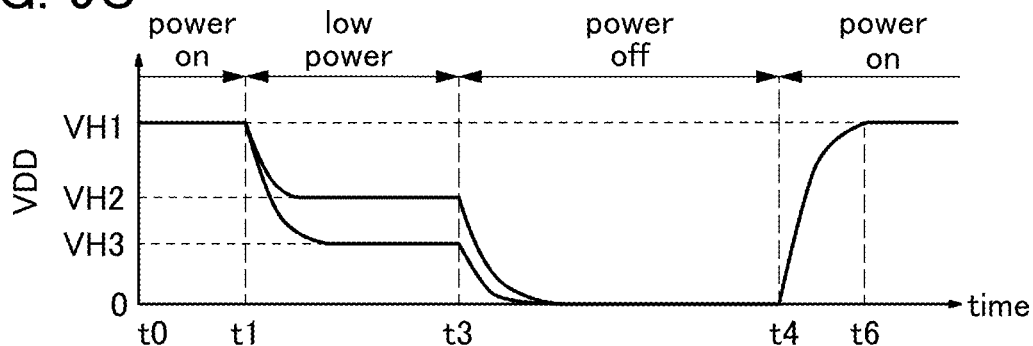
Figure 9D:
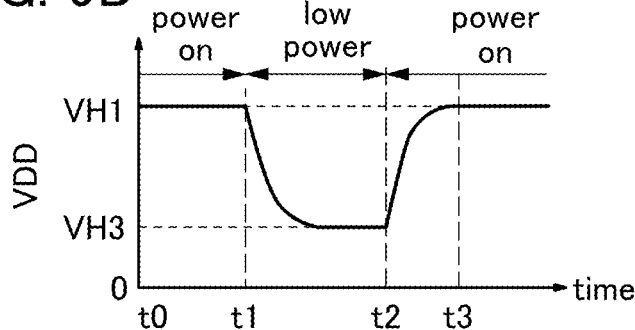

In the example of voltage scaling shown in FIG. 9B, the potential of the power supply line 35 is VH2 in the resting state; thus, the amount of standby power reduction is smaller than that in the example of power gating in FIG. 9A. In the example of FIG. 9B, fluctuation in the potential of the power supply line 35 is small; therefore, time taken for the return to the normal state is shorter and energy required for the return is lower than those in the example of FIG. 9A. Accordingly, the semiconductor device illustrated in FIG. 8 can perform power management in which power gating and voltage scaling are combined to efficiently reduce the standby power of the PU 20. FIG. 9C and FIG. 9D each show a power management example.

As shown in FIG. 9C, first, a voltage scaling operation is performed in the resting state and the mode is transferred from the power-on mode to the low-power mode. As in FIG. 9B, at the time t1, the PMU 60 controls the power supply circuit 10 and lowers the power supply potential MVDD to VH2; thus, the potential of the power supply line 35 eventually becomes VH2. After a certain period of time from transition to the low-power mode (t1 to t3), the PMU 60 controls the PSW 70 and transfers the mode to the power-off mode. In the period (t3 to t4), power reduced by powering off the PU 20 by power gating, which includes power consumed by returning to the normal state, is higher than power reduced by supplying VH2 to the PU 20.

For example, the potential VH2 is a power supply potential high enough to retain data in the circuit MemC1 of the storage circuit 31, and a potential VH3 is a potential at which data of the circuit MemC1 is lost. In the PU 20 of FIG. 8A, the circuit BKC1 can retain data even while power supply is stopped. When data of the storage circuit 31 is saved to the circuit BKC1 in the period (t0 to t1), VDD can be lowered to the potential VH3 at which data of the circuit MemC1 is lost in the low-power mode. Thus, the standby power of the PU 20 can be further reduced.

The PMU 60 has a function of returning the PU 20 to the normal state in response to an interrupt request or the like. The PMU 60 controls the power supply circuit 10 to increase the magnitude of MVDD to VH1 and controls the PSW 70 to restart the supply of VDD from the PU 20. After the time t4, the power-on mode continues. In the case where the potential of the power supply line 35 is stabilized at the time t6, the PU 20 can perform a normal operation after the time t6.

FIG. 9D shows an example in which an interrupt request for the return to a normal operation is input before the time t3. After the time t2, the power-on mode continues. At the time t2, the PMU 60 controls the power supply circuit 10 to change the magnitude of MVDD to the potential VH1 in the power-on mode. At the time t3, the potential of the power supply line 35 increases to VH1.

As shown in FIG. 9C and FIG. 9D, time required to restore the potential of the power supply line 35 to VH1 in the resting state is longer when the mode returns from the power-off mode to the power-on mode than when the mode returns from the low-power mode to the power-on mode. Thus, the PMU 60 has a function of adjusting timing of returning the processor core 30 from the resting state to the normal state depending on the power mode. Accordingly, the processor core 30 can return from the resting state to the normal state in the minimum time.

In the resting state, transition time from the low-power mode to the power-off mode can be measured by the circuit 61 provided in the PMU 60. When the signal SLP is input from the PU 20, the PMU 60 starts time measurement in the circuit 61. After a certain period of time from transition to the low-power mode, the PMU 60 is transferred to the power-off mode. The PSW 70 is turned off by a control signal of the PMU 60, and the supply of VDD is stopped. In this manner, the PMU 60 can be transferred from the low-power mode to the power-off mode in response to an interrupt request based on measurement data of the circuit 61. A power management operation example of the PMU 60 is described below with reference to FIG. 10.

The PU 20 performs a normal operation. The power mode is a power-on mode and the PMU 60 is in an idle state (Step S10). The PMU 60 is in the idle state until the signal SLP is input, and a saving sequence is executed with input of the signal SLP as a trigger (Step S11). In the saving sequence example of FIG. 10, first, the PMU 60 outputs a control signal to the clock control circuit 65 and stops output of a clock signal (Step S12). Next, a control signal for data saving is output to the storage circuit 31 (Step S13). In the storage circuit 31, data retained in the circuit MemC1 is saved to the circuit BKC1 in response to a control signal of the PMU 60. Finally, the PMU 60 controls the power supply circuit 10 to lower MVDD. Through these operations, the power mode is transferred to the low-power mode (Step S14). When the signal SLP is input, the PMU 60 controls the circuit 61 included therein and measures time Ta in the low-power mode (Step S15). Timing of operating the circuit 61 may be any timing as long as the saving sequence is executed; for example, the circuit 61 may operate when the signal SLP is input, when a control signal is output to the clock control circuit 65, when data saving is started, when data saving is terminated, or when a control signal is output to the power supply circuit 10.

After the saving sequence is executed, the PMU 60 is set in an idle state (Step S16), and monitors input of the signal INT and the time Ta that is measurement time of the clock control circuit 65. When the signal INT is input, the sequence is transferred to a restoration sequence (Step S17). Whether the time Ta exceeds set time $T_{vs}$ is determined (Step S18). When the time Ta exceeds the time $T_{vs}$, the PMU 60 transfers the power mode to the power-off mode (Step S19). When the time Ta does not exceed the time $T_{vs}$, the PMU 60 remains in the idle state (Step S16). The time $T_{vs}$ is set such that the standby power of the processor core 30 in the power-off mode can be lower than that in the low-power mode.

In Step S19, the PMU 60 outputs, to the PSW 70, a control signal for stopping supply of power to the processor core 30. After the mode is transferred to the power-off mode, the PMU 60 is set in the idle state again (Step S20), and input of the signal INT is monitored (Step S21). When the signal INT is input, the PMU 60 executes the restoration sequence.

In the restoration sequence, first, the PMU 60 is transferred from the power-off mode to the power-on mode (Step S22). The PMU 60 controls the power supply circuit 10 to output a power supply potential in a normal operation. In addition, the PMU 60 controls the PSW 70 to restart the supply of VDD to the processor core 30. Next, a control signal is output to the storage circuit 31 and data of the storage circuit 31 is restored (Step S23). In the storage circuit 31, data retained in the circuit BKC1 is restored to the circuit MemC1 in response to a control signal of the PMU 60. The PMU 60 outputs a control signal for outputting a clock signal to the clock control circuit 65 (Step S24). The clock control circuit 65 restarts the output of a clock signal in response to a control signal of the PMU 60.

As compared with the case where the restoration sequence is executed in accordance with determination in Step S21, the potential of the power supply line 35 can be quickly stabilized in the case where the restoration sequence is executed in accordance with determination in Step S17 because the power mode returns from the low-power mode to the power-on mode. Thus, in the PMU 60, timing of executing Step S23 when the restoration sequence is executed in accordance with Step S17 is faster than that when the restoration sequence is executed in accordance with Step S21. Consequently, time taken to return the processor core 30 from the resting state to the normal state can be shortened.

As described above, in power management of the semiconductor device illustrated in FIG. 8, when the PU 20 is set in the resting state, first, time and energy overheads due to the return from the resting state to the normal state are suppressed while leakage current is reduced by lowering a power supply potential supplied to the processor core 30 with a voltage scaling operation. When the PU 20 is in the resting state for a certain period of time, a power gating operation is performed to reduce the leakage current of the processor core 30 as much as possible. Thus, the power consumption of the PU 20 in the resting state can be reduced without a decrease in the processing performance of the PU 20.

Structure Example 2 of Processing Unit

Figure 11A:
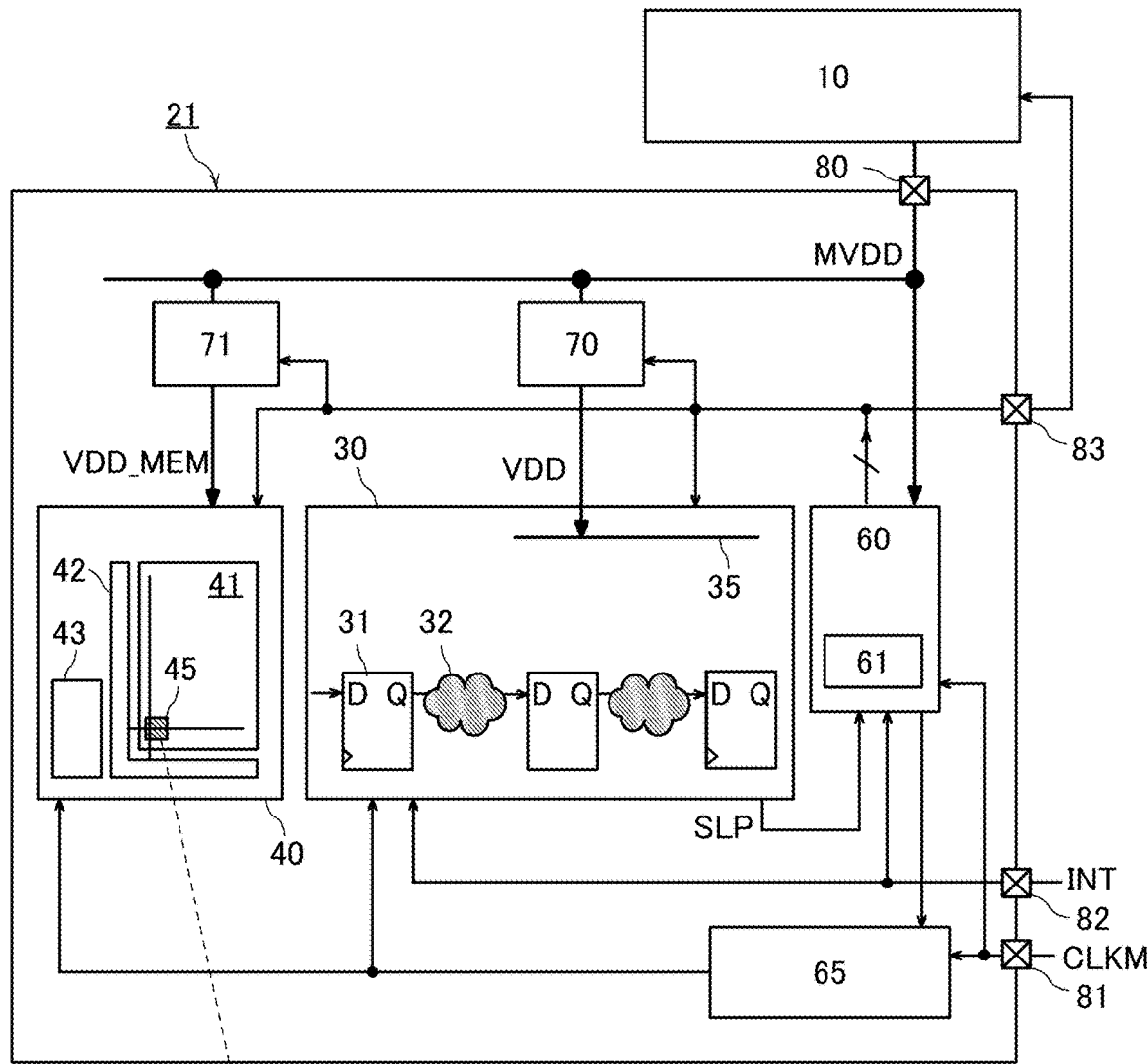
FIG. 11A and FIG. 11B are block diagrams showing structure examples of a semiconductor device.

FIG. 11A illustrates a modification example of the processing unit in FIG. 8A. The processing unit (PU) 21 illustrated in FIG. 11A has a structure obtained by addition of a cache 40 and a power switch (PSW) 71 to the PU 20. The cache 40 can perform power gating and voltage scaling like the PU 20, and the power mode of the cache 40 changes along with the power mode of the PU 21. The PSW 71 controls supply of the power supply potential MVDD to the cache 40 and is controlled by the PMU 60. Here, a power supply potential input to the cache 40 through the PSW 71 is VDD_MEM. A control signal from the PMU 60 and a gated clock signal from the clock control circuit 65 are input to the cache 40, like the processor core 30.

<Cache 40>

The cache 40 is a storage device having a function of temporarily storing frequently used data. The cache 40 includes a memory array 41, a peripheral circuit 42, and a control circuit 43. The memory array 41 includes a plurality of memory cells 45. The control circuit 43 controls the operation of the cache 40 in response to a request from the processor core 30. For example, a writing operation and a reading operation of the memory array 41 are controlled. The peripheral circuit 42 has a function of generating a signal for driving the memory array 41 in response to a control signal from the control circuit 43. The memory array 41 includes the memory cells 45 for retaining data.

Figure 11B:
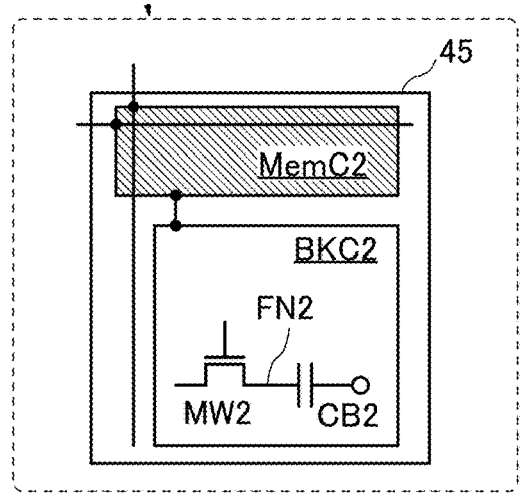

As shown in FIG. 11B, the memory cells 45 each include a circuit MemC2 and a circuit BKC2. The circuit MemC2 is a memory cell to be accessed in a normal operation. For example, an SRAM (static random access memory) cell is used. The circuit BKC2 can function as a backup circuit of the circuit MemC2, and can retain data for a long time even while power supply is stopped or supply of a clock signal is stopped. When such memory cells 45 are provided, power gating of the cache 40 can be performed. Before the power supply is stopped, data of the circuit MemC2 is saved to BKC2 in each of the memory cells 45. After the power supply is restarted, data retained in the circuit BKC2 is restored to the circuit MemC2, so that the PU 21 can quickly return to the state before the power supply is stopped.

Like the circuit BKC1 in FIG. 8B, the circuit BKC2 in each of the memory cells 45 includes at least a retention circuit including one transistor (MW2) and one capacitor (CB2). In other words, the circuit BKC2 also includes a retention circuit having a structure similar to that of a 1T1C memory cell of a standard DRAM. The transistor MW2 has an extremely low off-state current. Like the transistor MW1, an OS transistor is used as the transistor MW2. Such a structure can suppress fluctuation in the potential of a node FN2 that is electrically floating also in the circuit BKC2; thus, the circuit BKC2 can retain data for a long time. The data retention time of the circuit BKC2 is determined by the leakage current of the transistor MW2, the capacitance of the capacitor CB2, and the like. When the transistor MW2 has an extremely low off-state current, the circuit BKC2 can be used as a nonvolatile storage circuit that does not need a refresh operation.

As in the PU 20, the PMU 60 performs power management (see FIG. 10) in the PU 21 illustrated in FIG. 11A. In Step S13 in FIG. 10, a data saving operation of the storage circuit 31 and the cache 40 is performed. In Step S19, the PSW 70 and the PSW 71 are controlled to stop supply of power to the processor core 30 and the cache 40. In Step S22, the PSW 70 and the PSW 71 are controlled to restart the supply of power to the processor core 30 and the cache 40. In Step S23, a data restoration operation of the storage circuit 31 and the cache 40 is performed.

Thus, like the semiconductor device illustrated in FIG. 8, the semiconductor device illustrated in FIG. 11 can reduce power in the resting state of the PU 21 without a decrease in processing performance of the PU 21 by power management in which voltage scaling and power gating are combined.

<<Processor Core Structure Example>>

Figure 12:
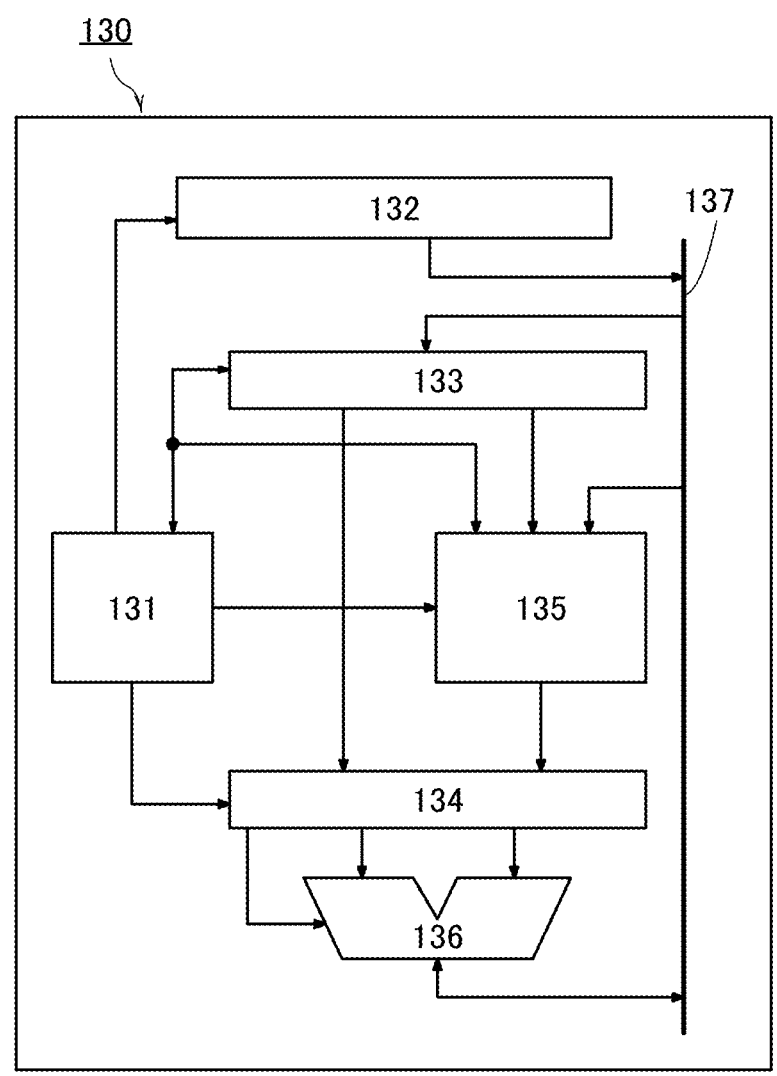
FIG. 12 is a block diagram illustrating a structure example of a processor core.

FIG. 12 shows a processor core structure example. A processor core 130 shown in FIG. 12 includes a control device 131, a program counter 132, a pipeline register 133, a pipeline register 134, a register file 135, an arithmetic logic unit (ALU) 136, and a data bus 137. Data is transmitted between the processor core 130 and a peripheral circuit such as a PMU or a cache through the data bus 137.

The control device 131 has a function of decoding and executing instructions contained in a program such as input applications by controlling the overall operations of the program counter 132, the pipeline register 133, the pipeline register 134, the register file 135, the ALU 136, and the data bus 137. The ALU 136 has a function of performing a variety of arithmetic operations such as four arithmetic operations and logic operations. The program counter 132 is a register having a function of storing the address of an instruction to be executed next.

The pipeline register 133 has a function of temporarily storing instruction data. The register file 135 includes a plurality of registers including a general-purpose register and can store data read out from a main memory, data obtained as a result of arithmetic operations in the ALU 136, or the like. The pipeline register 134 has a function of temporarily storing data used for arithmetic operations in the ALU 136, data obtained as a result of arithmetic operations in the ALU 136, or the like.

The storage circuit 31 in FIG. 8B is used as the register included in the processor core 130.

<Storage Circuit Structure Example>

Figure 13:
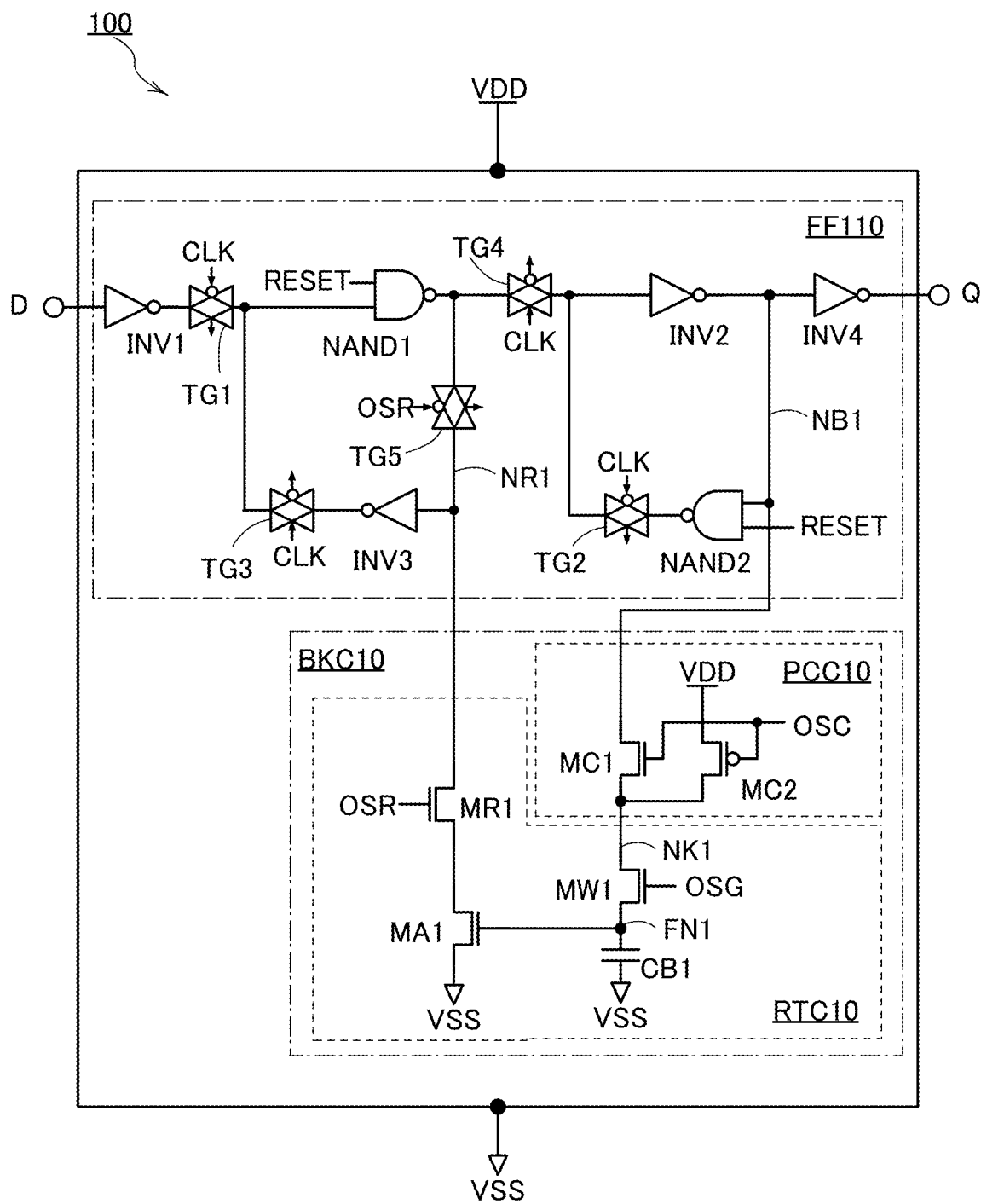
FIG. 13 is a circuit diagram illustrating a structure example of a storage circuit.

A specific structure example of the storage circuit 31 illustrated in FIG. 8B is described. FIG. 13 is a circuit diagram illustrating a memory circuit structure example. A storage circuit 100 illustrated in FIG. 13 functions as a flip-flop circuit.

A standard flip-flop circuit (FF) can be used as the circuit MemC1, and for example, a master slave FF can be used. Such a structure example is illustrated in FIG. 13. An FF 110 includes transmission gates (TG1, TG2, TG3, TG4, and TG5), inverter circuits (INV1 and INV2), and NAND circuits (NAND1 and NAND2). A signal RESET and a signal OSR are control signals output from the PMU 60. The signal OSR and an inverted signal thereof are input to TG5. A clock signal CLK and an inverted signal thereof are input to TG1 to TG4. One clocked inverter circuit may be provided instead of TG1 and INV1. One clocked NAND circuit may be provided instead of TG2 and NAND2. A clocked inverter circuit may be provided instead of TG3 and INV3. TG5 functions as a switch that controls conduction between an output node of NAND1 and a node NR1. A node NB1 is electrically connected to an input node of a circuit BKC10, and the node NR1 is electrically connected to an output node of the circuit BKC10.

The circuit BKC10 illustrated in FIG. 13 functions as a backup circuit of the FF 110. The circuit BKC10 includes a circuit RTC10 and a circuit PCC10. Signals (OSG, OSC, and OSR) input to the circuit BKC10 are control signals output from the PMU 60. A power supply potential VSS is a low power supply potential and, for example, may be a ground potential (GND) or 0 V. As in the circuit BKC1, the power supply potential VSS and the power supply potential VDD are input to the FF 110. In the storage circuit 100, supply of VDD is controlled by the PMU 60.

The circuit RTC10 includes the transistor MW1, a transistor MA1, a transistor MR1, the node FN1, and a node NK1. The circuit RTC10 has a function of retaining data, and here, includes a 3T gain-cell memory circuit. The transistor MW1 is an OS transistor serving as a write transistor. The transistor MR1 is a read transistor, and the transistor MA1 functions as an amplifier transistor and a read transistor. The node FN1 retains data. The node NK1 is a data input node. The node NR1 is a data output node of the circuit RTC10.

FIG. 13 illustrates a structure example in which the circuit BKC10 reads out data of a slave latch circuit in the FF 110 in a saving operation and restores the retained data to a master latch circuit in a restoration operation. Data to be saved may be data of the master latch circuit. In addition, data may be restored to the slave latch circuit. In that case, TG5 is provided in the slave latch circuit.

The transistor MR1 and the transistor MA1 in the circuit RTC10 may be either n-channel transistors or p-channel transistors, and the levels of the potential of the signal OSR and a power supply potential supplied to the transistor MA1 may be changed depending on the conductivity types of the transistor MR1 and the transistor MA1. In addition, a logic circuit of the FF 110 may be set as appropriate. For example, in the case where the transistor MR1 and the transistor MA1 are p-channel transistors, NAND1 and INV3 are replaced with each other in the master latch circuit and INV2 and NAND2 are replaced with each other in the slave latch circuit. Furthermore, VDD is input to the transistor MA1 instead of VSS.

Data is written with voltage in the circuit BKC10; thus, the write power of the circuit BKC10 can be lower than that of an MRAM in which writing is performed with current. Furthermore, unlike in a flash memory, the number of data rewriting times is not limited because data is retained by the load capacitance of the node FN1.

In the circuit RTC10, energy required for data writing corresponds to energy required for charging and discharging of charge in the capacitor CB1. By contrast, in a memory circuit including a two-terminal memory element such as an MRAM, energy required for data writing corresponds to energy consumed when current flows to the memory element. Thus, as compared with an MRAM or the like in which current continuously flows during a data writing period, the circuit BKC10 can reduce energy consumed by data saving. Accordingly, as compared with the case of providing an MRAM, BET (break even time) can be shortened in the case of providing the circuit BKC10 as a backup circuit. Consequently, opportunities of performing power gating by which energy consumption can be reduced are increased, so that the power consumption of the semiconductor device can be reduced.

The circuit PCC10 includes a transistor MC1 and a transistor MC2. The circuit PCC10 has a function of precharging the node FN1. The circuit PCC10 is not necessarily provided. As described later, the data saving time of the circuit BKC10 can be shortened by provision of the circuit PCC10.

<Operation Example of Storage Circuit>

Figure 14:
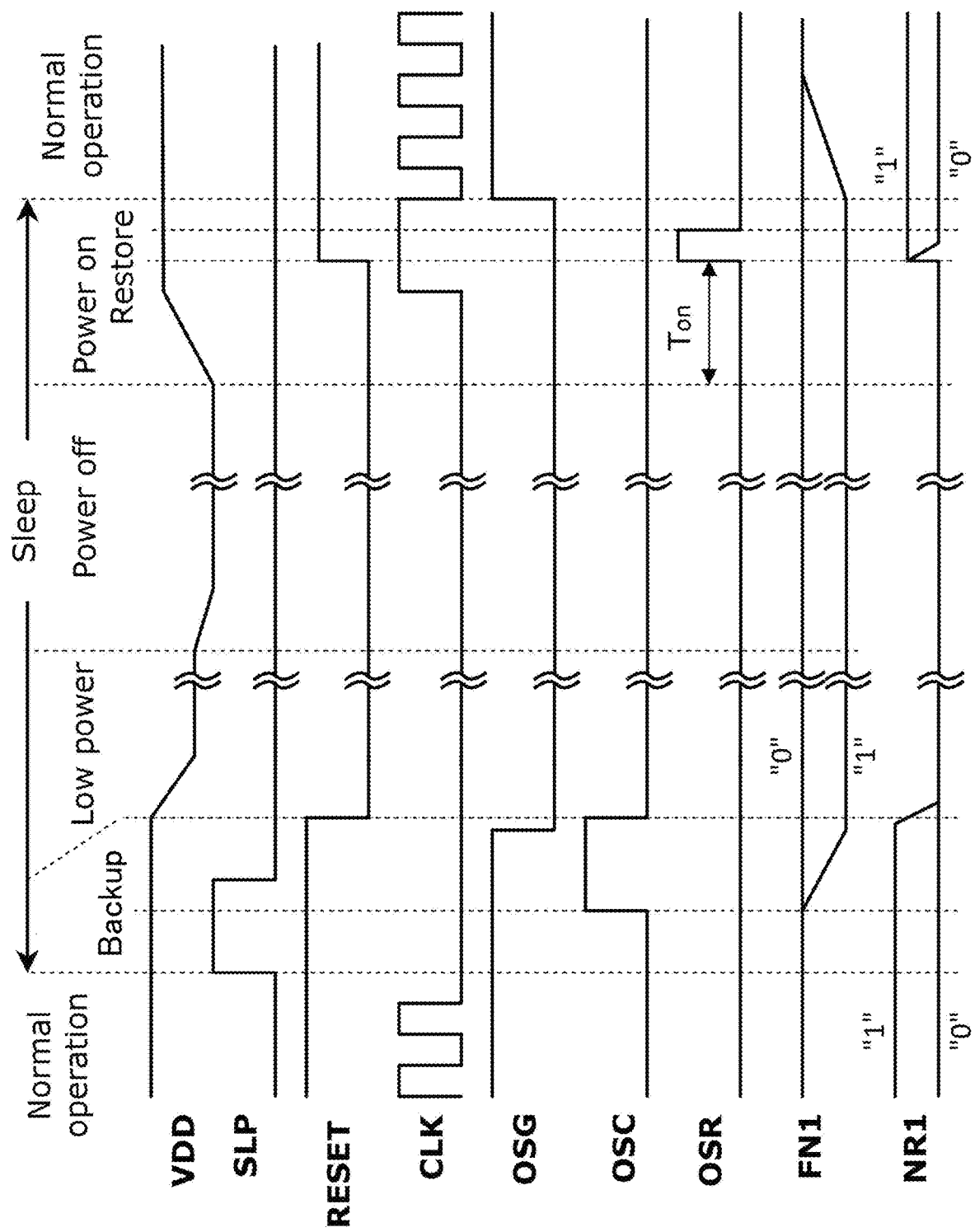
FIG. 14 is a timing chart showing an operation example of a storage circuit.

FIG. 14 is a timing chart showing an operation example of the storage circuit 100, and shows changes in waveforms of control signals (the signal SLP, the signal RESET, the clock signal CLK, the signal OSG, and the signal OSR) and changes in the potentials of the power supply potential VDD, the node FN1, and the node NR1.

[Normal Operation]

A period of "normal operation" in FIG. 14 is described. The power supply potential VDD and the clock signal CLK are supplied to the storage circuit 100. The FF 110 functions as a sequential circuit. The signal RESET is kept at a high level; thus, NAND1 and NAND2 function as inverter circuits. In the circuit BKC1, the transistor MC1 is in an off state and the transistor MC2 and the transistor MW1 are in an on state, so that the potential of the node FN1 is precharged to a high level.

[Data Saving]

Next, a period of "backup" in FIG. 14 is described. First, supply of the clock signal CLK is stopped. Thus, data rewriting of the node NB1 is stopped. In the example of FIG. 14, the potential level of the node NB1 is at a low level ("0") when the potential of the node NR1 is at a high level ("1"), and the potential level of the node NB1 is at a high level ("1") when the potential of the node NR1 is at a low level ("0"). While the signal OSC is at a high level, data of the node NB1 is saved to the node FN1. Specifically, since the transistor MC1 and the transistor MW1 are in an on state, the node FN1 is electrically connected to the node NB1. When the signal OSG is set at a low level to turn off the transistor MW1, the node FN1 is brought into an electrically floating state and the circuit BKC10 retains data. The potential of the node FN1 is at a high level when the node NR1 is at a low level ("0"), and the potential of the node FN1 is at a low level when the node NR1 is at a high level ("1").

Data saving is terminated by setting the signal OSG at a low level; thus, a voltage scaling operation of the PU 20 can be performed immediately after the signal OSG is set at a low level. In addition, since the node FN1 is precharged to a high level by the transistor MC2 in the normal operation, charge transfer of the node FN1 is not needed in a data saving operation in which the node FN1 is set at a high level. Thus, the circuit BKC10 can complete a saving operation in a short time.

In the data saving operation, the clock signal CLK is inactive. Although the potential of the clock signal CLK is at a low level in the example of FIG. 14, the potential of the clock signal CLK may be at a high level.

[Voltage Scaling in Low-Power Mode]

Next, a period of "low power" in FIG. 14 is described. The PMU 60 performs a voltage scaling operation along with the signal OSC falling. Thus, the storage circuit 100 is transferred to the low-power mode.

[Power Gating in Power-Off Mode]

Next, a period of "power off" in FIG. 14 is described. After a certain period of time from transition to the low-power mode, the PMU 60 performs a power gating operation and the storage circuit 100 is transferred to the power-off mode.

[Power-on Mode]

Next, a period of "power on" in FIG. 14 is described. The PMU 60 returns the storage circuit 100 to the power-on mode in response to an interrupt request. In the example of FIG. 14, when the potential of a power supply line for supplying VDD is stabilized, the clock signal CLK is set at a high level.

[Data Restoration]

While the signal OSR is at a high level, a data restoration operation is performed. When the signal RESET is set at a high level, the potential of the node NR1 is precharged to a high level ("1"). When the signal OSR is set at a high level, TG5 has high impedance and the transistor MR1 is turned on. The conduction state of the transistor MA1 is determined by the potential of the node FN1. When the node FN1 is at a high level, the transistor MA1 is in a conduction state; thus, the potential of the node NR1 is decreased to a low level ("0"). When the node FN1 is at a low level, the potential of the node NR1 is kept at a high level. In other words, the FF 110 returns to the state before transition to the resting state.

As described above, rising of the signal RESET and the signal OSR enables high-level data to be restored to the node NR1. Thus, the returning operation period of the storage circuit 100 can be shortened.

FIG. 14 shows an example in which the mode is transferred from the power-off mode to the power-on mode. In the case where the mode is transferred from the low-power mode to the power-on mode, a period $T_{on}$ to stabilization of the potential of the power supply line for supplying VDD is shortened. In that case, rising of the signal OSR is preferably made faster than that when the mode is transferred from the power-off mode.

[Normal Operation]

Next, a period of "normal operation" in FIG. 14 is described. By restarting the supply of the clock signal CLK, the storage circuit 100 returns to a state in which a normal operation can be performed. When the signal OSG is set at a high level, the node FN1 is precharged to a high level by the circuit PCC10.

<<Cache>>

An example in which the cache 40 is formed using an SRAM is described below.

<Memory Cell Structure Example>

Figure 15:
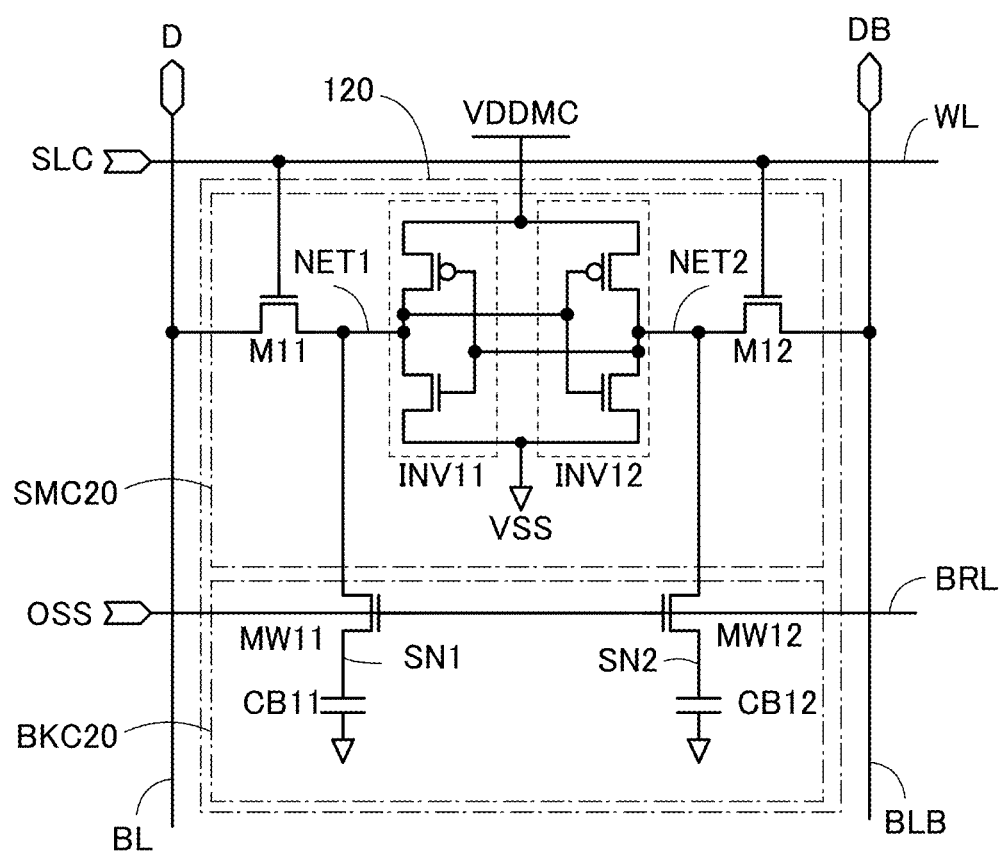
FIG. 15 is a circuit diagram showing a structure example of a cache memory cell.

FIG. 15 illustrates a cache memory cell structure example. A memory cell 120 illustrated in FIG. 15 includes a circuit SMC20 and a circuit BKC20. The circuit SMC20 has a circuit structure similar to that of a standard SRAM memory cell. The circuit SMC20 illustrated in FIG. 15 includes an inverter circuit INV11, an inverter circuit INV12, a transistor M11, and a transistor M12.

The circuit BKC20 functions as a backup circuit of the circuit SMC20. The circuit BKC20 includes a transistor MW11, a transistor MW12, a capacitor CB11, and a capacitor CB12. The transistors MW11 and MW12 are OS transistors. The circuit SMC20 includes two 1T1C retention circuits, and a node SN1 and a node SN2 each retain data. A retention circuit formed using the transistor MW11 and the capacitor CB11 has a function of backing up data of a node NET1. A retention circuit formed using the transistor MW12 and the capacitor CB12 has a function of backing up data of a node NET2.

Power supply potentials VDDMC and VSS are supplied to the memory cell 120. The memory cell 120 is electrically connected to wirings (WL, BL, BLB, and BRL). A signal SLC is input to the wiring WL. A data signal D and a data signal DB are input to the wiring BL and the wiring BLB at the time of data writing. Data is read out by detection of the potentials of the wiring BL and the wiring BLB. A signal OSS is input to the wiring BRL. The signal OSS is input from the PMU 60.

<Operation Example of Memory Cell>

Figure 16:
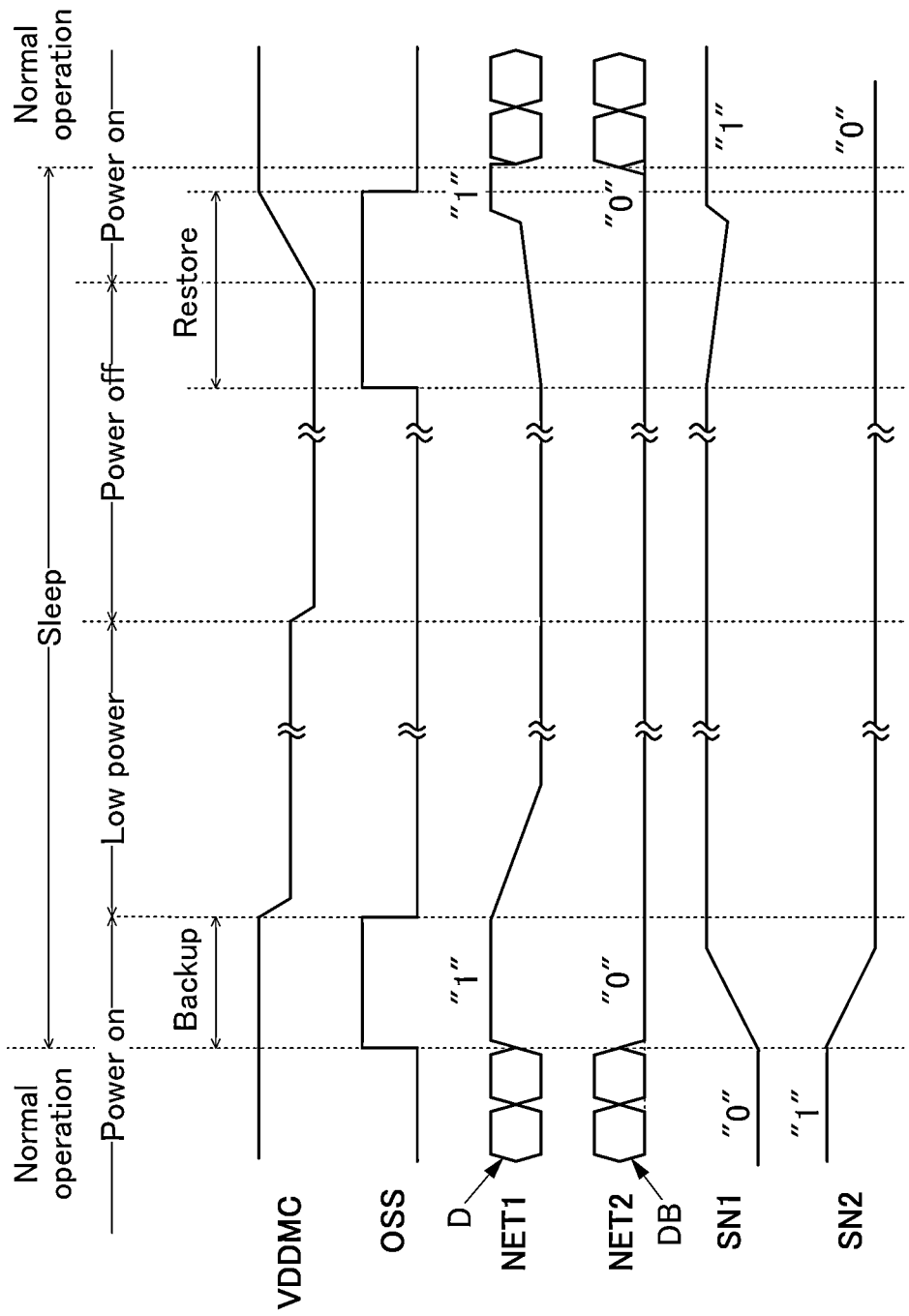
FIG. 16 is a timing chart showing an operation example of a memory cell.

An operation example of the memory cell 120 is described. FIG. 16 is an example of a timing chart for the memory cell 120.

[Normal Operation]

An access request is input to the circuit MemC2, and data is written and read out. In the circuit BKC2, the signal OSS is at a low level; thus, the node SN1 and the node SN2 are electrically floating and data is retained. In the example of FIG. 16, the potential of the node SN1 is at a low level ("0") and the potential of the node SN2, which is the other node, is at a high level ("1").

[Data Saving]

When the signal OSS is at a high level, the transistors MW11 and MW12 are turned on and the nodes SN1 and SN2 have the same potential levels as the nodes NET1 and NET2. In the example of FIG. 16, the potentials of the nodes SN1 and SN2 are set at a high level and a low level, respectively. The signal OSS is set at a low level and the circuit BKC20 retains data, so that a data saving operation is terminated.

[Voltage Scaling in Low-Power Mode]

The PMU 60 performs a voltage scaling operation along with the signal OSS falling. Thus, the cache 40 is transferred to the low-power mode.

[Power Gating in Power-Off Mode]

After a certain period of time from transition to the low-power mode, the PMU 60 performs a power gating operation and the cache 40 is transferred to the power-off mode.

[Data Restoration in Power-on Mode]

The PMU 60 returns the cache 40 to a normal state in response to an interrupt request. The signal OSS is set at a high level to restore data retained in the circuit BKC20 to the circuit SMC20. While the signal OSS is at a high level, the PMU 60 performs a voltage scaling operation and a power gating operation and returns the storage circuit 100 to the power-on mode. In the example of FIG. 14, when the potential of the power supply line for supplying VDD is stabilized, the clock signal CLK is set at a high level. When the potential of a power supply line for supplying VDDMC is stabilized, the signal OSS is set at a low level to terminate a data restoration operation. The nodes SN1 and SN2 return to the states immediately before the resting states.

[Normal Operation]

When the supply of VDDMC is restarted, the circuit SMC20 returns to a normal mode in which a normal operation can be performed.

As described above, with the use of an OS transistor, a backup circuit capable of retaining data for a long time even when power supply is stopped can be formed. This backup circuit enables power gating of a processor core and a cache. In addition, when power management in which voltage scaling is combined with power gating is performed in a resting state, energy and time overheads due to the return from the resting state to a normal state can be reduced. Thus, power can be reduced efficiently without a decrease in the processing performance of a processing unit.

<Example of Memory>

A memory using the OS transistor of one embodiment of the present invention is shown below.

A power storage device included in one embodiment of the present invention preferably includes a memory. As the memory, a memory device using an OS transistor can be used. For example, a NOSRAM (registered trademark) or a DOSRAM (registered trademark) which are described below can be used.

A NOSRAM is a gain cell DRAM in which a write transistor of a memory cell is an OS transistor. A NOSRAM is an abbreviation for Nonvolatile Oxide Semiconductor RAM. A structure example of a NOSRAM is described below.

Figure 17A:
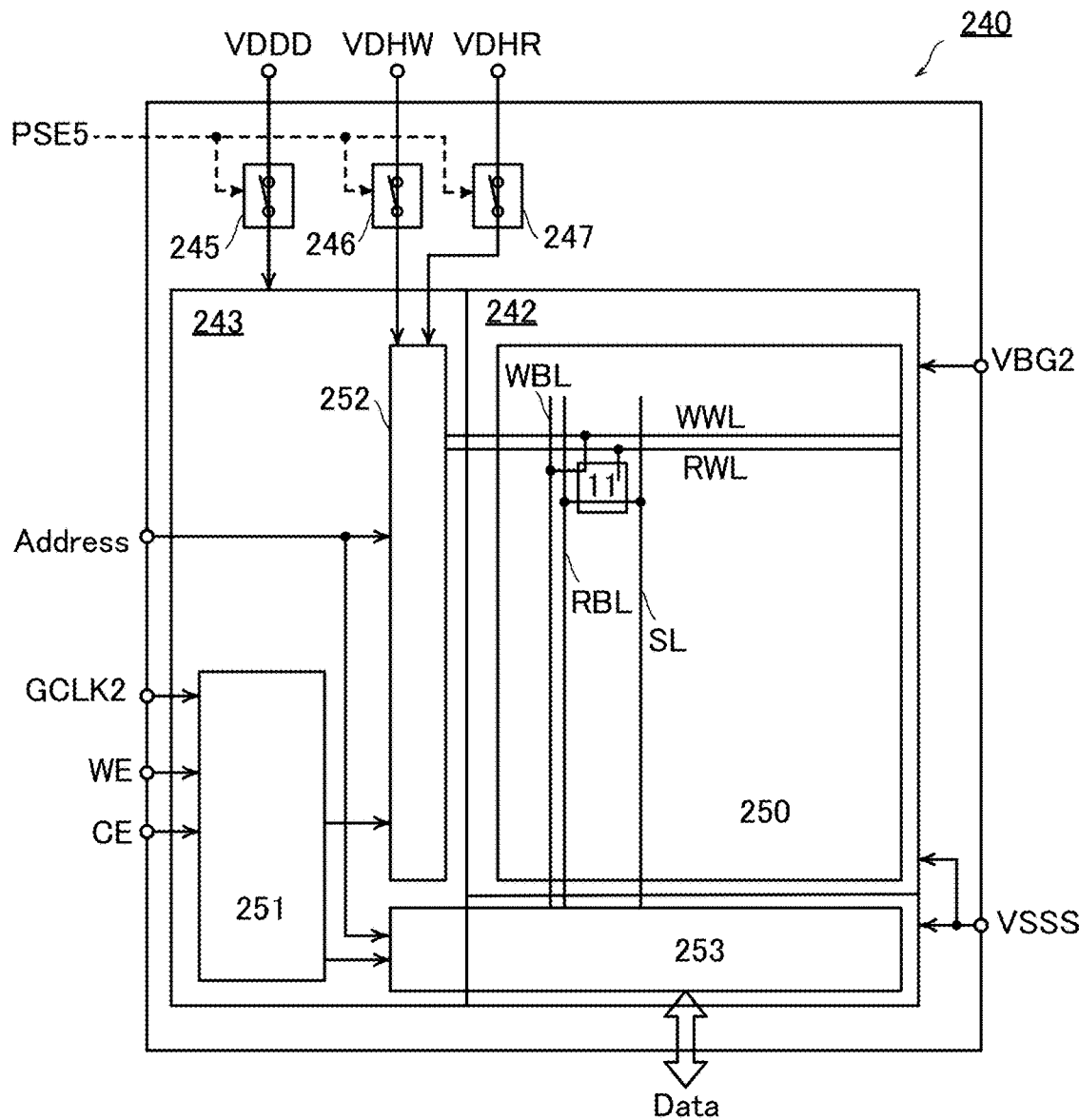
FIG. 17A is a functional block diagram showing a structure example of a NOSRAM.

FIG. 17A is a block diagram illustrating a structure example of a NOSRAM. In a NOSRAM 240, power domains 242 and 243 and power switches 245 to 247 are provided. A memory cell array 250 is provided in the power domain 242, and a peripheral circuit of the NOSRAM 240 is provided in the power domain 243. The peripheral circuit includes a control circuit 251, a row circuit 252, and a column circuit 253.

A voltage VDDD, a voltage VSSS, a voltage VDHW, a voltage VDHR, a voltage VBG2, a clock signal GCLK2, an address signal Address, a signal CE, a signal WE, and a signal PSE5 are input to the NOSRAM 240 from the outside. The signal CE and the signal WE are a chip enable signal and a write enable signal. The signal PSE5 controls the on/off of the power switches 245 to 247. The power switches 245 to 247 control the input of the voltage VDDD, the voltage VDHW, and the voltage VDHR, respectively, to the power domain 243.

Note that the voltages, signals, and the like input to the NOSRAM 240 are appropriately selected in accordance with the circuit structure and operation method of the NOSRAM 240. For example, the NOSRAM 240 may be provided with a power domain which is not power gated, and a power gating control circuit that generates the signal PSE5 may be provided.

The memory cell array 250 includes a memory cell 11, a write word line WWL, a readout word line RWL, a write bit line WBL, a readout bit line RBL, and a source line SL.

Figure 17B:
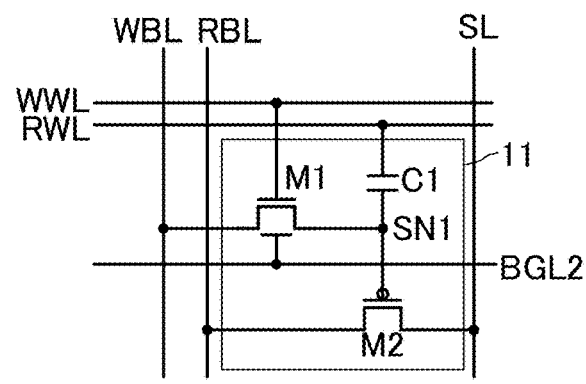
FIG. 17B is a circuit diagram illustrating a structure example of a memory cell.

As illustrated in FIG. 17B, the memory cell 11 is a 2T1C (two transistors and one capacitor) gain cell, which includes a node SN1, transistors M1 and M2, and a capacitor C1. The transistor M1 is a write transistor, which is an OS transistor having a back gate. The back gate of the transistor M1 is electrically connected to a wiring BGL2 for supplying the voltage VBG2. The transistor M2 is a readout transistor, which is a p-channel Si transistor. The capacitor C1 is a storage capacitor for retaining the voltage of the node SN1.

The voltage VDDD and the voltage VSSS are voltages representing data "1" and "0". Note that high-level voltages of the write word line WWL and the readout word line RWL are the voltage VDHW and the voltage VHDR.

Figure 18A:
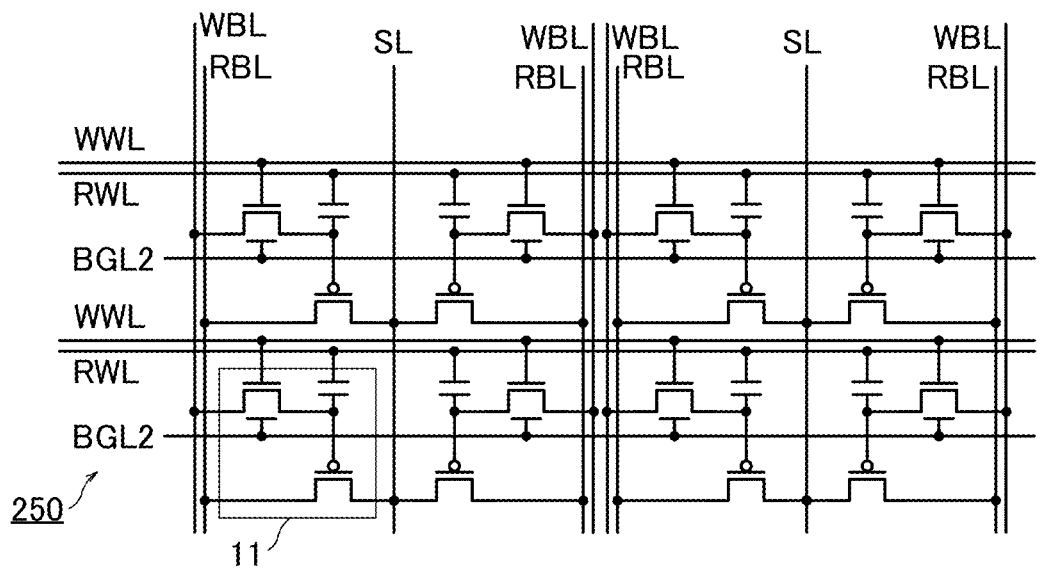
FIG. 18A is a circuit diagram illustrating a structure example of a memory cell array.

FIG. 18A shows a structure example of the memory cell array 250. In the memory cell array 250 shown in FIG. 18, one source line is supplied to the adjacent two rows.

The memory cell 11 does not have a limitation on the number of rewriting times in principle, can perform data rewriting with low energy, and does not consume power in retaining data. Since the transistor M1 is an OS transistor with an extremely low off-state current, the memory cell 11 can retain data for a long time. Thus, when a cache memory device includes the NOSRAM 240, the cache memory device can be a low-power-consumption nonvolatile memory device.

Figure 18B:
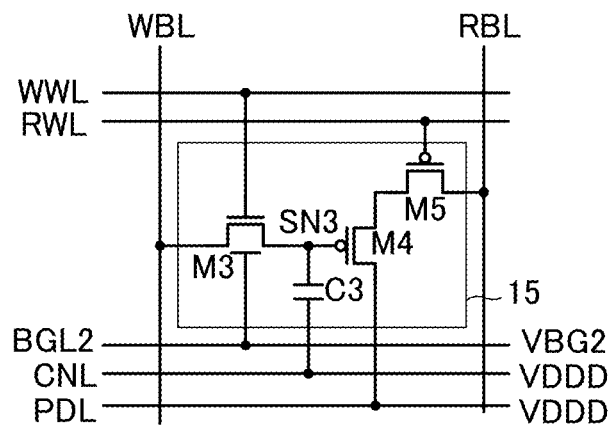
FIG. 18B and FIG. 18C are circuit diagrams illustrating structure examples of memory cells.
Figure 18C:
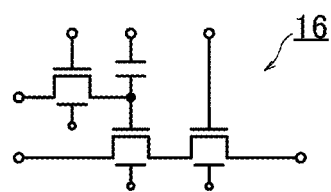

The circuit structure of the memory cell 11 is not limited to the circuit structure shown in FIG. 17B. For example, the readout transistor M2 may be an OS transistor having a back gate or an n-channel Si transistor. Alternatively, the memory cell 11 may be a 3T gain cell. FIG. 18B and FIG. 18C show examples of a 3T gain cell. A memory cell 15 shown in FIG. 18B includes transistors M3 to M5, a capacitor C3, and a node SN3. The transistors M3 to M5 are a write transistor, a readout transistor, and a selection transistor. The transistor M3 is an OS transistor having a back gate, and the transistors M4 and M5 are p-channel Si transistors. The transistors M4 and M5 may each be an n-channel Si transistor or an OS transistor having a back gate. In a memory cell 16 shown in FIG. 18C, three transistors are OS transistors each having a back gate.

The node SN3 is a retention node. The capacitor C3 is a storage capacitor for retaining the voltage of the node SN3. The capacitor C3 may be omitted intentionally, and the storage capacitor may be formed using gate capacitance of the transistor M4, or the like. A fixed voltage (e.g., VDDD) is input to a wiring PDL. The wiring PDL is an alternative to the source line SL, and for example, the voltage VDDD is input.

The control circuit 251 has a function of controlling the entire operation of the NOSRAM 240. For example, the control circuit 251 performs a logical operation of the signals CE and WE to determine whether access from the outside is write access or readout access.

The row circuit 252 has a function of selecting the write word line WWL and the readout word line in the row selected and specified by the address signal. The column circuit 253 has a function of writing data to the write bit line in the column specified by the address signal and a function of reading out data from the readout bit line in the column.

A DOSRAM refers to a RAM including a 1T1C memory cell and is an abbreviation for Dynamic Oxide Semiconductor RAM. A DOSRAM is described below with reference to FIG. 19.

Figure 19A:
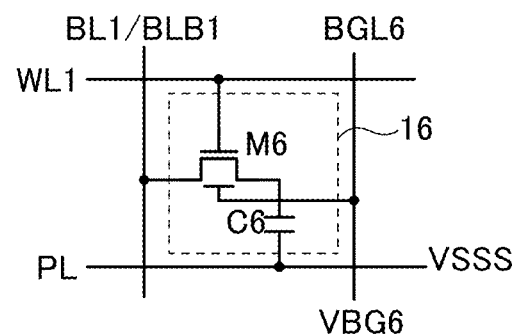
FIG. 19A is a circuit diagram illustrating a structure example of a memory cell of a DOSRAM.

As illustrated in FIG. 19A, the memory cell 16 of a DOSRAM 351 is electrically connected to a bit line BL1 (or BLB1), a word line WL1, and wirings BGL6 and PL. The bit line BLB1 is an inverted bit line. For example, voltages VBG6 and VSSS are input to the wirings BGL6 and PL. The memory cell 16 includes a transistor M6 and a capacitor C6. The transistor M6 is an OS transistor having a back gate.

There is no limitation on the number of rewriting operations of the DOSRAM 351 in principle because data is rewritten by charging and discharging of the capacitor C6; and data can be written and read out with low energy. In addition, the memory cell 16 has a simple circuit structure, and thus the capacity can be easily increased. Since the write transistor of the memory cell 16 is an OS transistor, the retention time of the DOSRAM 351 is significantly longer than that of a DRAM. This allows less frequent refresh or makes refresh operations unnecessary; thus, the power needed for refresh operations can be reduced.

Figure 19B:
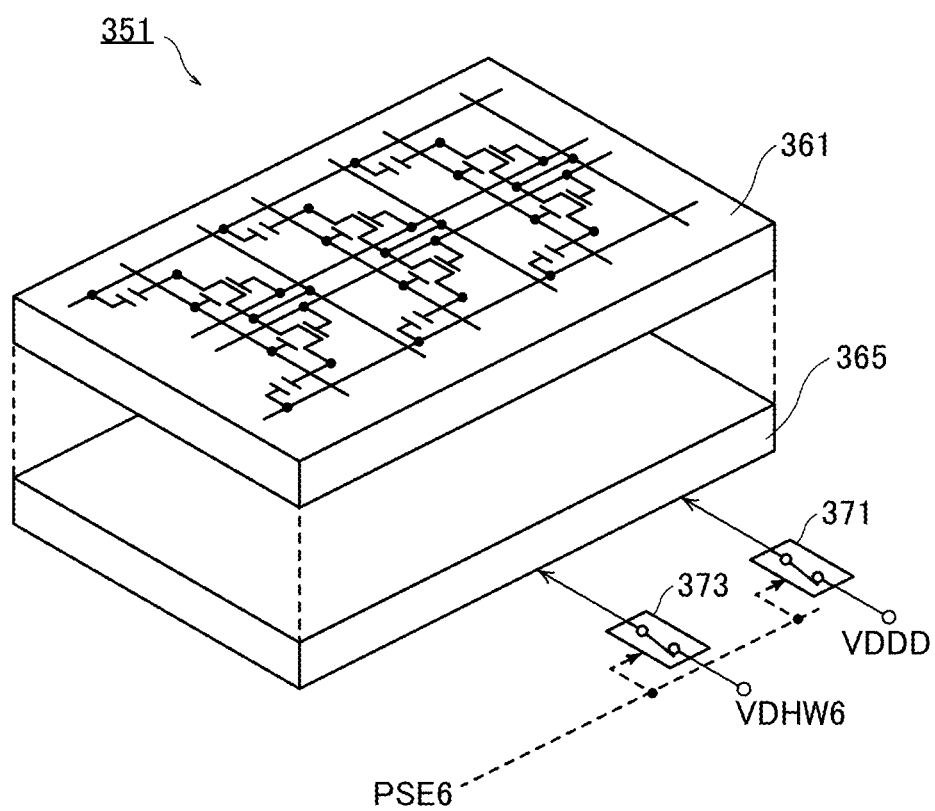
FIG. 19B is a diagram illustrating an example of a stacked-layer structure of a DOSRAM.

As illustrated in FIG. 19B, in the DOSRAM 351, a memory cell array 361 can be stacked over a peripheral circuit 365. This is because the transistor M6 of the memory cell 16 is an OS transistor.

In the memory cell array 361, a plurality of memory cells 16 are arranged in a matrix, and the bit lines BL1 and BLB1, the word line WL1, and the wirings BGL6 and PL are provided according to the arrangement of the memory cells 16. A control circuit, a row circuit, and a column circuit are provided in the peripheral circuit 365. The row circuit selects the word line WL1 that is to be accessed, for example. The column circuit performs writing and reading out of data to and from a bit line pair formed of BL1 and BLB1, for example.

Power switches 371 and 373 are provided in order to power gate the peripheral circuit 365. The power switches 371 and 373 control the input of voltages VDDD and VDHW6, respectively, to the peripheral circuit 365. Note that the voltage VDHW6 is a high-level voltage for the word line WL1. On/off of the power switches 371 and 373 is controlled with a signal PSE6.

<Example of Arithmetic Circuit>

Next, a structure example of a semiconductor device which can be used for an arithmetic operation of a neural network is described.

Figure 20A:
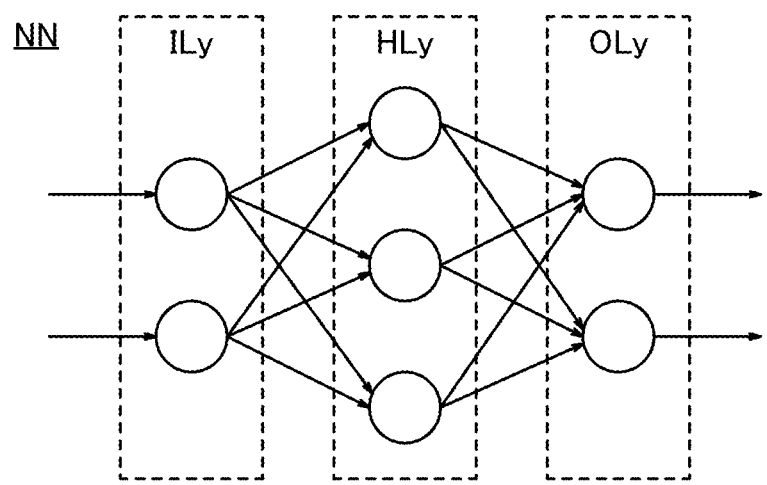
FIG. 20A is a diagram illustrating a structure example of a neural network.

As shown in FIG. 20A, a neural network NN can be formed of an input layer ILy, an output layer OLy, and a middle layer (hidden layer) HLy. The input layer Thy, the output layer OLy, and the middle layer HLy each include one or more neurons (units). Note that the middle layer HLy may be composed of one layer or two or more layers. A neural network including two or more middle layers HLy can also be referred to as a DNN (deep neural network), and learning using a deep neural network can also be referred to as deep learning.

Input data is input to neurons in the input layer ILy, output signals of neurons in the previous layer or the subsequent layer are input to neurons in the middle layer HLy, and output signals of neurons in the previous layer are input to neurons in the output layer OLy. Note that each neuron may be connected to all the neurons in the previous and subsequent layers (full connection), or may be connected to some of the neurons.

Figure 20B:
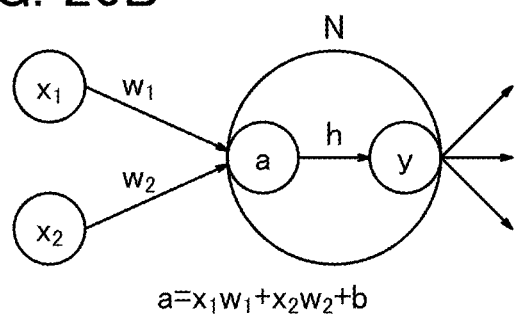
FIG. 20B is a diagram illustrating a structure example of a neural network.

FIG. 20B shows an example of a calculation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result $(x_1w_1)$ of the output $x_1$ and a weight $w_1$ and a multiplication result $(x_2w_2)$ of the output $x_2$ and a weight $w_2$ is calculated, and then a bias b is added as necessary, so that a value $a=x_1w_1+x_2w_2$ b is obtained. Then, the value a is converted with an activation function h, and an output signal $y=h(a)$ is output from the neuron N.

In this manner, the calculation with the neurons includes the calculation that sums the products of the outputs and the weights of the neurons in the previous layer, that is, the product-sum operation ($x_1w_1+x_2w_2$ described above). This product-sum operation may be performed using a program on software or using hardware. In the case where the product-sum operation is performed by hardware, a product-sum operation circuit can be used. Either a digital circuit or an analog circuit can be used as this product-sum operation circuit. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit may be formed using a transistor including silicon (such as single crystal silicon) in a channel formation region (hereinafter, also referred to as a Si transistor) or may be formed using a transistor including an oxide semiconductor in a channel formation region (hereinafter, also referred to as an OS transistor). An OS transistor is particularly preferably used as a transistor included in a memory of the product-sum operation circuit because of its extremely low off-state current. Note that the product-sum operation circuit may include both a Si transistor and an OS transistor. A structure example of a semiconductor device having a function of the product-sum operation circuit is described below.

Figure 21:
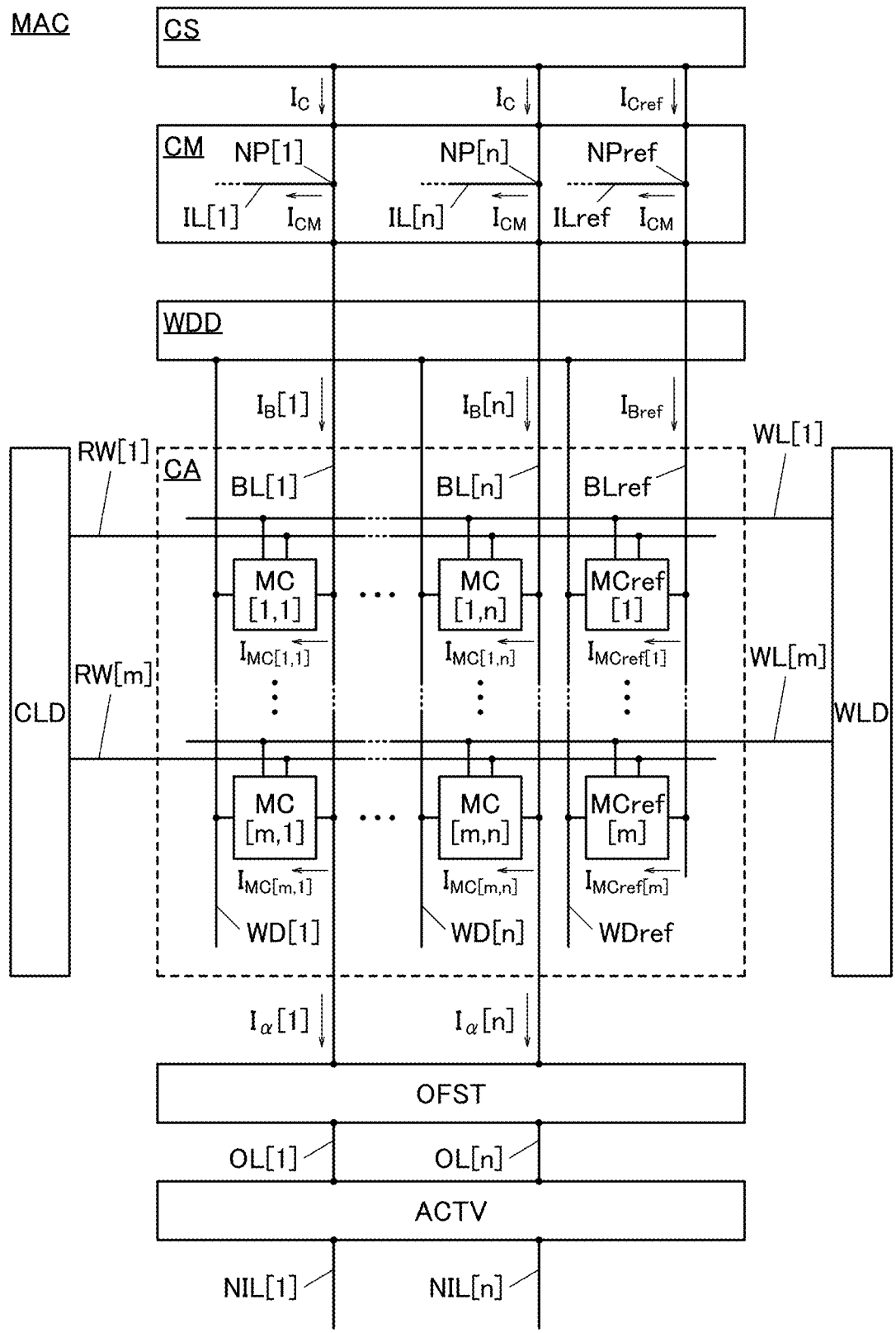
FIG. 21 is a diagram illustrating a structure example of a semiconductor device.

FIG. 21 shows a structure example of a semiconductor device MAC having a function of performing a calculation of a neural network. The semiconductor device MAC has a function of performing a product-sum operation of first data corresponding to the connection strength (weight) between the neurons and second data corresponding to input data. Note that the first data and the second data can each be analog data or multilevel digital data (discrete data). The semiconductor device MAC also has a function of converting data obtained by the product-sum operation with an activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. FIG. 21 illustrates a structure example in which the cell array CA includes the memory cells MC in m rows and n columns (MC[1, 1] to MC[m, n]) and the m memory cells MCref (MCref[1] to MCref[m]) (m and n are integers greater than or equal to 1). The memory cells MC each have a function of storing the first data. In addition, the memory cells MCref each have a function of storing reference data used for the product-sum operation. Note that the reference data can be analog data or multilevel digital data.

The memory cell MC[i, j] (i is an integer greater than or equal to 1 and less than or equal to m, and j is an integer greater than or equal to 1 and less than or equal to n) is connected to a wiring WL[i], a wiring RW[i], a wiring WD[j], and a wiring BL[j]. In addition, the memory cell MCref[i] is connected to the wiring WL[i], the wiring RW[i], a wiring WDref, and a wiring BLref. Here, a current flowing between the memory cell MC[i, j] and the wiring BL[j] is denoted by $I_{MC[i,\,j]}$, and a current flowing between the memory cell MCref[i] and the wiring BLref is denoted by $I_{MCref[i]}$.

Figure 22:
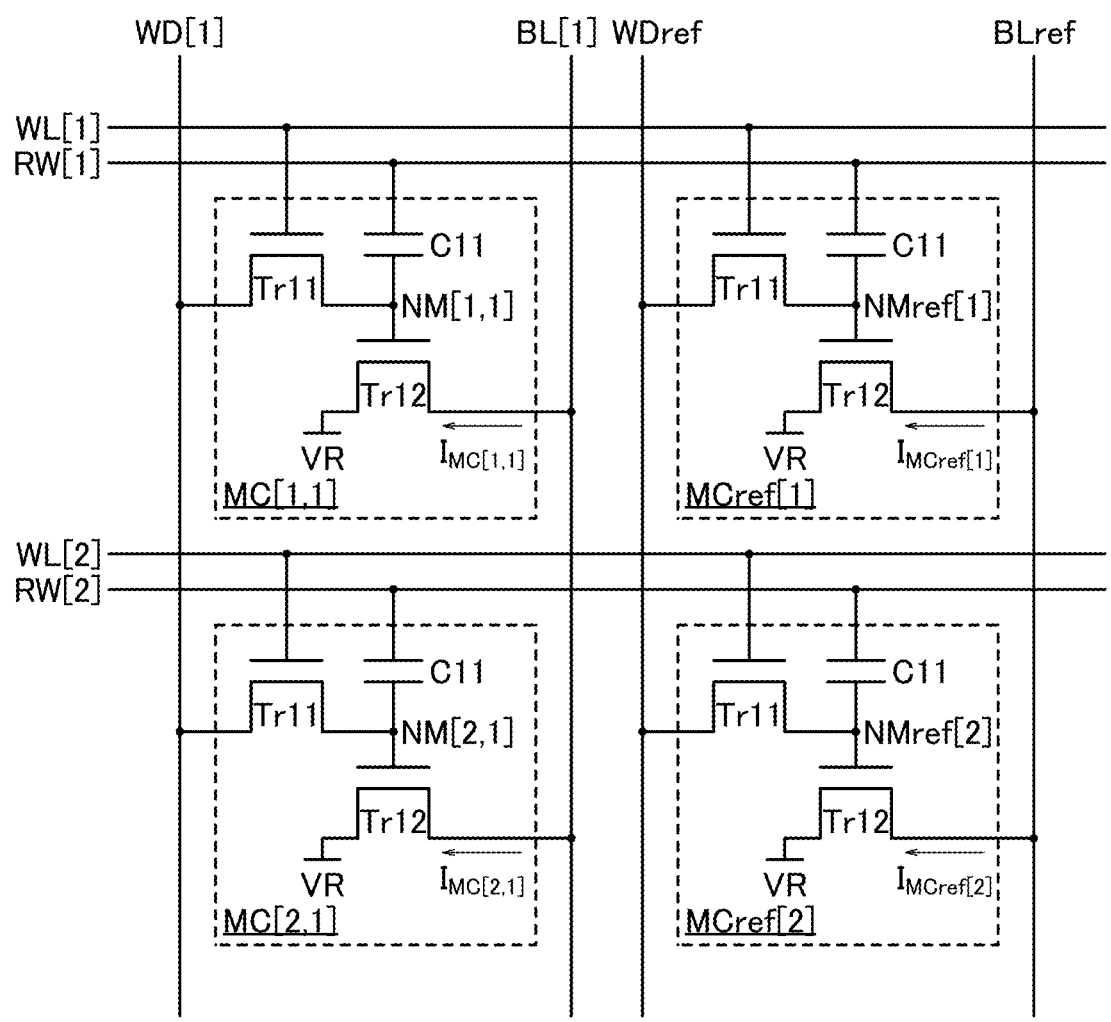
FIG. 22 is a diagram illustrating a structure example of memory cells.

FIG. 22 shows a specific structure example of the memory cells MC and the memory cells MCref. Although the memory cells MC[1, 1] and MC[2, 1] and the memory cells MCref[1] and MCref[2] are illustrated in FIG. 22 as typical examples, similar structures can be used for other memory cells MC and memory cells MCref. The memory cells MC and the memory cells MCref each include transistors Tr11 and Tr12 and a capacitor C11. Here, the case where the transistor Tr11 and the transistor Tr12 are n-channel transistors is described.

In the memory cell MC, a gate of the transistor Tr11 is connected to the wiring WL, one of a source and a drain is connected to a gate of the transistor Tr12 and a first electrode of the capacitor C11, and the other of the source and the drain is connected to the wiring WD. One of a source and a drain of the transistor Tr12 is connected to the wiring BL, and the other of the source and the drain of the transistor Tr12 is connected to a wiring VR. A second electrode of the capacitor C11 is connected to the wiring RW. The wiring VR is a wiring having a function of supplying a predetermined potential. Here, the case where a low power supply potential (e.g., a ground potential) is supplied from the wiring VR is described as an example.

A node connected to the one of the source and the drain of the transistor Tr11, the gate of the transistor Tr12, and the first electrode of the capacitor C11 is referred to as a node NM. The nodes NM in the memory cells MC[1, 1] and MC[2, 1] are referred to as nodes NM[1, 1] and NM[2, 1], respectively.

The memory cells MCref have a structure similar to that of the memory cell MC. However, the memory cells MCref are connected to the wiring WDref instead of the wiring WD and connected to the wiring BLref instead of the wiring BL. Nodes in the memory cells MCref[1] and MCref[2] each of which is connected to the one of the source and the drain of the transistor Tr11, the gate of the transistor Tr12, and the first electrode of the capacitor C11 are referred to as nodes NMref[1] and NMref[2], respectively.

The nodes NM and NMref function as holding nodes of the memory cell MC and the memory cell MCref, respectively. The first data is held in the node NM and the reference data is held in the node NMref. Currents $I_{MC[1,\,1]}$ and $I_{MC[2,\,1]}$ from the wiring BL[1] flow to the transistors Tr12 of the memory cells MC[1, 1] and MC[2, 1], respectively. Currents $I_{MCref[1]}$ and $I_{MCref[2]}$ from the wiring BLref flow to the transistors Tr12 of the memory cells MCref[1] and MCref[2], respectively.

Since the transistor Tr11 has a function of holding the potential of the node NM or the node NMref, the off-state current of the transistor Tr11 is preferably low. Thus, it is preferable to use an OS transistor, which has extremely low off-state current, as the transistor Tr11. This suppresses a change in the potential of the node NM or the node NMref, so that the calculation accuracy can be increased. Furthermore, operations of refreshing the potential of the node NM or the node NMref can be performed less frequently, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be manufactured with the same manufacturing apparatus as that for the transistor Tr11, and accordingly manufacturing cost can be reduced. Note that the transistor Tr12 may be an n-channel transistor or a p-channel transistor.

The current source circuit CS is connected to the wirings BL[1] to BL[n] and the wiring BLref. The current source circuit CS has a function of supplying currents to the wirings BL[1] to BL[n] and the wiring BLref. Note that the value of the current supplied to the wirings BL[1] to BL[n] may be different from the value of the current supplied to the wiring BLref. Here, the current supplied from the current source circuit CS to the wirings BL[1] to BL[n] is denoted by $I_C$, and the current supplied from the current source circuit CS to the wiring BLref is denoted by $I_{Cref}$.

The current mirror circuit CM includes wirings IL[1] to IL[n] and a wiring ILref. The wirings IL[1] to IL[n] are connected to the wirings BL[1] to BL[n], respectively, and the wiring ILref is connected to the wiring BLref. Here, portions where the wirings IL[1] to IL[n] are connected to the respective wirings BL[1] to BL[n] are referred to as nodes NP[1] to NP[n]. Furthermore, a connection portion between the wiring ILref and the wiring BLref is referred to as a node NPref.

The current mirror circuit CM has a function of making a current $I_{CM}$ corresponding to the potential of the node NPref flow to the wiring ILref and a function of making this current $I_{CM}$ flow also to the wirings IL[1] to IL[n]. In the example illustrated in FIG. 21, the current $I_{CM}$ is discharged from the wiring BLref to the wiring ILref, and the current $I_{CM}$ is discharged from the wirings BL[1] to BL[n] to the wirings IL[1] to IL[n]. Furthermore, currents flowing from the current mirror circuit CM to the cell array CA through the wirings BL[1] to BL[n] are denoted by $I_B[1]$ to $I_B[n]$. Furthermore, a current flowing from the current mirror circuit CM to the cell array CA through the wiring BLref is denoted by $I_{Bref}$.

The circuit WDD is connected to the wirings WD[1] to WD[n] and the wiring WDref. The circuit WDD has a function of supplying a potential corresponding to the first data stored in the memory cells MC to the wirings WD[1] to WD[n]. The circuit WDD also has a function of supplying a potential corresponding to the reference data stored in the memory cell MCref to the wiring WDref. The circuit WLD is connected to the wirings WL[1] to WL[m]. The circuit WLD has a function of supplying a signal for selecting the memory cell MC or the memory cell MCref to which data is to be written, to any of the wirings WL[1] to WL[m]. The circuit CLD is connected to the wirings RW[1] to RW[m]. The circuit CLD has a function of supplying a potential corresponding to the second data to the wirings RW[1] to RW[m].

The offset circuit OFST is connected to the wirings BL[1] to BL[n] and wirings OL[1] to OL[n]. The offset circuit OFST has a function of detecting the amount of currents flowing from the wirings BL[1] to BL[n] to the offset circuit OFST and/or the amount of change in the currents flowing from the wirings BL[1] to BL[n] to the offset circuit OFST. The offset circuit OFST also has a function of outputting detection results to the wirings OL[1] to OL[n]. Note that the offset circuit OFST may output currents corresponding to the detection results to the wirings OL, or may convert the currents corresponding to the detection results into voltages to output the voltages to the wirings OL. The currents flowing between the cell array CA and the offset circuit OFST are denoted by $I_\alpha[1]$ to $I_\alpha[n]$.

Figure 23:
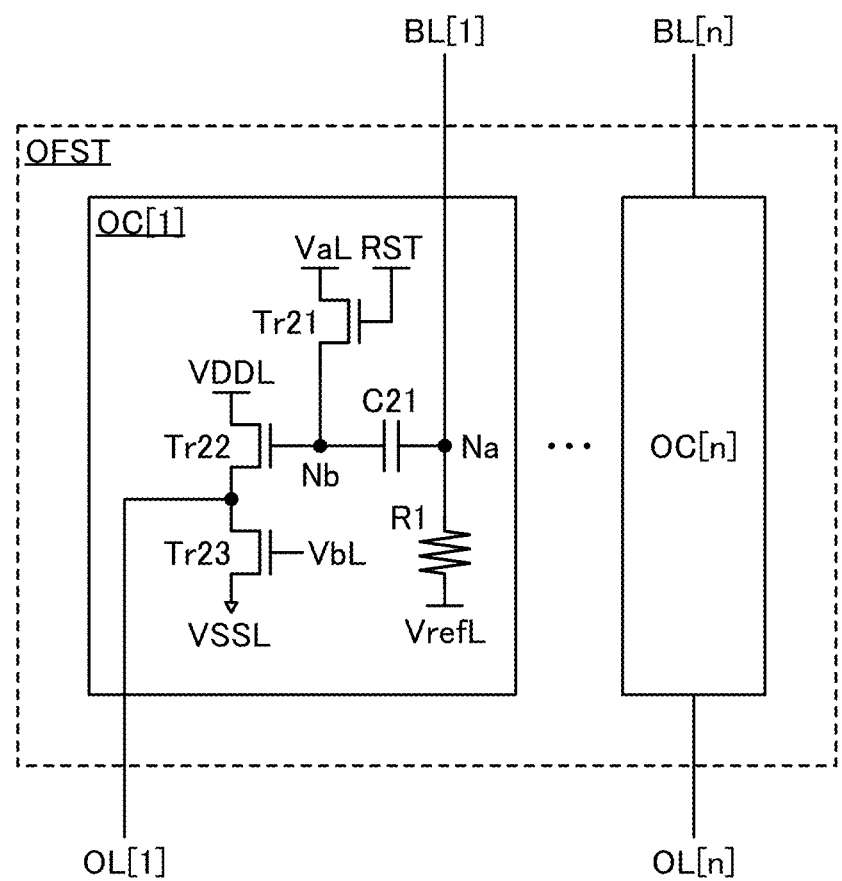
FIG. 23 is a diagram illustrating a structure example of an offset circuit.

FIG. 23 illustrates a structure example of the offset circuit OFST. The offset circuit OFST illustrated in FIG. 23 includes circuits OC[1] to OC[n]. The circuits OC[1] to OC[n] each include a transistor Tr21, a transistor Tr22, a transistor Tr23, a capacitor C21, and a resistor R1. Connection relationships of the elements are shown in FIG. 23. Note that a node connected to a first electrode of the capacitor C21 and a first terminal of the resistor R1 is referred to as a node Na. In addition, a node connected to a second electrode of the capacitor C21, one of a source and a drain of the transistor Tr21, and a gate of the transistor Tr22 is referred to as a node Nb.

A wiring VrefL has a function of supplying a potential Vref, a wiring VaL has a function of supplying a potential Va, and a wiring VbL has a function of supplying a potential Vb. Furthermore, a wiring VDDL has a function of supplying a power supply potential VDD, and a wiring VSSL has a function of supplying a power supply potential VSS. Here, the case where the power supply potential VDD is a high power supply potential and the power supply potential VSS is a low power supply potential is described. A wiring RST has a function of supplying a potential for controlling the conduction state of the transistor Tr21. The transistor Tr22, the transistor Tr23, the wiring VDDL, the wiring VSSL, and the wiring VbL form a source follower circuit.

Next, an operation example of the circuits OC[1] to OC[n] is described. Note that although an operation example of the circuit OC[1] is described here as a typical example, the circuits OC[2] to OC[n] can operate in a similar manner. First, when a first current flows to the wiring BL[1], the potential of the node Na becomes a potential corresponding to the first current and the resistance value of the resistor R1. At this time, the transistor Tr21 is on, and thus the potential Va is supplied to the node Nb. Then, the transistor Tr21 is turned off.

Next, when a second current flows to the wiring BL[1], the potential of the node Na becomes a potential corresponding to the second current and the resistance value of the resistor R1. At this time, since the transistor Tr21 is off and the node Nb is in a floating state, the potential of the node Nb is changed owing to capacitive coupling, following the change in the potential of the node Na. Here, when the amount of change in the potential of the node Na is $\Delta V_{Na}$ and the capacitive coupling coefficient is 1, the potential of the node Nb is $Va+\Delta V_{Na}$. In addition, when the threshold voltage of the transistor Tr22 is Val, a potential of $Va+\Delta V_{Na}-V_{th}$ is output from the wiring OL[1]. Here, when $Va=V_{th}$, the potential $\Delta V_{Na}$ can be output from the wiring OL[1].

The potential $\Delta V_{Na}$ is determined by the amount of change from the first current to the second current, the resistance value of the resistor R1, and the potential Vref. Here, since the resistance value of the resistor R1 and the potential Vref are known, the amount of change in the current flowing to the wiring BL can be found from the potential $\Delta V_{Na}$.

A signal corresponding to the amount of current and/or the amount of change in the current that are/is detected by the offset circuit OFST as described above is input to the activation function circuit ACTV through the wirings OL[1] to OL[n].

The activation function circuit ACTV is connected to the wirings OL[1] to OL[n] and wirings NIL[1] to NIL[n]. The activation function circuit ACTV has a function of performing a calculation for converting the signal input from the offset circuit OFST in accordance with the predefined activation function. As the activation function, for example, a sigmoid function, a tanh function, a softmax function, a ReLU function, a threshold function, or the like can be used. The signal converted by the activation function circuit ACTV is output as output data to the wirings NIL[1] to NIL[n].

With the above semiconductor device MAC, the product-sum operation of the first data and the second data can be performed. An operation example of the semiconductor device MAC at the time of performing the product-sum operation is described below.

Figure 24:
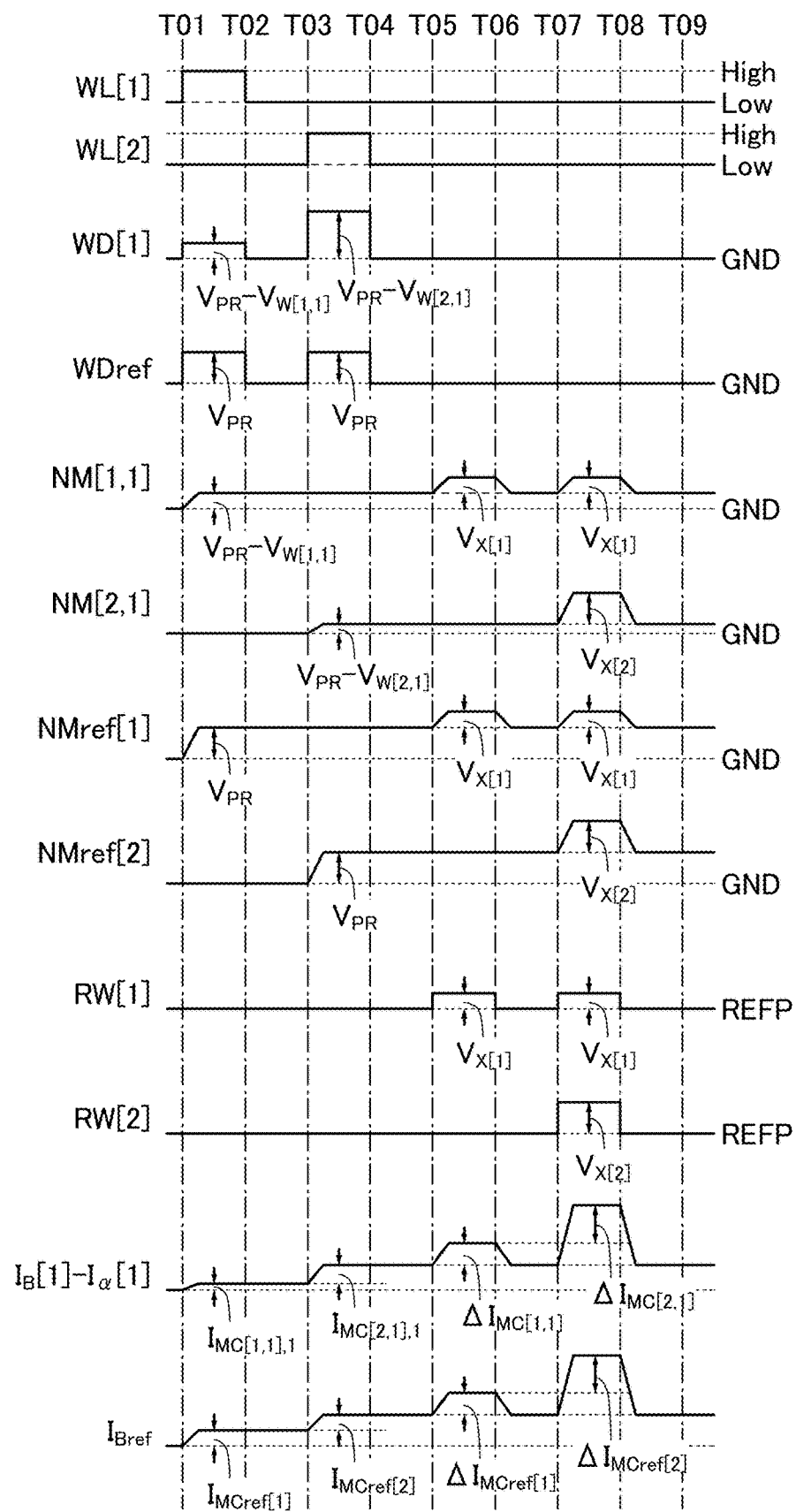
FIG. 24 is a timing chart.

FIG. 24 shows a timing chart of the operation example of the semiconductor device MAC. FIG. 24 shows changes in the potentials of the wiring WL[1], the wiring WL[2], the wiring WD[1], the wiring WDref, the node NM[1, 1], the node NM[2, 1], the node NMref[1], the node NMref[2], the wiring RW[1], and the wiring RW[2] in FIG. 22 and changes in the values of the current $I_B[1]-I_\alpha[1]$ and the current $I_{Bref}$.

The current $I_B[1]-I_\alpha[1]$ corresponds to the sum total of the currents flowing from the wiring BL[1] to the memory cells MC[1, 1] and MC[2, 1].

Although an operation is described with a focus on the memory cells MC[1, 1] and MC[2, 1] and the memory cells MCref[1] and MCref[2] illustrated in FIG. 22 as a typical example, the other memory cells MC and the other memory cells MCref can be operated in a similar manner.

First, from Time T01 to Time T02, the potential of the wiring WL[1] becomes a high level (High), the potential of the wiring WD[1] becomes a potential greater than a ground potential (GND) by $V_{PR}-V_{W[1, 1]}$, and the potential of the wiring WDref becomes a potential greater than the ground potential by $V_{PR}$. The potentials of the wiring RW[1] and the wiring RW[2] become reference potentials (REFP). Note that the potential $V_{W[1, 1]}$ is a potential corresponding to the first data stored in the memory cell MC[1, 1]. The potential $V_{PR}$ is the potential corresponding to the reference data. Thus, the transistors Tr11 included in the memory cell MC[1, 1] and the memory cell MCref[1] are brought into on states, and the potential of the node NM[1, 1] becomes $V_{PR}-V_{W[1, 1]}$ and the potential of the node NMref[1] becomes $V_{PR}$.

In this case, a current $I_{MC[1, 1], 0}$ flowing from the wiring BL[1] to the transistor Tr12 in the memory cell MC[1, 1] can be expressed by a formula shown below. Here, k is a constant determined by the channel length, the channel width, the mobility, the capacitance of a gate insulating film, and the like of the transistor Tr12. In addition, $V_{th}$ is the threshold voltage of the transistor Tr12.

$$I_{MC[1,1],0}=k(V_{PR}-V_{W[1,1]}-V_{th})^2 \tag{E1}$$

A current $I_{MCref[1], 0}$ flowing from the wiring BLref to the transistor Tr12 in the memory cell MCref[1] can be expressed by a formula shown below.

$$I_{MCref[1],0}=k(V_{PR}-V_{th})^2 \tag{E2}$$

Next, from Time T02 to Time T03, the potential of the wiring WL[1] becomes a low level (Low). Consequently, the transistors Tr11 included in the memory cell MC[1, 1] and the memory cell MCref[1] are brought into off states, and the potentials of the node NM[1, 1] and the node NMref[1] are held.

As described above, an OS transistor is preferably used as the transistor Tr11. This can suppress the leakage current of the transistor Tr11, so that the potentials of the node NM[2, 1] and the node NMref[2] can be held accurately.

Next, Time T03 to Time T04, the potential of the wiring WL[2] becomes the high level, the potential of the wiring WD[1] becomes a potential greater than the ground potential by $V_{PR}-V_{W[2, 1]}$, and the potential of the wiring WDref becomes a potential greater than the ground potential by $V_{PR}$. Note that the potential $V_{W[2, 1]}$ is a potential corresponding to the first data stored in the memory cell MC[2, 1]. Thus, the transistors Tr11 included in the memory cell MC[2, 1] and the memory cell MCref[2] are brought into on states, and the potential of the node NM[2, 1] becomes $V_{PR}-V_{W[2, 1]}$ and the potential of the node NMref[2] becomes $V_{PR}$.

Here, a current $I_{MC[2, 1], 0}$ flowing from the wiring BL[1] to the transistor Tr12 in the memory cell MC[2, 1] can be expressed by a formula shown below.

$$I_{MC[2,1],0}=k(V_{PR}-V_{W[2,1]}-V_{th})^2 \tag{E3}$$

Furthermore, a current $I_{MCref[2], 0}$ flowing from the wiring BLref to the transistor Tr12 in the memory cell MCref[2] can be expressed by a formula shown below.

$$I_{MCref[2],0}=k(V_{PR}-V_{th})^2 \tag{E4}$$

Next, from Time T04 to Time T05, the potential of the wiring WL[2] becomes the low level. Consequently, the transistors Tr11 included in the memory cell MC[2, 1] and the memory cell MCref[2] are brought into off states, and the potentials of the node NM[2, 1] and the node NMref[2] are held.

Through the above operation, the first data is stored in the memory cells MC[1, 1] and MC[2, 1], and the reference data is stored in the memory cells MCref[1] and MCref[2].

Here, currents flowing through the wiring BL[1] and the wiring BLref from Time T04 to Time T05 are considered. The current is supplied from the current source circuit CS to the wiring BLref. The current flowing through the wiring BLref is discharged to the current mirror circuit CM and the memory cells MCref[1] and MCref[2]. A formula shown below holds where $I_{Cref}$ is the current supplied from the current source circuit CS to the wiring BLref and $I_{CM, 0}$ is the current discharged from the wiring BLref to the current mirror circuit CM.

$$I_{Cref}-I_{CM,0}=I_{MCref[1],0}+I_{MCref[2],0} \tag{E5}$$

The current from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds where $I_{C, 0}$ is the current supplied from the current source circuit CS to the wiring BL[1] and $I_{\alpha, 0}$ is the current flowing from the wiring BL[1] to the offset circuit OF ST.

$$I_C-I_{CM,0}=I_{MC[1,1],0}+I_{MC[2,1],0}+I_{\alpha,0} \tag{E6}$$

Next, from Time T05 to Time T06, the potential of the wiring RW[1] becomes a potential greater than the reference potential by $V_{X[1]}$. At this time, the potential $V_{X[1]}$ is supplied to the capacitor C11 in each of the memory cell MC[1, 1] and the memory cell MCref[1], so that the potential of the gate of the transistor Tr12 is increased because of capacitive coupling. Note that the potential $V_{X[1]}$ is a potential corresponding to the second data supplied to the memory cell MC[1, 1] and the memory cell MCref[1].

The amount of change in the potential of the gate of the transistor Tr12 corresponds to the value obtained by multiplying the amount of change in the potential of the wiring RW by a capacitive coupling coefficient determined by the memory cell structure. The capacitive coupling coefficient is calculated using the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is set to 1. In practice, the potential $V_X$ can be determined in consideration of the capacitive coupling coefficient.

When the potential $V_{X[1]}$ is supplied to the capacitors C11 in the memory cell MC[1, 1] and the memory cell MCref[1], the potentials of the node NM[1, 1] and the node NMref[1] each increase by $V_{X[1]}$.

Here, a current $I_{MC[1, 1], 1}$ flowing from the wiring BL[1] to the transistor Tr12 in the memory cell MC[1, 1] from Time T05 to Time T06 can be expressed by the following formula.

$$I_{MC[1,1],1}=k(V_{PR}-V_{W[1,1]}+V_{X[1]}-V_{th})^2 \tag{E7}$$

Thus, when the potential $V_{X[1]}$ is supplied to the wiring RW[1], the current flowing from the wiring BL[1] to the transistor Tr12 in the memory cell MC[1, 1] increases by $\Delta I_{MC[1, 1]} = I_{MC[1, 1], 1} - I_{MC[1, 1], 0}$.

A current $I_{MCref[1], 1}$ flowing from the wiring BLref to the transistor Tr12 in the memory cell MCref[1] from Time T05 to Time T06 can be expressed by the following formula.

$$I_{MCref[1],1} = k(V_{PR} + V_{X[1]} - V_{th})^2 \tag{E8}$$

Thus, when the potential $V_{X[1]}$ is supplied to the wiring RW[1], the current flowing from the wiring BLref to the transistor Tr12 in the memory cell MCref[1] increases by $\Delta I_{MCref[1]} = I_{MCref[1], 1} - I_{MCref[1], 0}$.

Furthermore, currents flowing through the wiring BL[1] and the wiring BLref are considered. The current $I_{Cref}$ is supplied from the current source circuit CS to the wiring BLref. The current flowing through the wiring BLref is discharged to the current mirror circuit CM and the memory cells MCref[1] and MCref[2]. A formula shown below holds where $I_{CM, 1}$ is the current discharged from the wiring BLref to the current mirror circuit CM.

$$I_{Cref} - I_{CM,1} = I_{MCref[1],1} + I_{MCref[2],1} \tag{E9}$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. A formula shown below holds where $I_{\alpha, 1}$ is the current flowing from the wiring BL[1] to the offset circuit OF ST.

$$I_C - I_{CM,1} = I_{MC[1,1],1} + I_{MC[2,1],1} + I_{\alpha,1} \tag{E10}$$

In addition, from the formula (E1) to the formula (E10), a difference between the current $I_{\alpha, 0}$ and the current $I_{\alpha, 1}$ (differential current $\Delta I_\alpha$) can be expressed by a formula shown below.

$$\Delta I_\alpha = I_{\alpha,0} - I_{\alpha,0} = 2kV_{W[1,1]}V_{X[1]} \tag{E11}$$

Thus, the differential current $\Delta I_\alpha$ is a value corresponding to the product of the potentials $V_{W[1, 1]}$ and $V_{X[1]}$.

After that, from Time T06 to Time T07, the potential of the wiring RW[1] becomes the reference potential, and the potentials of the node NM[1, 1] and the node NMref[1] become similar to the potentials thereof from Time T04 to Time T05.

Next, from Time T07 to Time T08, the potential of the wiring RW[1] becomes a potential greater than the reference potential by $V_{X[1]}$, and the potential of the wiring RW[2] becomes a potential greater than the reference potential by $V_{X[2]}$. Accordingly, the potential $V_{X[1]}$ is supplied to the capacitor C11 in each of the memory cell MC[1, 1] and the memory cell MCref[1], and the potentials of the node NM[1, 1] and the node NMref[1] each increase by $V_{X[1]}$ because of capacitive coupling. Furthermore, the potential $V_{X[2]}$ is supplied to the capacitor C11 in each of the memory cell MC[2, 1] and the memory cell MCref[2], and the potentials of the node NM[2, 1] and the node NMref[2] each increase by $V_{X[2]}$ because of capacitive coupling.

Here, a current $I_{MC[2, 1], 1}$ flowing from the wiring BL[1] to the transistor Tr12 in the memory cell MC[2, 1] from Time T07 to Time T08 can be expressed by the following formula.

$$I_{MC[2,1],1} = k(V_{PR} - V_{W[2,1]} + V_{X[2]} - V_{th})^2 \tag{E12}$$

Thus, when the potential $V_{X[2]}$ is supplied to the wiring RW[2], the current flowing from the wiring BL[1] to the transistor Tr12 in the memory cell MC[2, 1] increases by $\Delta I_{MC[2, 1]} = I_{MC[2, 1], 1} - I_{MC[2, 1], 0}$.

A current $I_{MCref[2], 1}$ flowing from the wiring BLref to the transistor Tr12 in the memory cell MCref[2] from Time T07 to Time T08 can be expressed by the following formula.

$$I_{MCref[2],1} = k(V_{PR} + V_{X[2]} - V_{th})^2 \tag{E13}$$

Thus, when the potential $V_{X[2]}$ is supplied to the wiring RW[2], the current flowing from the wiring BLref to the transistor Tr12 in the memory cell MCref[2] increases by $\Delta I_{MCref[2]} = I_{MCref[2], 1} - I_{MCref[2], 0}$.

Furthermore, currents flowing through the wiring BL[1] and the wiring BLref are considered. The current $I_{Cref}$ is supplied from the current source circuit CS to the wiring BLref. The current flowing through the wiring BLref is discharged to the current mirror circuit CM and the memory cells MCref[1] and MCref[2]. A formula shown below holds where $I_{CM, 2}$ is the current discharged from the wiring BLref to the current mirror circuit CM.

$$I_{Cref} - I_{CM,2} = I_{MCref[1],1} + I_{MCref[2],1} \tag{E14}$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OF ST. A formula shown below holds where $I_{\alpha, 2}$ is the current flowing from the wiring BL[1] to the offset circuit OF ST.

$$I_C - I_{CM,2} = I_{MC[1,1],1} + I_{MC[2,1],1} + I_{\alpha,2} \tag{E15}$$

In addition, from the formula (E1) to the formula (E8) and the formula (E12) to the formula (E15), a difference between the current $I_{\alpha, 0}$ and the current $I_{\alpha, 2}$ (differential current $\Delta I_\alpha$) can be expressed by the following formula.

$$\Delta I_\alpha = I_{\alpha,2} - I_{\alpha,0} = 2k(V_{W[1,1]}V_{X[1]} + V_{W[2,1]}V_{X[2]}) \tag{E16}$$

Thus, the differential current $\Delta I_\alpha$ is a value corresponding to the sum of the product of the potential $V_{W[1, 1]}$ and the potential $V_{X[1]}$ and the product of the potential $V_{W[2, 1]}$ and the potential $V_{X[2]}$.

After that, from Time T08 to Time T09, the potentials of the wirings RW[1] and RW[2] become the reference potential, and the potentials of the nodes NM[1, 1] and NM[2, 1] and the nodes NMref[1] and NMref[2] become similar to the potentials thereof from Time T04 to Time T05.

As represented by the formula (E11) and the formula (E16), the differential current $\Delta I_\alpha$ input to the offset circuit OFST can be calculated from the formula including a product term of the potential $V_W$ corresponding to the first data (weight) and the potential $V_X$ corresponding to the second data (input data). Thus, measurement of the differential current $\Delta I_\alpha$ with the offset circuit OFST gives the result of the product-sum operation of the first data and the second data.

Note that although the memory cells MC[1, 1] and MC[2, 1] and the memory cells MCref[1] and MCref[2] are particularly focused on in the above description, the number of the memory cells MC and the memory cells MCref can be freely set. In the case where the number m of rows of the memory cells MC and the memory cells MCref is an arbitrary number i, the differential current $\Delta I_\alpha$ can be expressed by the following formula.

$$\Delta I_\alpha = 2k\Sigma_i V_{W[i,1]} V_{X[i]} \tag{E17}$$

When the number n of columns of the memory cells MC and the memory cells MCref is increased, the number of product-sum operations executed in parallel can be increased.

The product-sum operation of the first data and the second data can be performed using the semiconductor device MAC as described above. Note that the use of the structure of the memory cells MC and the memory cells MCref in FIG. 22 allows the product-sum operation circuit to be formed of fewer transistors. Accordingly, the circuit scale of the semiconductor device MAC can be reduced.

In the case where the semiconductor device MAC is used for the operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL in FIG. 20A is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the structure of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), and the like.

The product-sum operation of the neural network can be performed using the semiconductor device MAC as described above. Furthermore, the memory cells MC and the memory cells MCref shown in FIG. 22 are used for the cell array CA, which can provide an integrated circuit with improved calculation accuracy, lower power consumption, or a reduced circuit scale.

The composition, structure, method, and the like described in this embodiment can be used in combination as appropriate with the compositions, structures, methods, and the like described in the other embodiments, the example, and the like.

Embodiment 2

In this embodiment, structures of transistors that can be used in the semiconductor device described in the above embodiment are described. As an example, a structure in which transistors having different electrical characteristics are stacked is described. With the structure, the degree of freedom in design of the semiconductor device can be increased. Stacking transistors having different electrical characteristics can increase the degree of integration of the semiconductor device.

Figure 25:
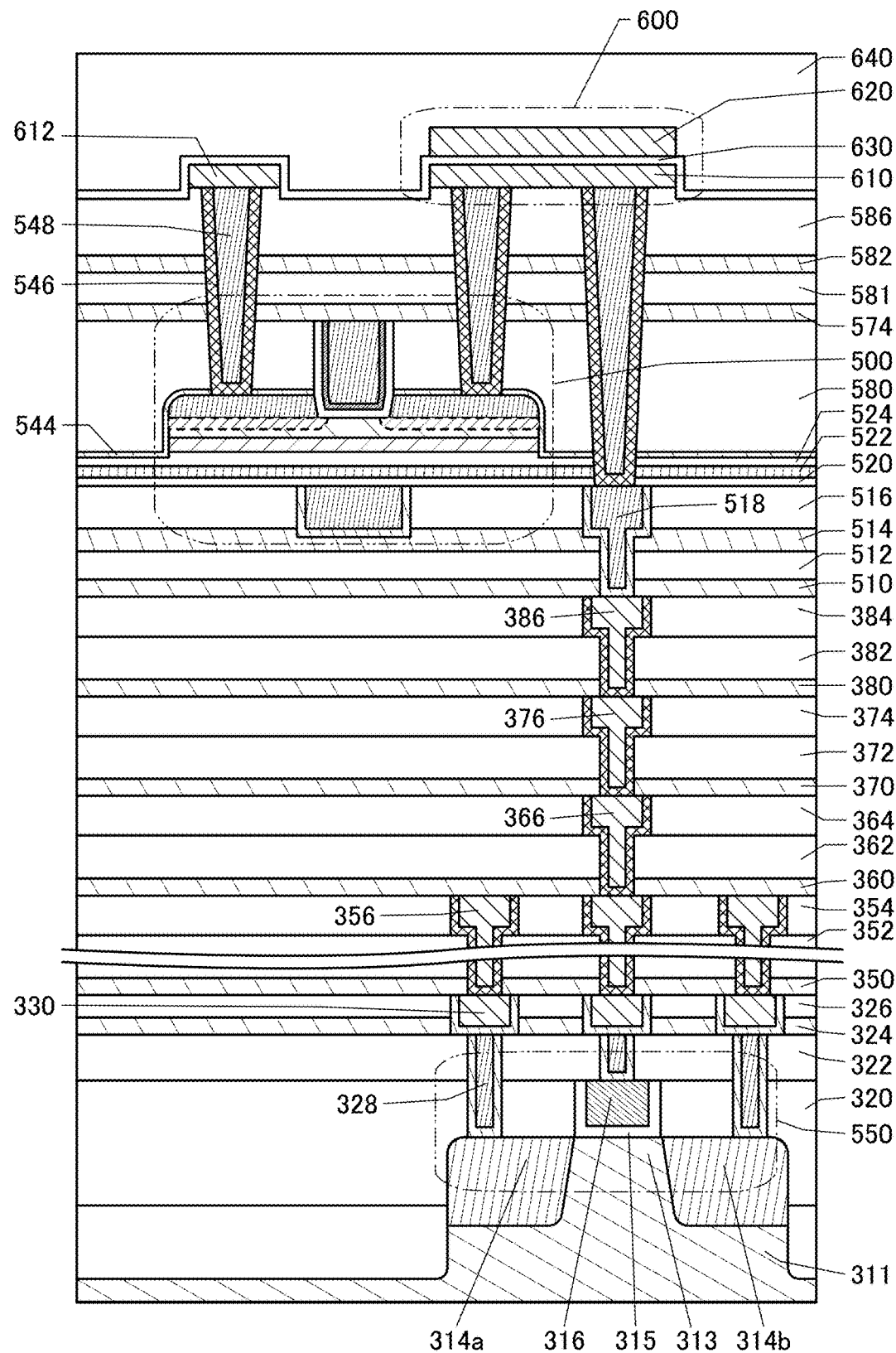
FIG. 25 is a diagram illustrating a structure example of a semiconductor device.
Figure 27A:
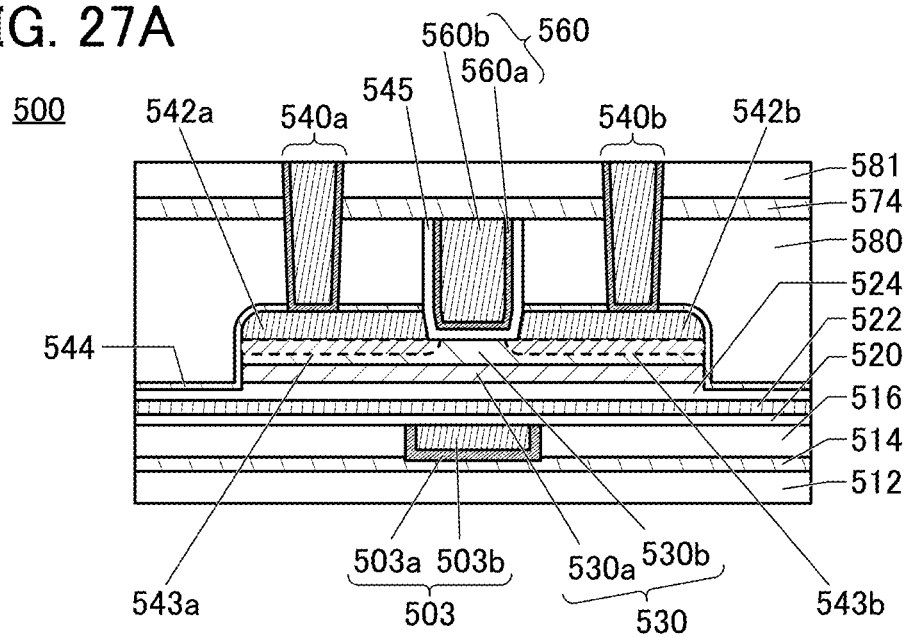
FIG. 27A to FIG. 27C are diagrams illustrating transistor structure examples.
Figure 27B:
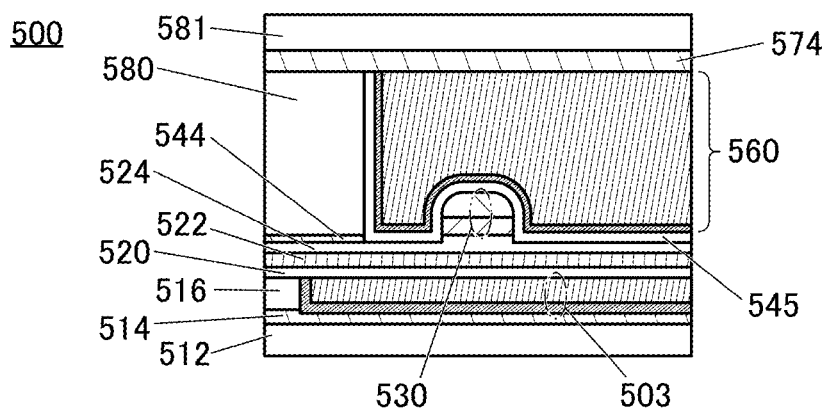
Figure 27C:
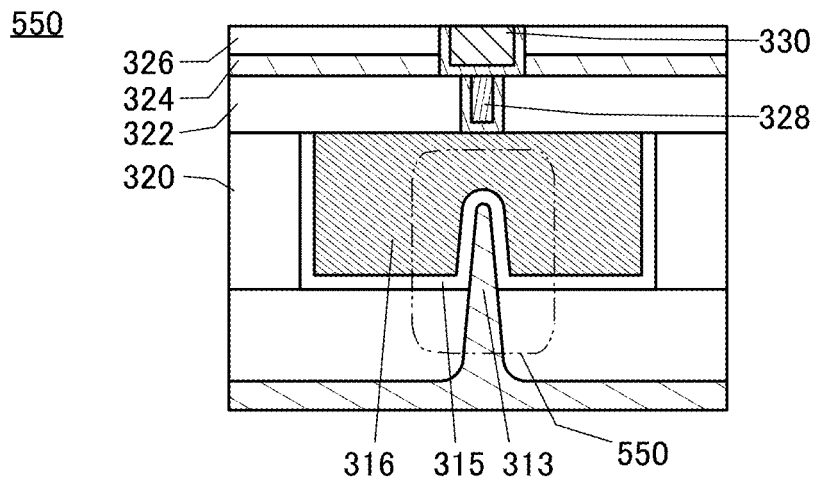

FIG. 25 illustrates part of a cross-sectional structure of a semiconductor device. The semiconductor device illustrated in FIG. 25 includes a transistor 550, a transistor 500, and a capacitor 600. FIG. 27A is a cross-sectional view of the transistor 500 in the channel length direction, FIG. 27B is a cross-sectional view of the transistor 500 in the channel width direction, and FIG. 27C is a cross-sectional view of the transistor 550 in the channel width direction. For example, the transistor 500 is an OS transistor and can be used as the OS transistor described in the above embodiment. The transistor 550 has a structure applicable to the Si transistor described in the above embodiment. The capacitor 600 has a structure applicable to the capacitor described in the above embodiment.

The transistor 500 is an OS transistor. The transistor 500 has an extremely low off-state current. Accordingly, data voltage or charge written to a storage node through the transistor 500 can be retained for a long time. In other words, power consumption of the semiconductor device can be reduced because a storage node has a low frequency of refresh operation or requires no refresh operation.

In FIG. 25, the transistor 500 is provided above the transistor 550, and the capacitor 600 is provided above the transistor 550 and the transistor 500.

The transistor 550 is provided on a substrate 311 and includes a conductor 316, an insulator 315, a semiconductor region 313 that is part of the substrate 311, and a low-resistance region 314a and a low-resistance region 314b each functioning as a source region or a drain region.

As illustrated in FIG. 27C, in the transistor 550, a top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (Silicon on Insulator) substrate, for example.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by thermal treatment; an ELTRAN method (a registered trademark: Epitaxial Layer Transfer); or the like. A transistor formed using a single crystal substrate contains a single crystal semiconductor in a channel formation region.

Figure 26:
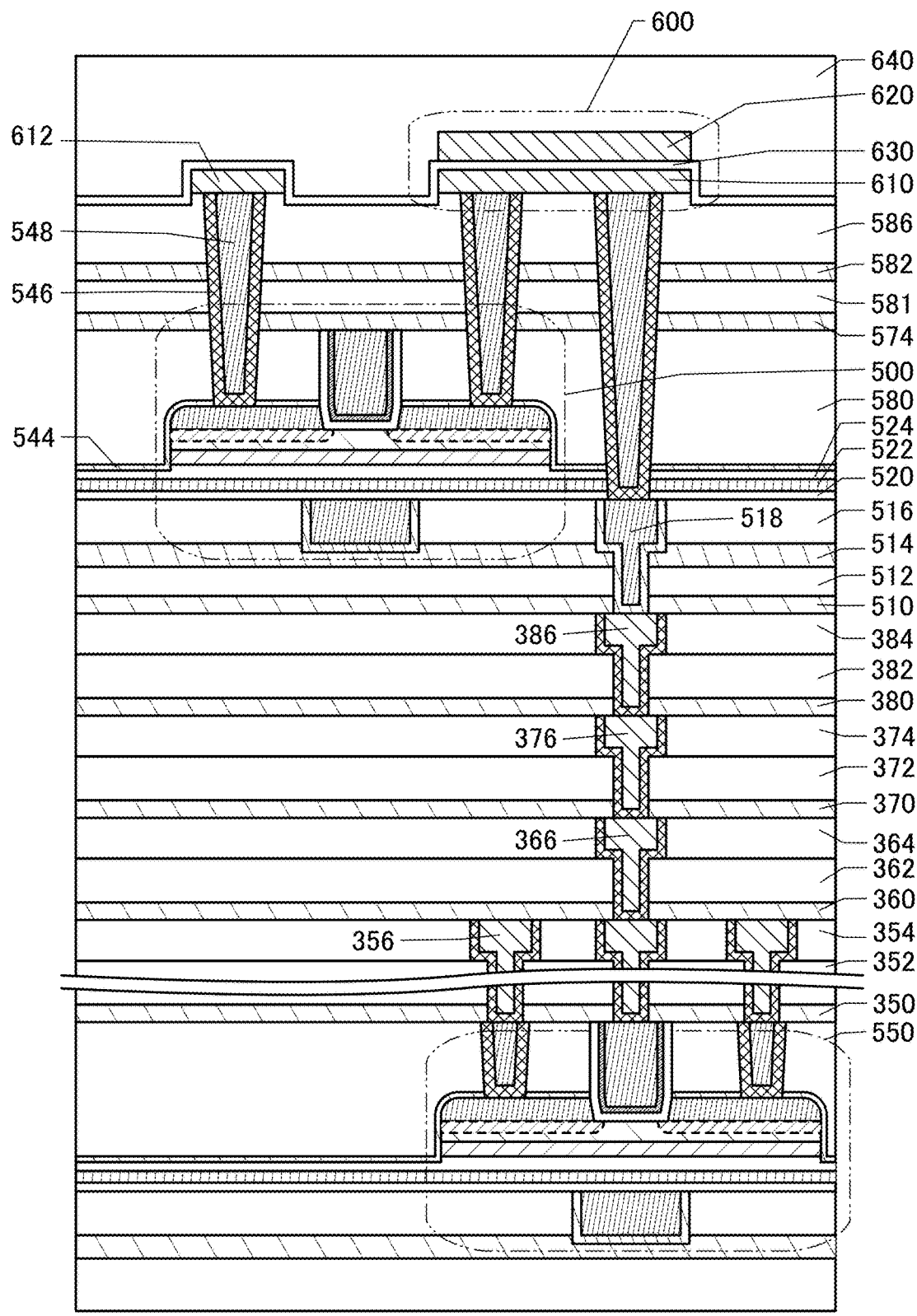
FIG. 26 is a diagram illustrating a structure example of a semiconductor device.

Note that the transistor 550 illustrated in FIG. 25 is an example and the structure is not limited thereto; an appropriate transistor can be used in accordance with a circuit structure or a driving method. For example, when the semiconductor device is a single-polarity circuit using only OS transistors (which represent transistors having the same polarity, e.g., only n-channel transistors), the transistor 550 has a structure similar to that of the transistor 500 as illustrated in FIG. 26. Note that the details of the transistor 500 are described later.

An insulator 320, an insulator 322, an insulator 324, and an insulator 326 are stacked sequentially to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like can be used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed using a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 25, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 25, an insulator 360, an insulator 362, and an insulator 364 are stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 25, an insulator 370, an insulator 372, and an insulator 374 are stacked sequentially. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 25, an insulator 380, an insulator 382, and an insulator 384 are stacked sequentially. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property against hydrogen or impurities diffused from the substrate 311, a region where the transistor 550 is provided, or the like into the region where the transistor 500 is provided. Thus, a material similar to that for the insulator 324 can be used.

For the film having a barrier property against hydrogen, silicon nitride formed using a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 27A and FIG. 27B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom surface and a side surface of the opening; and a conductor 560 positioned on a formation surface of the insulator 545.

The conductor 542a and the conductor 542b may be collectively referred to as a conductor 542.

In addition, as illustrated in FIG. 27A and FIG. 27B, an insulator 544 is preferably positioned between the insulator 580 and the oxide 530a, the oxide 530b, the conductor 542a, and the conductor 542b. Furthermore, as illustrated in FIG. 27A and FIG. 27B, the conductor 560 preferably includes a conductor 560a provided inside the insulator 545 and a conductor 560b provided to be embedded inside the conductor 560a. Moreover, as illustrated in FIG. 27A and FIG. 27B, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is illustrated, the present invention is not limited thereto. For example, it is possible to employ a structure in which a single layer of the oxide 530b or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Note that the transistors 500 illustrated in FIG. 25, FIG. 26, and FIG. 27A are examples, and the structures are not limited thereto; an appropriate transistor can be used in accordance with a circuit structure, a driving method, or the like.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as a top gate) electrode. In addition, the conductor 503 sometimes functions as a second gate (also referred to as a bottom gate) electrode. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be further increased, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 has a stacked layer of the conductor 503a and the conductor 503b in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor using an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture or hydrogen in an oxide semiconductor (sometimes referred to as "dehydration" or "dehydrogenation treatment") and to compensate for oxygen vacancies by supplying oxygen to the oxide semiconductor (sometimes referred to as "oxygen adding treatment") in order to obtain an oxide semiconductor whose $V_OH$ is sufficiently reduced. When an oxide semiconductor with sufficiently reduced impurities such as $V_OH$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of "$V_OH \rightarrow V_O+H$" occurs. Part of hydrogen generated at this time is bonded to oxygen to be $H_2O$, and removed from the oxide 530 or an insulator near the oxide 530 in some cases. Some hydrogen may be gettered into the conductor 542 in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O+O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high relative permittivity.

Note that in the transistor 500 in FIG. 27A and FIG. 27B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is used for the oxide 530 including a channel formation region. For example, for the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

Furthermore, the metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used for the oxide 530a is preferably higher than the atomic ratio of the element M to the constituent elements in the metal oxide used for the oxide 530b. In addition, the atomic ratio of the element M to In in the metal oxide used for the oxide 530a is preferably higher than the atomic ratio of the element M to In in the metal oxide used for the oxide 530b. Furthermore, the atomic ratio of In to the element M in the metal oxide used for the oxide 530b is preferably higher than the atomic ratio of In to the element M in the metal oxide used for the oxide 530a.

In addition, the energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gradually changes at a junction portion of the oxide 530a and the oxide 530b. In other words, the energy level of the conduction band minimum at the junction portion of the oxide 530a and the oxide 530b continuously changes or is continuously connected. To obtain this, the density of defect states in a mixed layer formed at an interface between the oxide 530a and the oxide 530b is preferably made low.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 27A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 27A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), for the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 that functions as the first gate electrode and has a two-layer structure is illustrated in FIG. 27A and FIG. 27B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used for the oxide 530 can be used. In that case, when the conductor 560b is deposited using a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used for the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542*a* and the conductor 542*b* with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used for the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to a structure of a conductor 546 and a conductor 548 that are described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, an aramid resin, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

Modification Example 1 of Transistor

Figure 28A:
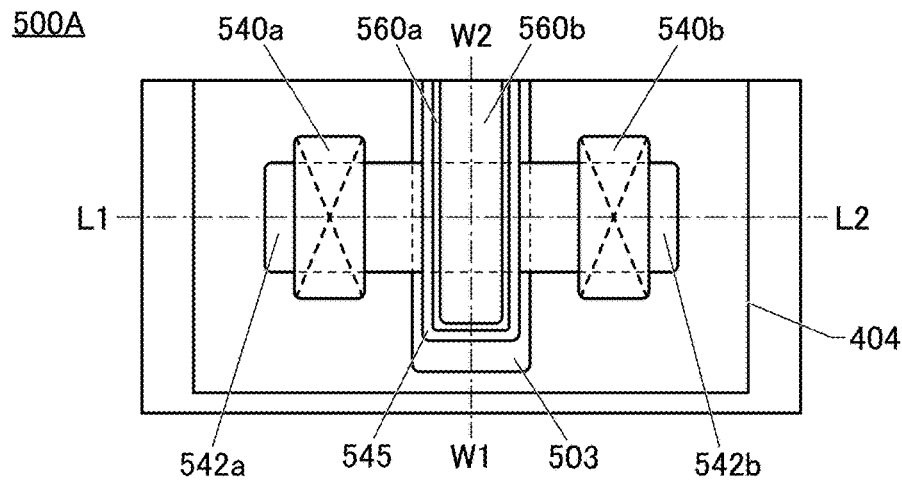
FIG. 28A to FIG. 28C are diagrams illustrating a transistor structure example.
Figure 28B:
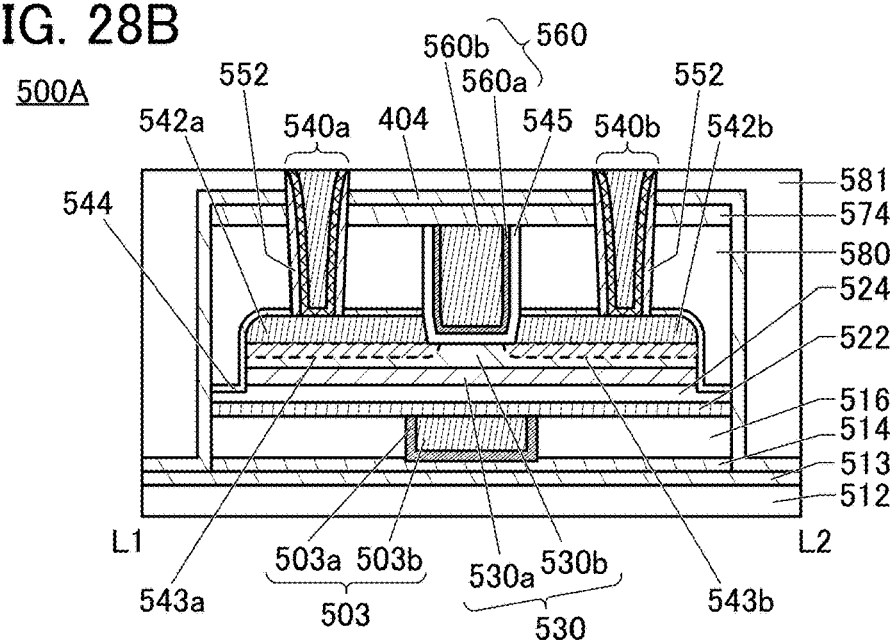
Figure 28C:
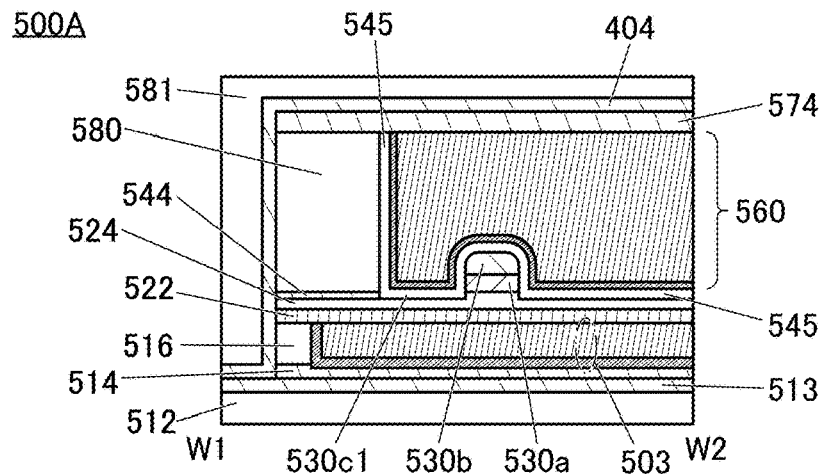

A transistor 500A illustrated in FIG. 28A, FIG. 28B, and FIG. 28C is a modification example of the transistor 500 having the structure illustrated in FIG. 27A and FIG. 27B. FIG. 28A is a top view of the transistor 500A, FIG. 28B is a cross-sectional view of the transistor 500A in the channel length direction, and FIG. 28C is a cross-sectional view of the transistor 500A in the channel width direction. Note that for clarity of the drawing, some components are not illustrated in the top view of FIG. 28A. The structure illustrated in FIG. 28A, FIG. 28B, and FIG. 28C can also be used for other transistors such as the transistor 550 included in the semiconductor device of one embodiment of the present invention.

The transistor 500A having the structure illustrated in FIG. 28A, FIG. 28B, and FIG. 28C is different from the transistor 500 having the structure illustrated in FIG. 27A and FIG. 27B in that an insulator 552, an insulator 513, and an insulator 404 are included. Furthermore, the transistor 500A is different from the transistor 500 having the structure illustrated in FIG. 27A and FIG. 27B in that the insulator 552 is provided in contact with a side surface of the conductor 540*a* and a side surface of the conductor 540*b*. Moreover, the transistor 500A is different from the transistor 500 having the structure illustrated in FIG. 27A and FIG. 27B in that the insulator 520 is not included.

In the transistor 500A having the structure illustrated in FIG. 28A, FIG. 28B, and FIG. 28C, the insulator 513 is provided over the insulator 512. The insulator 404 is provided over the insulator 574 and the insulator 513.

In the transistor 500A having the structure illustrated in FIG. 28A, FIG. 28B, and FIG. 28C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

Modification Example 2 of Transistor

Figure 29A:
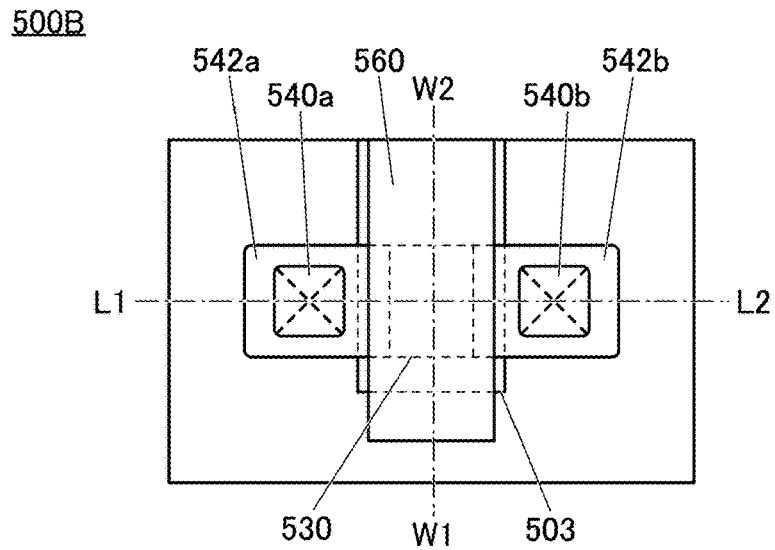
FIG. 29A to FIG. 29C are diagrams illustrating a transistor structure example.
Figure 29B:
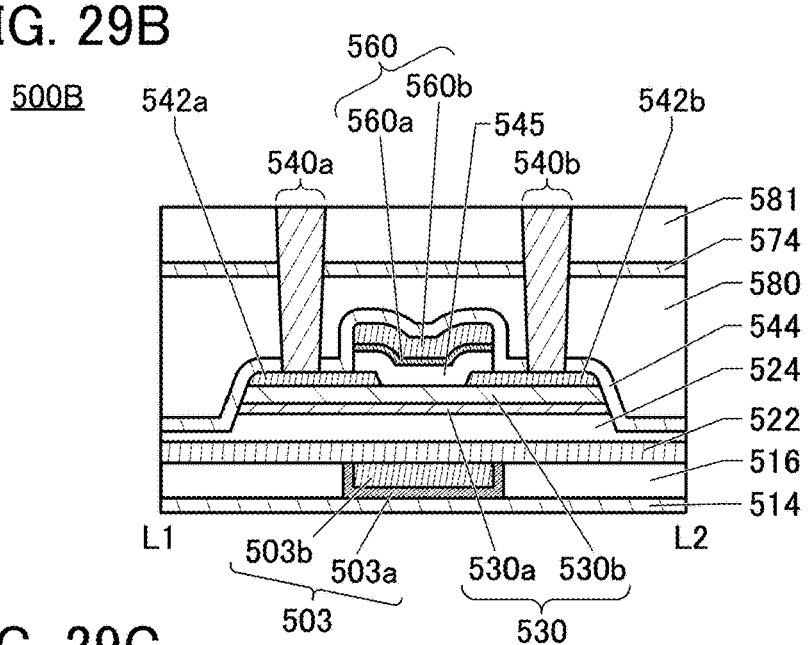
Figure 29C:
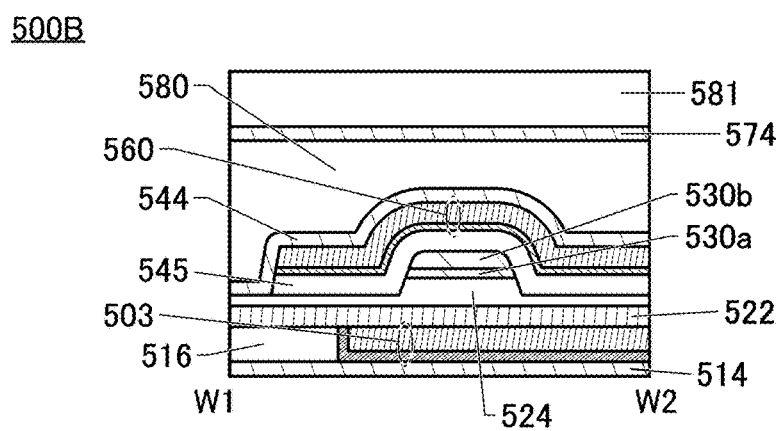

A structure example of a transistor 500B is described with reference to FIG. 29A, FIG. 29B, and FIG. 29C. FIG. 29A is a top view of the transistor 500B. FIG. 29B is a cross-sectional view of a portion indicated by dashed-dotted line L1-L2 in FIG. 29A. FIG. 29C is a cross-sectional view of a portion indicated by dashed-dotted line W1-W2 in FIG. 29A. Note that for clarity of the drawing, some components are not illustrated in the top view of FIG. 29A.

The transistor 500B is a modification example of the transistor 500 and can be replaced with the transistor 500. Accordingly, in order to avoid repeated description, differences of the transistor 500B from the transistor 500 are mainly described.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting diffusion of oxygen, the range of choices for the material of the conductor 560b can be extended. That is, the conductor 560a inhibits oxidation of the conductor 560b, thereby preventing the decrease in conductivity.

The insulator 544 is preferably provided to cover the top surface and a side surface of the conductor 560 and a side surface of the insulator 545. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping part of the conductor 542a and part of the conductor 542b, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described in this embodiment can be used in combination as appropriate with the compositions, structures, methods, and the like described in the other embodiments, the example, and the like.

Embodiment 3

In this embodiment, an oxide semiconductor which is a kind of metal oxides is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor is described with reference to FIG. 30A. FIG. 30A is a diagram showing classification of crystal structures of an oxide semiconductor, typically IGZO (a metal oxide containing In, Ga, and Zn).

As shown in FIG. 30A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 30A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. Here, FIG. 30B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 30B and obtained by GIXD measurement is hereinafter simply referred to as an XRD spectrum. The CAAC-IGZO film in FIG. 30B has a composition in the vicinity of In:Ga:Zn=4:2:3 [atomic ratio]. The CAAC-IGZO film in FIG. 30B has a thickness of 500 nm.

As shown in FIG. 30B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 30B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 30C shows a diffraction pattern of the CAAC-IGZO film. FIG. 30C shows a diffraction pattern obtained with the NBED method in which an electron beam is incident in the direction parallel to the substrate. The CAAC-IGZO film in FIG. 30C has a composition in the vicinity of In:Ga:Zn=4:2:3 [atomic ratio]. In the nanobeam electron diffraction method, electron diffraction is performed with a probe diameter of 1 nm.

As shown in FIG. 30C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 30A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), a high field-effect mobility ($\mu$), and favorable switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The composition, structure, method, and the like described in this embodiment can be used in combination as appropriate with the compositions, structures, methods, and the like described in the other embodiments, the example, and the like.

Embodiment 4

In this embodiment, application examples of the above-described semiconductor device are described.

[Semiconductor Wafer and Chip]

Figure 31A:
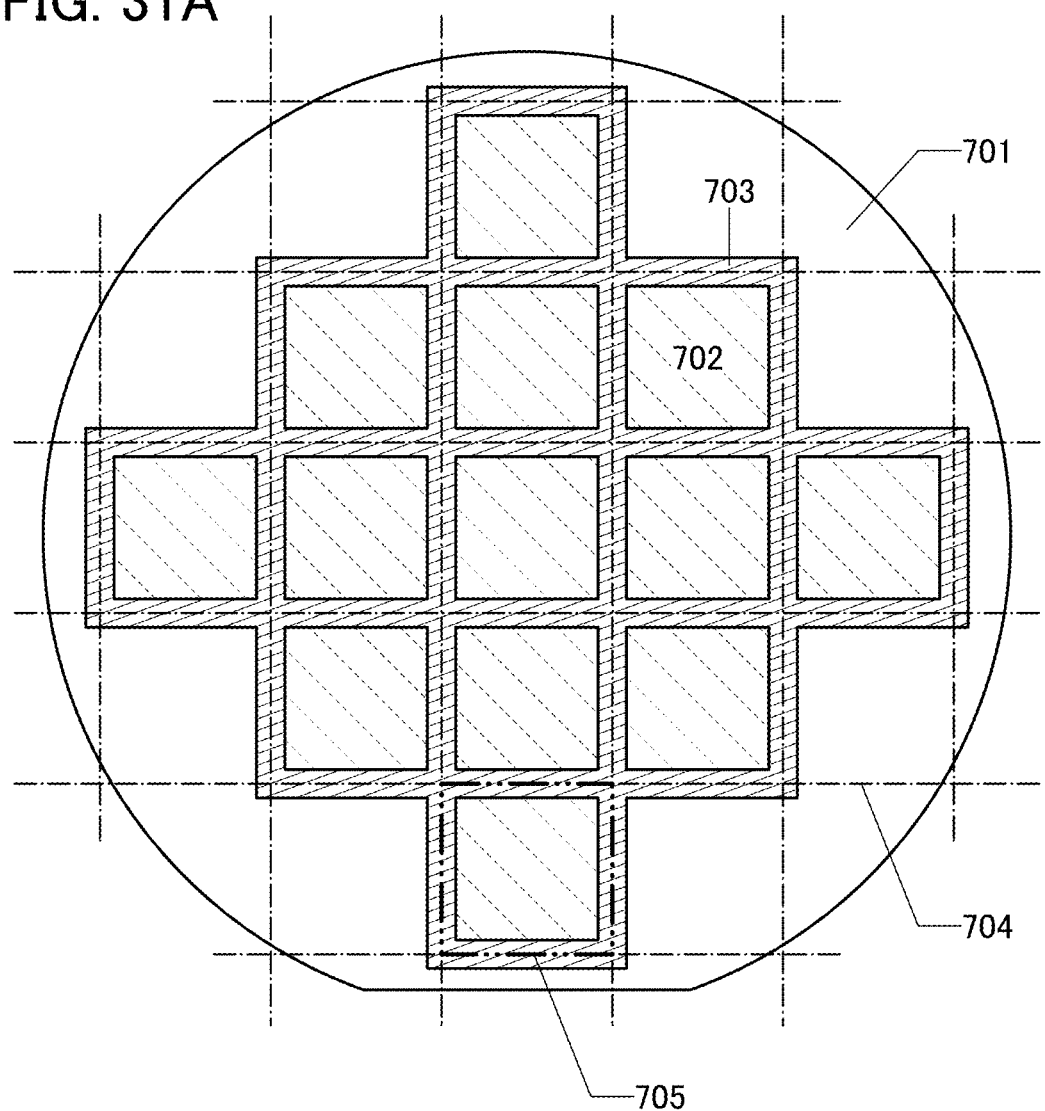
FIG. 31A is a top view of a semiconductor wafer.

FIG. 31A is a top view of a substrate 701 before dicing treatment. As the substrate 701, a semiconductor substrate (also referred to as a "semiconductor wafer") can be used, for example. A plurality of circuit regions 702 are provided over the substrate 701. A semiconductor device of one embodiment of the present invention, a CPU, an RF tag, an image sensor, or the like can be provided in the circuit region 702.

Figure 31B:
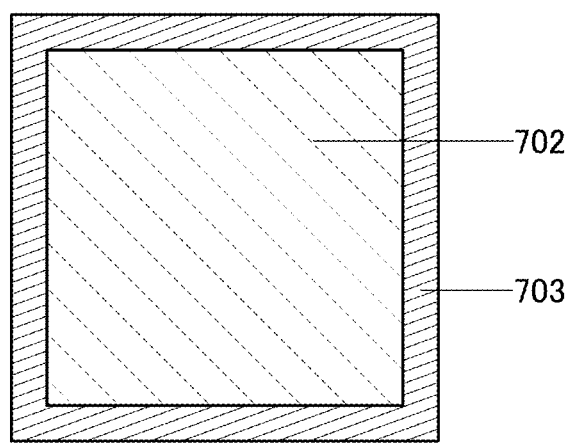
FIG. 31B is a top view of a chip.

The plurality of circuit regions 702 are each surrounded by a separation region 703. Separation lines (also referred to as "dicing lines") 704 are set at a position overlapping with the separation regions 703. Chips 705 each including the circuit region 702 can be cut from the substrate 701 by cutting the substrate 701 along the separation lines 704. FIG. 31B is an enlarged view of the chip 705.

A conductive layer or a semiconductor layer may be provided in the separation regions 703. Providing a conductive layer or a semiconductor layer in the separation regions 703 relieves ESD that might be caused in a dicing step, preventing a decrease in the yield in the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 703 allows a reduction in the usage of the pure water. Therefore, the cost of manufacturing the semiconductor device can be reduced. Moreover, the semiconductor device can be manufactured with improved productivity.

For a semiconductor layer provided in the separation regions 703, a material having a band gap of 2.5 eV or more and 4.2 eV or less, preferably 2.7 eV or more and 3.5 eV or less is preferably used. The use of such a material allows accumulated electric charge to be released slowly; thus, the rapid move of electric charge due to ESD can be inhibited and electrostatic breakdown is less likely to occur.

[Electronic Component]

Figure 32A:
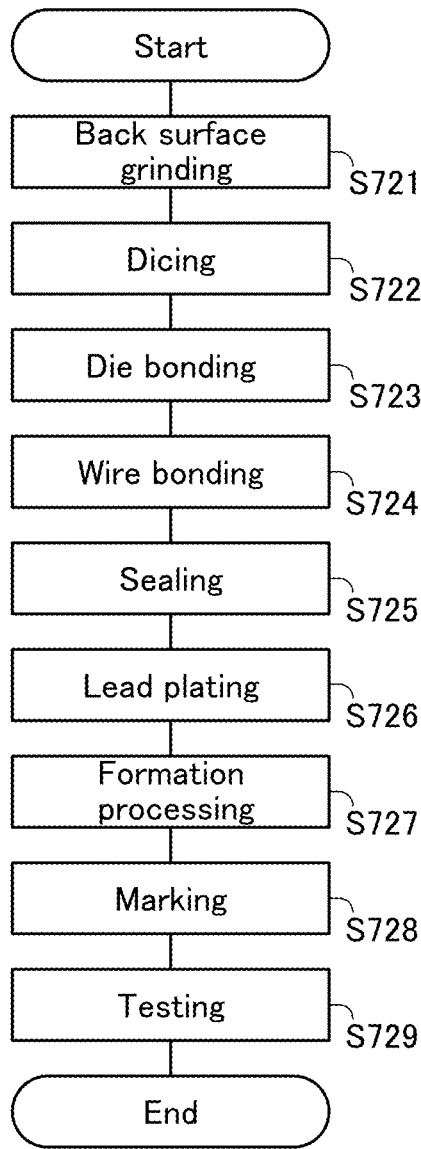
FIG. 32A is a flow chart showing an example of a process for manufacturing an electronic component.

An example where the chip 705 is used in an electronic component is described with reference to FIG. 32A and FIG. 32B. Note that an electronic component is also referred to as a semiconductor package or an IC package. For electronic components, there are various standards and names corresponding to a terminal extraction direction and a terminal shape.

An electronic component is completed by combining the semiconductor device described in any of the above embodiments and components other than the semiconductor device in an assembly process (post-process).

The post-process is described with reference to a flowchart shown in FIG. 32A. After an element substrate including the semiconductor device described in any of the above embodiments is completed in a pre-process, a "back surface grinding step" is performed to grind a back surface (a surface where the semiconductor device and the like are not formed) of the element substrate (Step S721). When the element substrate is thinned by grinding, warpage or the like of the element substrate is reduced, resulting in the reduction in size of the electronic component.

Next, a "dicing step" is performed to divide the element substrate into a plurality of chips (the chips 705) (Step S722). Then, a "die bonding step" is performed to pick up the divided chips separately and bond them onto a lead frame (Step S723). To bond a chip and a lead frame in the die bonding step, resin bonding, tape-automated bonding, or the like is selected as appropriate depending on products. Note that the chip may be bonded to an interposer substrate instead of the lead frame.

Next, a "wire bonding step" is performed to electrically connect a lead of the lead frame and an electrode on the chip through a metal fine line (wire) (Step S724). A silver line or a gold line can be used as the metal fine line. Furthermore, ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, a "lead plating step" is performed to plate the lead of the lead frame (Step S726). With the plating process, rust of the lead can be prevented, and soldering for mounting the electronic component on a printed circuit board in a later step can be performed more surely. Then, a "formation step" is performed to cut and process the lead (Step S727).

Next, a "marking step" in which printing (marking) is performed on a surface of the package is conducted (Step S728). After a "testing step" (Step S729) for checking whether an external shape is good and whether there is a malfunction, for example, the electronic component is completed.

Figure 32B:
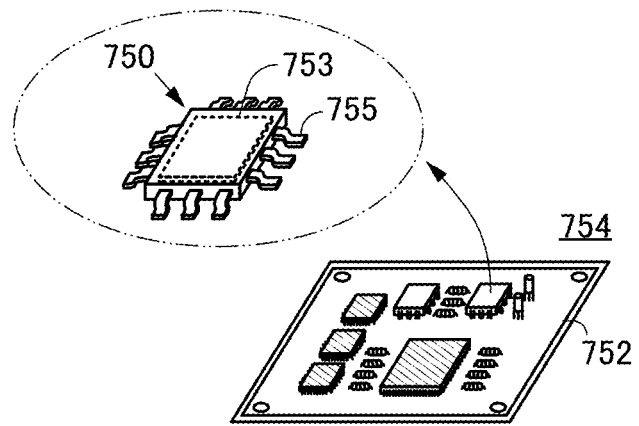
FIG. 32B is a schematic perspective view of an electronic component.

FIG. 32B is a schematic perspective view of the completed electronic component. FIG. 32B is a schematic perspective view of a QFP (Quad Flat Package) as an example of the electronic component. An electronic component 750 illustrated in FIG. 32B includes a lead 755 and a semiconductor device 753. As the semiconductor device 753, the semiconductor device described in any of the above embodiments can be used, for instance.

The electronic component 750 illustrated in FIG. 32B is, for example, mounted on a printed circuit board 752. A plurality of such electronic components 750 are combined and electrically connected to each other on the printed circuit board 752; thus, a board on which the electronic components are mounted (a circuit board 754) is completed. The completed circuit board 754 is used for an electronic device or the like.

[Electronic Device]

Next, examples of electronic devices each including the semiconductor device of one embodiment of the present invention or the above-described electronic component are described with reference to FIG. 33.

Examples of electronic devices including the semiconductor device of one embodiment of the present invention or the electronic component include display devices of televisions, monitors, and the like, lighting devices, desktop or laptop personal computers, word processors, image reproduction devices which reproduce still images or moving images stored in recording media such as DVDs (Digital Versatile Discs), portable CD players, radios, tape recorders, headphone stereos, stereos, table clocks, wall clocks, cordless phone handsets, transceivers, cellular phones, car phones, portable game machines, tablet terminals, large game machines such as pachinko machines, calculators, portable information terminals (also referred to as "mobile information terminals"), electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Other examples include industrial equipment such as guide lights, traffic lights, conveyor belts, elevators, escalators, industrial robots, power storage systems, and power storage devices for leveling power supply and smart grid.

In addition, moving objects and the like driven by electric motors using power from power storage devices are also included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats or ships, submarines, helicopters, aircraft, rockets, artificial satellites, space probes, planetary probes, and spacecraft.

The semiconductor device of one embodiment of the present invention or the electronic component can be used for communication devices in any of the electronic devices.

The electronic device may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, flow rate, humidity, gradient, vibration, a smell, or infrared rays) and the like.

The electronic device can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 33:
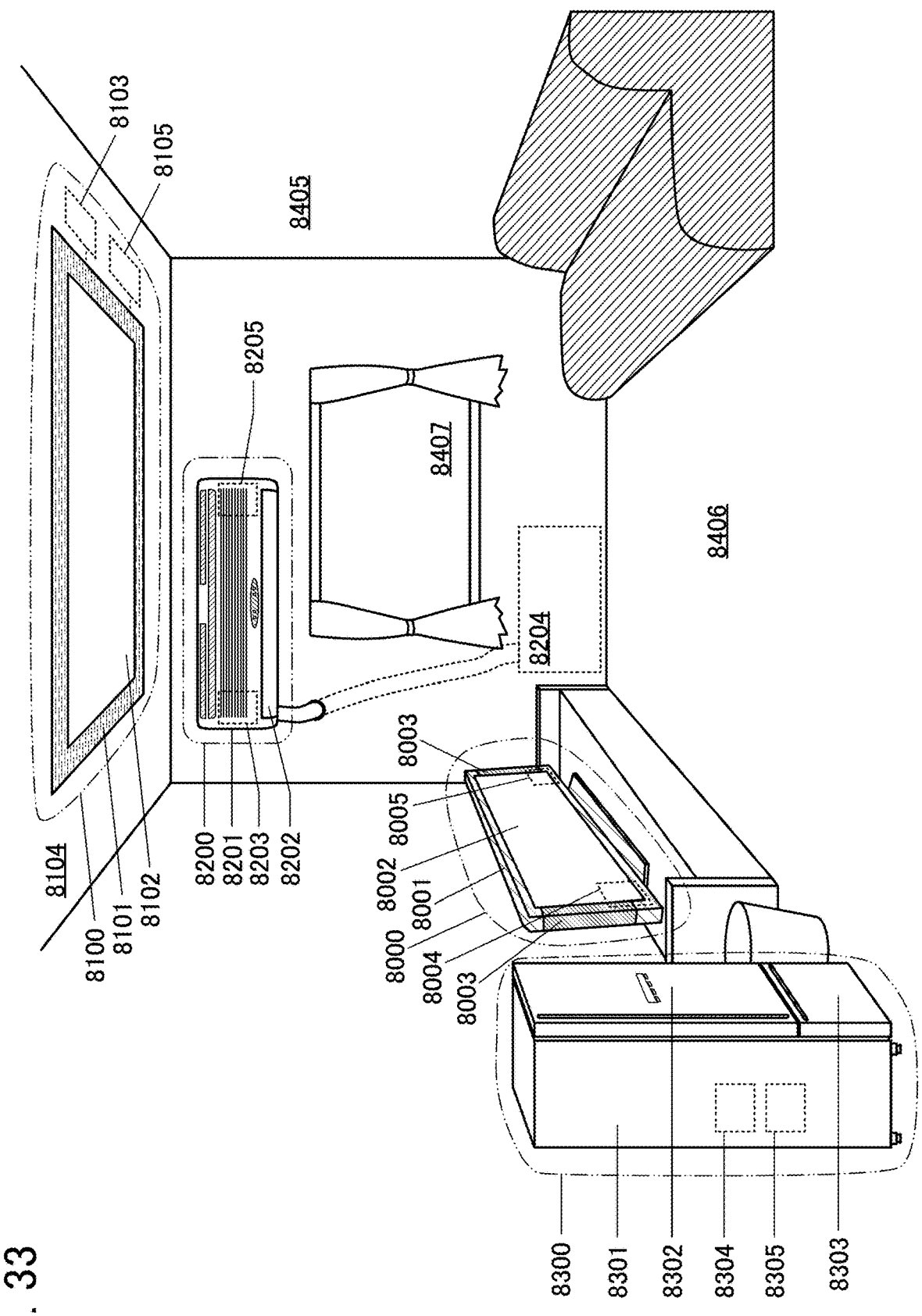
FIG. 33 is a diagram illustrating examples of electronic devices.

FIG. 33 and FIG. 34A to FIG. 34F illustrate examples of electronic devices. In FIG. 33, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 of one embodiment of the present invention is provided in the housing 8001. The semiconductor device 8004 can hold control data, a control program, or the like. The semiconductor device 8004 has a communication function, and the display device 8000 can function as an IoT device. The display device 8000 can receive power from a commercial power supply. Alternatively, the display device 8000 can use power stored in the power storage device 8005.

The display portion 8002 can include a display device such as a liquid crystal display device, a light-emitting display device in which a light-emitting element, e.g., an organic EL element, is provided in each pixel, an electrophoretic display device, a DMD (Digital Micromirror Device), a PDP (Plasma Display Panel), or an FED (Field Emission Display).

Note that the display device includes, in its category, all of information display devices for personal computers, advertisement display, and the like besides for TV broadcast reception.

In FIG. 33, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although FIG. 33 illustrates an example of the case where the semiconductor device 8103 is provided in a ceiling 8104 on which the housing 8101 and the light source 8102 are installed, the semiconductor device 8103 may be provided in the housing 8101. The semiconductor device 8103 can hold data such as emission luminance of the light source 8102, a control program, or the like. The semiconductor device 8103 has a communication function, and the lighting device 8100 can function as an IoT device. The lighting device 8100 can receive power from a commercial power supply. Alternatively, the lighting device 8100 can use power stored in the power storage device.

Note that although FIG. 33 illustrates the installation lighting device 8100 provided in the ceiling 8104 as an example, the semiconductor device of one embodiment of the present invention can be used in an installation lighting device provided in, for example, a wall 8405, a floor 8406, a window 8407, or the like other than the ceiling 8104. Alternatively, the semiconductor device of one embodiment of the present invention can be used in a tabletop lighting device or the like.

As the light source 8102, an artificial light source that emits light artificially by using power can be used. Specific examples of the artificial light source include an incandescent lamp, a discharge lamp such as a fluorescent lamp, and light-emitting elements such as an LED and an organic EL element.

In FIG. 33, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, a power storage device 8205, and the like. Although FIG. 33 illustrates an example of the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can hold control data, a control program, or the like of the air conditioner. The semiconductor device 8203 has a communication function, and the air conditioner can function as an IoT device. The air conditioner can receive power from a commercial power supply. Alternatively, the air conditioner can use power stored in the power storage device 8205.

Note that although FIG. 33 illustrates the split-type air conditioner including the indoor unit and the outdoor unit as an example, the semiconductor device of one embodiment of the present invention can be used in an air conditioner in which the functions of an indoor unit and an outdoor unit are integrated in one housing.

In FIG. 33, an electric refrigerator-freezer 8300 is an example of an electronic device including a semiconductor device 8304 of one embodiment of the present invention. Specifically, the electric refrigerator-freezer 8300 includes a housing 8301, a refrigerator door 8302, a freezer door 8303, the semiconductor device 8304, a power storage device 8305, and the like. The power storage device 8305 is provided in the housing 8301 in FIG. 33. The semiconductor device 8304 can hold control data, a control program, or the like of the electric refrigerator-freezer 8300. The semiconductor device 8304 has a communication function, and the electric refrigerator-freezer 8300 can function as an IoT device. The electric refrigerator-freezer 8300 can receive power from a commercial power supply. Alternatively, the electric refrigerator-freezer 8300 can use power stored in the power storage device 8305.

Figure 34A:
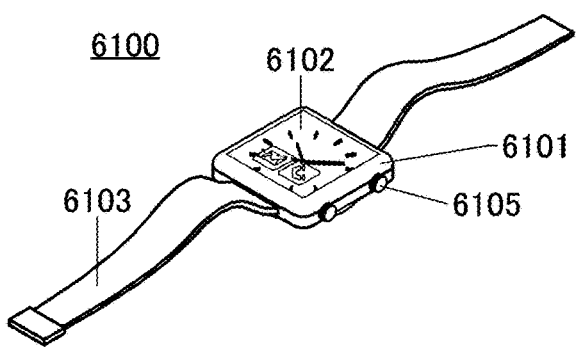
FIG. 34A to FIG. 34F are diagrams illustrating examples of electronic devices.

FIG. 34A illustrates an example of a wrist-watch-type mobile information terminal. A mobile information terminal 6100 includes a housing 6101, a display portion 6102, a band 6103, operation buttons 6105, and the like. The mobile information terminal 6100 further includes a secondary battery and the semiconductor device of one embodiment of the present invention or the electronic component. The mobile information terminal 6100 including the semiconductor device of one embodiment of the present invention or the electronic component can function as an IoT device.

Figure 34B:
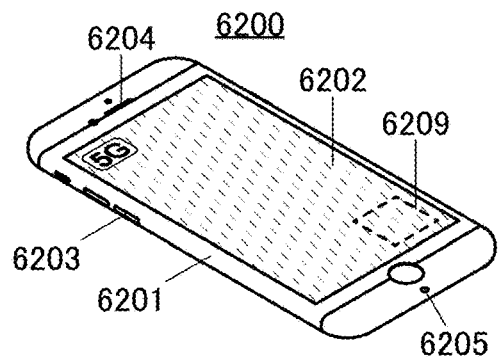

FIG. 34B illustrates an example of a cellular phone. A mobile information terminal 6200 includes a display portion 6202 incorporated in a housing 6201, operation buttons 6203, a speaker 6204, a microphone 6205, and the like.

The mobile information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The mobile information terminal 6200 further includes a secondary battery and the semiconductor device of one embodiment of the present invention or the electronic component. The mobile information terminal 6200 including the semiconductor device of one embodiment of the present invention or the electronic component can function as an IoT device.

Figure 34C:
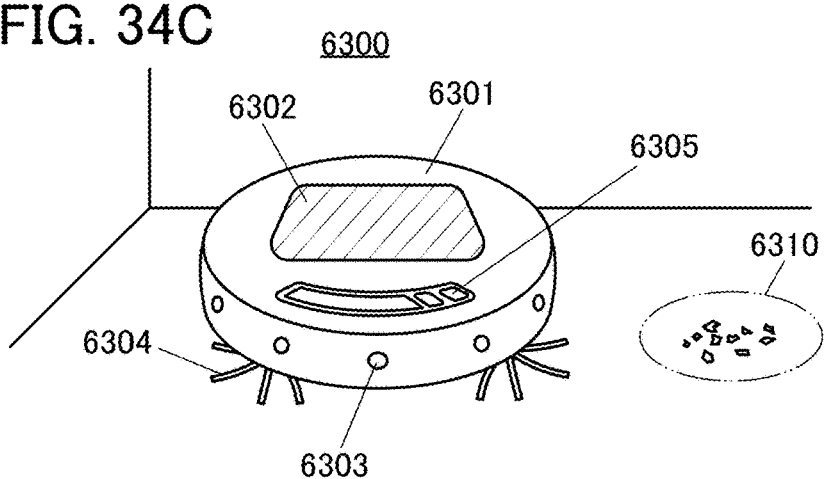

FIG. 34C illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although not illustrated, the cleaning robot 6300 is provided with a tire, an inlet, and the like. The cleaning robot 6300 can run autonomously, detect dust 6310, and vacuum the dust through the inlet provided on a bottom surface.

For example, the cleaning robot 6300 can analyze images taken by the cameras 6303 to judge whether there are obstacles such as a wall, furniture, or a step. When an object that is likely to be caught in the brush 6304, such as a wire, is detected by image analysis, the rotation of the brush 6304 can be stopped. The cleaning robot 6300 includes a secondary battery and the semiconductor device of one embodiment of the present invention or the electronic component. The cleaning robot 6300 including the semiconductor device of one embodiment of the present invention or the electronic component can function as an IoT device.

Figure 34D:
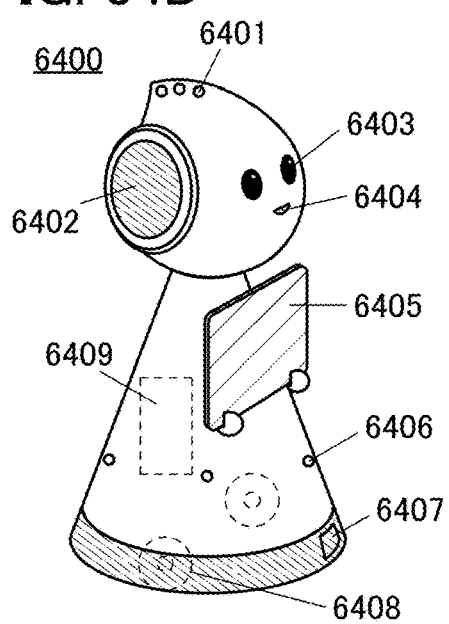

FIG. 34D illustrates an example of a robot. A robot 6400 illustrated in FIG. 34D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user with the use of the microphone 6402 and the speaker 6404.

The display portion 6405 has a function of displaying various kinds of information. The robot 6400 can display user's desired information on the display portion 6405. A touch panel may be incorporated in the display portion 6405. Moreover, the display portion 6405 may be a detachable information terminal, in which case charging and data communication can be performed when the display portion 6405 is set at the home position of the robot 6400.

The upper camera 6403 and the lower camera 6406 each have a function of taking an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407. The light-emitting device of one embodiment of the present invention can be used for the display portion 6405.

The robot 6400 includes a secondary battery and the semiconductor device of one embodiment of the present invention or the electronic component. The robot 6400 including the semiconductor device of one embodiment of the present invention or the electronic component can function as an IoT device.

Figure 34E:
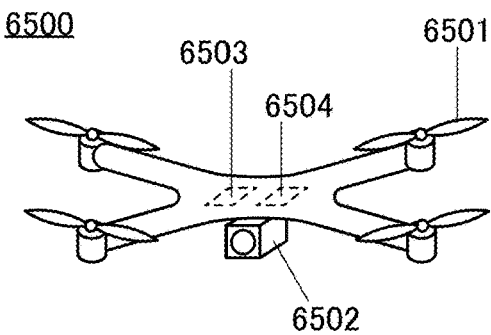

FIG. 34E illustrates an example of a flying object. A flying object 6500 illustrated in FIG. 34E includes propellers 6501, a camera 6502, a battery 6503, and the like and has a function of flying autonomously.

For example, image data taken by the camera 6502 is stored in an electronic component 6504. The electronic component 6504 can analyze the image data to detect whether there are obstacles when the flying object moves. Moreover, the electronic component 6504 can estimate the remaining battery level from a change in the power storage capacity of the battery 6503. The flying object 6500 includes the semiconductor device of one embodiment of the present invention or the electronic component. The flying object 6500 including the semiconductor device of one embodiment of the present invention or the electronic component can function as an IoT device.

Figure 34F:
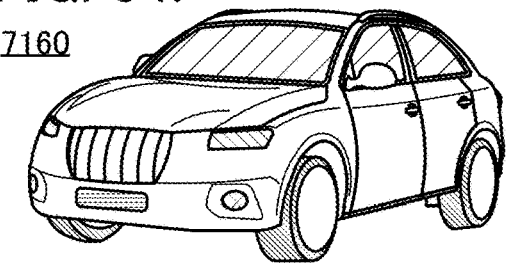

FIG. 34F illustrates an example of an automobile. An automobile 7160 includes an engine, tires, a brake, a steering gear, a camera, and the like. The automobile 7160 includes the semiconductor device of one embodiment of the present invention or the electronic component. The automobile 7160 including the semiconductor device of one embodiment of the present invention or the electronic component can function as an IoT device.

The composition, structure, method, and the like described in this example can be used in combination as appropriate with the compositions, structures, methods, and the like described in the other embodiments, the example, and the like.

Example 1

In this example, an example is described in which an acceleration sensor is used as the sensor element of one embodiment of the present invention, a semiconductor device including the sensor element is mounted on a housing including a fan, and vibration is examined.

Figure 35:
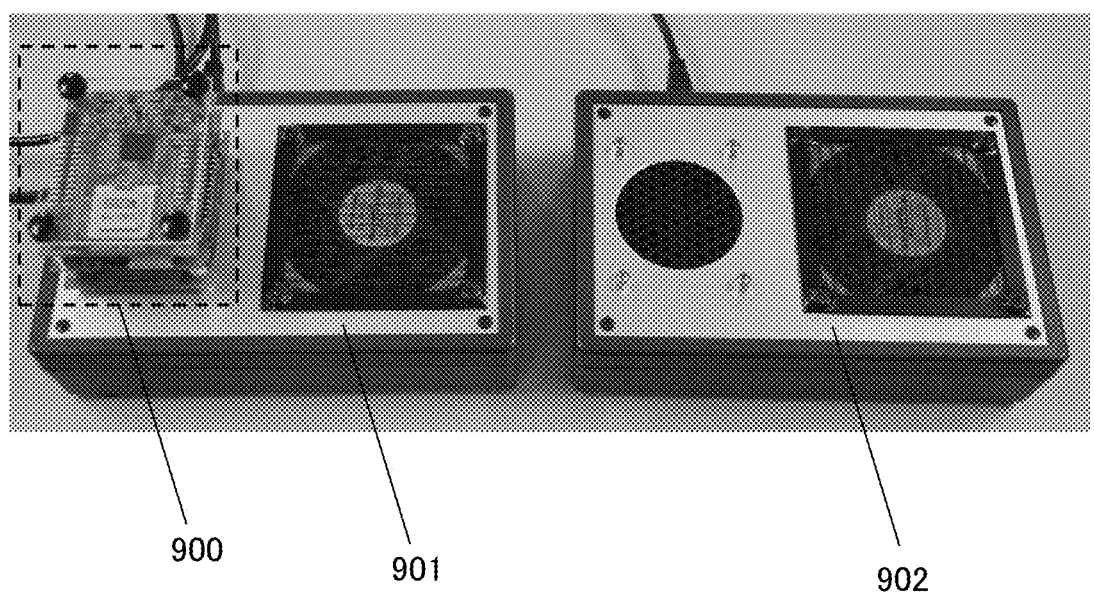
FIG. 35 is a photograph of a semiconductor device and a plurality of housings.

As a structure used for examination in this example, FIG. 35 is a photograph showing a semiconductor device 900, a housing 901, and a housing 902. The housing 901 and the housing 902 each incorporate a fan.

A sensor circuit 903 and a processing unit 904 are mounted on the semiconductor device 900 shown in FIG. 35. As the sensor circuit, ADXL362 produced by Analog Devices, Inc. was used. ADXL362 is a circuit including a MEMS acceleration sensor. In addition, ADXL362 includes a 12-bit analog-digital converter circuit. A waveform sensed by the acceleration sensor is processed by the analog-digital converter circuit or the like of the sensor circuit and then supplied to the processing unit 904.

A battery is mounted on the semiconductor device 900. The semiconductor device 900 can transmit and receive a signal wirelessly to and from a personal computer via Bluetooth (registered trademark).

Figure 36A:
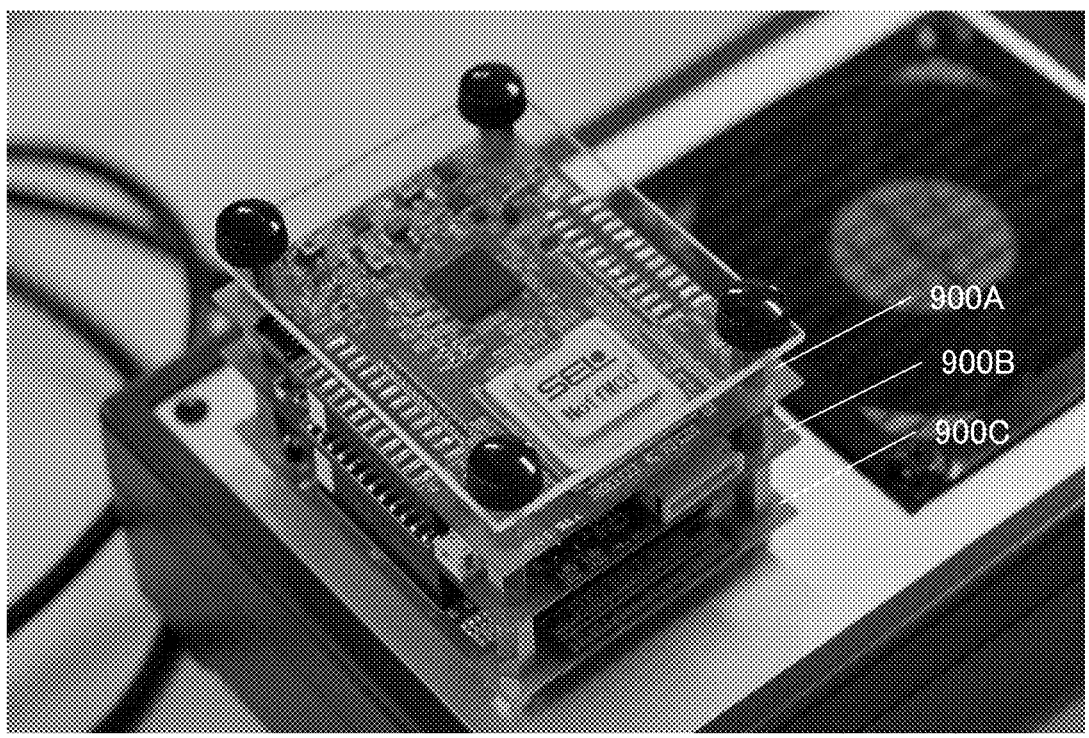
FIG. 36A is a photograph of the semiconductor device.

FIG. 36A is an enlarged photograph of the semiconductor device 900 shown in FIG. 35. The semiconductor device 900 includes a first block 900A, a second block 900B, and a third block 900C.

Figure 36B:
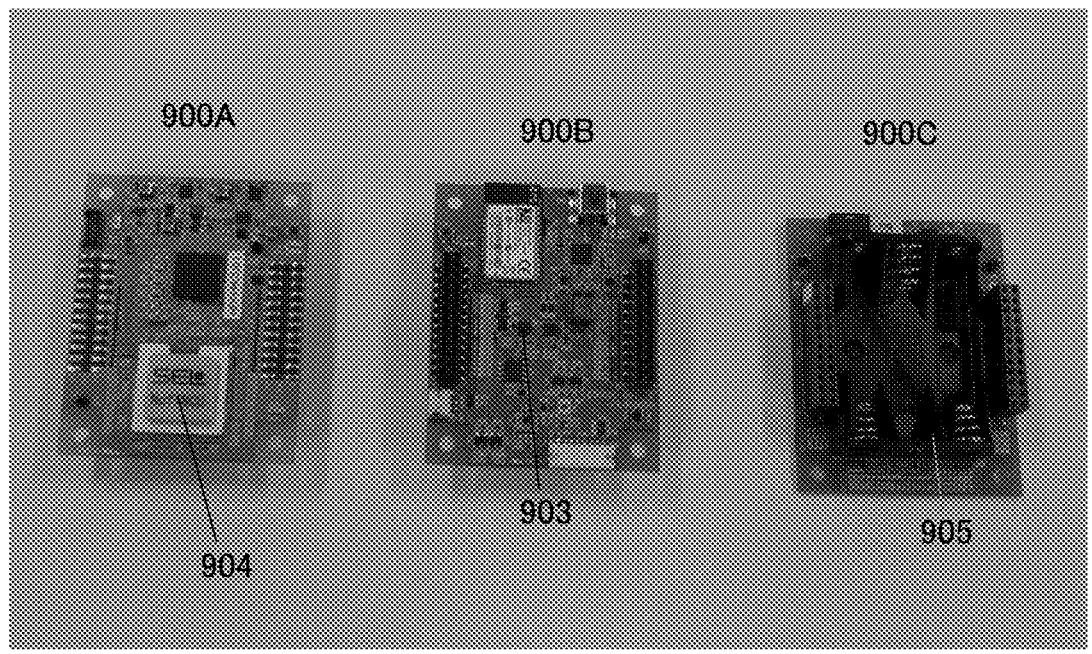
FIG. 36B is a photograph of the semiconductor device.

FIG. 36B is a photograph showing the appearance of the first block 900A to the third block 900C. The first block 900A includes the processing unit 904. The second block 900B includes the sensor circuit 903. The third block 900C includes a socket 905 for installing a battery.

As objects, the housing 901 incorporating a first fan and the housing 902 incorporating a second fan were used. The first fan and the second fan each include a plurality of blades radiating from a rotational axle. Rotational vibration of the second fan is known to be larger than that of the first fan. The housings including fans having different magnitudes of vibration were examined using the semiconductor device. A battery was installed for the socket 905.

Figure 37A:
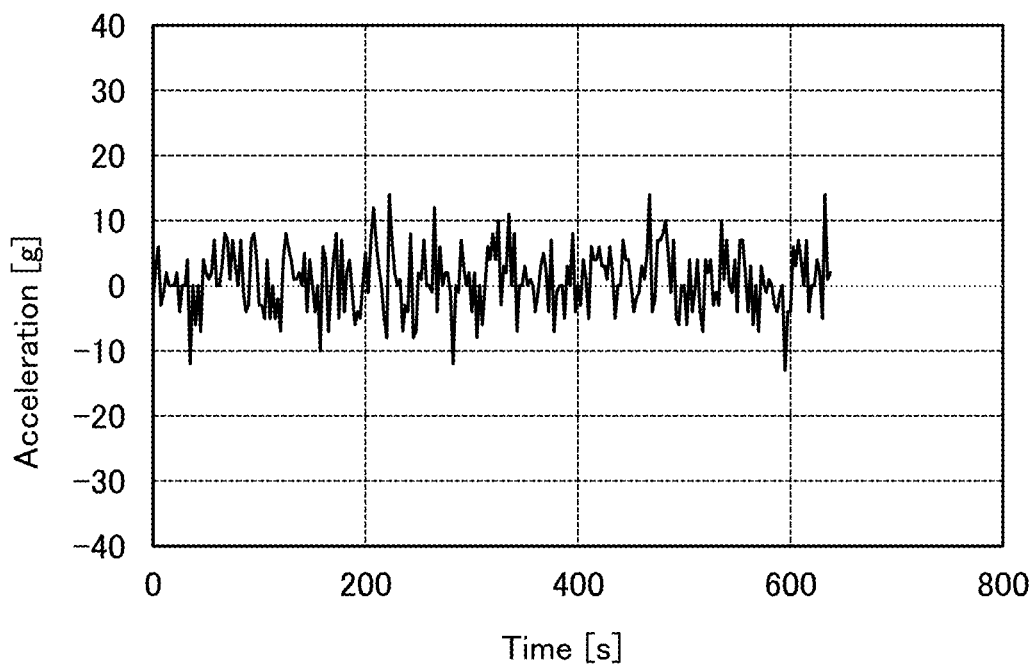
FIG. 37A shows an acceleration measurement result.
Figure 37B:
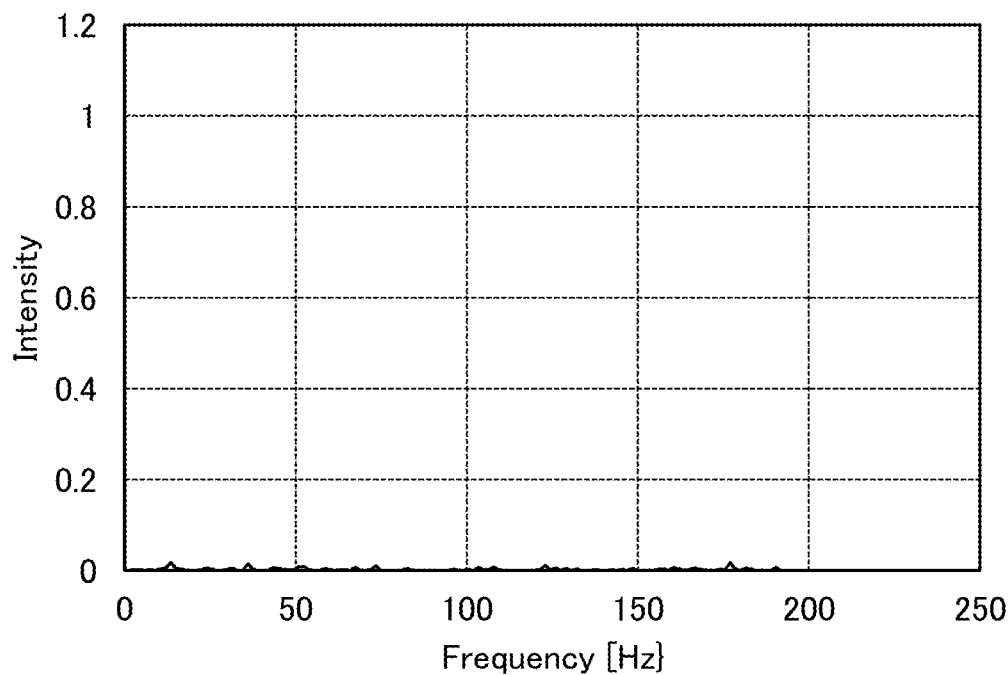
FIG. 37B shows a result of fast Fourier transform.

First, FIG. 37A shows a waveform of a signal that was sensed by the acceleration sensor and processed by the sensor circuit in a state where the semiconductor device 900 was put on the housing 901. In the graph in FIG. 37A, the horizontal axis represents time and the vertical axis represents acceleration. FIG. 37B is obtained by fast Fourier transform of the waveform shown in FIG. 37A. In FIG. 37B, the horizontal axis represents frequency and the vertical axis represents intensity.

Figure 38A:
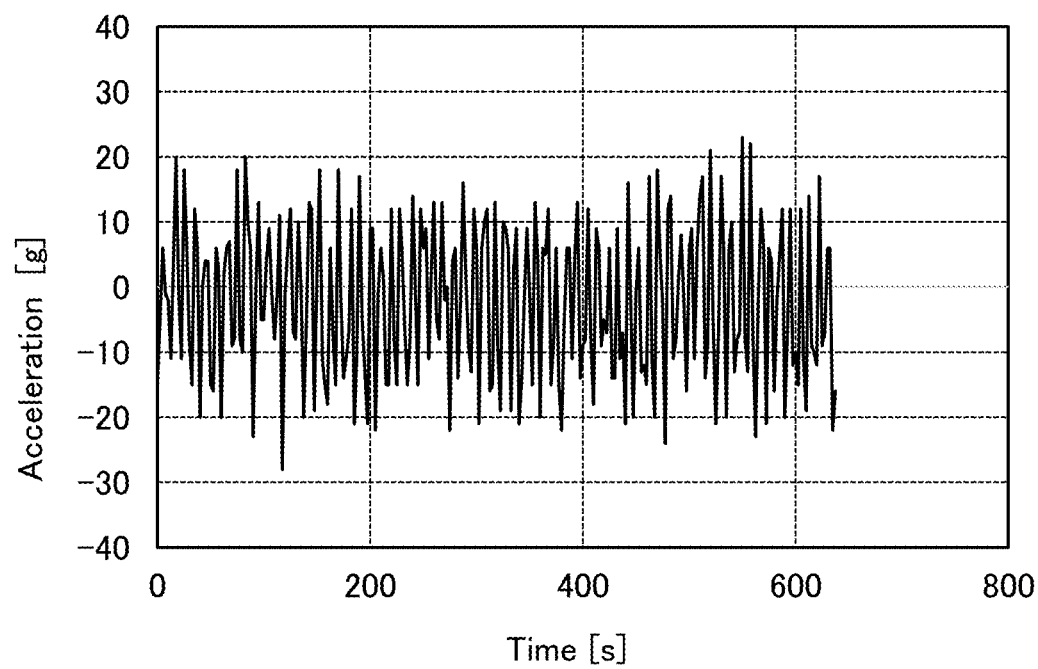
FIG. 38A shows an acceleration measurement result.
Figure 38B:
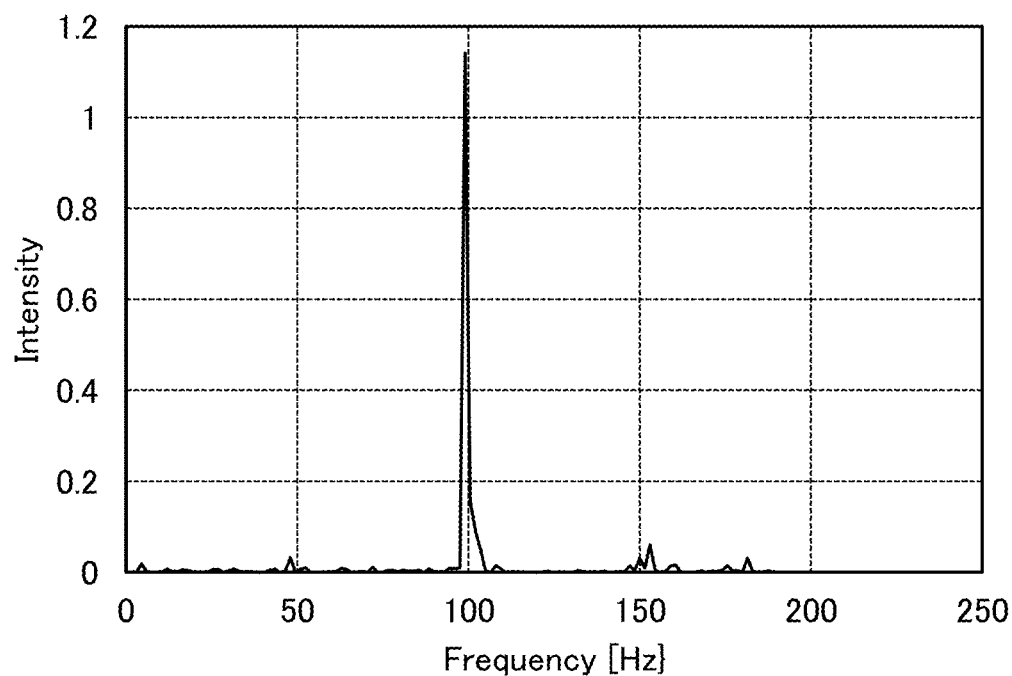
FIG. 38B shows a result of fast Fourier transform.

Next, FIG. 38A shows a waveform of a signal that was sensed by the acceleration sensor and processed by the sensor circuit in a state where the semiconductor device 900 was put on the second fan. In the graph in FIG. 38A, the horizontal axis represents time and the vertical axis represents acceleration. FIG. 38B is obtained by fast Fourier transform of the waveform shown in FIG. 38A. In FIG. 38B, the horizontal axis represents frequency and the vertical axis represents intensity.

In this example, one semiconductor device was put on the two fans in turn and examination was performed for simplicity; however, with two semiconductor devices, each semiconductor device can be put on the individual fan.

It was found that the amplitude intensity was higher in FIG. 38A than in FIG. 37A. For example, in the case where a normal range is set from −10 [g] to +10 [g] inclusive and a region out of this range is determined to be abnormal, the state of the second fan is determined to be abnormal. In FIG. 38B, a feature of having a large peak at around 100 Hz is observed, which can be assumed to be abnormal. Analysis of a feature of a waveform after fast Fourier transform allows the state of the fan to be assumed.

REFERENCE NUMERALS

ACTV: activation function circuit, BKC1: circuit, BKC2: circuit, BKC10: circuit, BKC20: circuit, C1: capacitor, C3: capacitor, C6: capacitor, C11: capacitor, C21: capacitor, CB1: capacitor, CB2: capacitor, CB11: capacitor, CB12: capacitor, CE: signal, CLD: circuit, CLKM: reference clock signal, CLK: clock signal, CM: current mirror circuit, CS: current source circuit, D: data signal, DB: data signal, FN1: node, FN2: node, GCLK2: clock signal, INT: signal, INV11: inverter circuit, INV12: inverter circuit, M1: transistor, M2: transistor, M3: transistor, M4: transistor, M5: transistor, M6: transistor, M11: transistor, M12: transistor, MA1: transistor, MAC: semiconductor device, MC: memory cell, MCref: memory cell, MC1: transistor, MC2: transistor, MemC1: circuit, MemC2: circuit, MR1: transistor, MW1: transistor, MW11: transistor, MW2: transistor, MW12: transistor, Na: node, Nb: node, NB1: node, ND: node, NET1: node, NET2: node, NK1: node, NM: node, NMref: node, NP: node, NPref: node, NR1: node, OC: circuit, OFST: offset circuit, OSC: signal, OSG: signal, OSR: signal, OSS: signal, RESET: signal, PCC10: circuit, PSE5: signal, PSE6: signal, R1: resistor, RTC10: circuit, SLC: signal, SLP: signal, SMC20: circuit, SN1: node, SN2: node, SN3: node, Tr11: transistor, Tr12: transistor, Tr21: transistor, Tr22: transistor, Tr23: transistor, WDD: circuit, WLD: circuit, WE: signal, 10: power supply circuit, 11: memory cell, 15: memory cell, 16: memory cell, 20: PU, 21: PU, 30: processor core, 31: storage circuit, 32: circuit, 35: power supply line, 40: cache, 41: memory array, 42: peripheral circuit, 43: control circuit, 45: memory cell, 60: PMU, 61: circuit, 65: clock control circuit, 70: PSW, 71: PSW, 80: terminal, 81: terminal, 82: terminal, 83: terminal, 90: terminal, 91: terminal, 92: terminal, 93: terminal, 93a: terminal, 93b: terminal, 94: terminal, 100: storage circuit, 110: FF, 120: memory cell, 121: buffer circuit, 122: transistor, 123: capacitor, 130: processor core, 131: control device, 132: program counter, 133: pipeline register, 134: pipeline register, 135: register file, 136: ALU, 137: data bus, 202: cache memory device, 203: cache memory device, 240: NOSRAM, 242: power domain, 243: power domain, 245: power switch, 247: power switch, 250: memory cell array, 251: control circuit, 252: row circuit, 253: column circuit, 301: sensor circuit, 301a: sensor circuit, 301b: sensor circuit, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 351: DOSRAM, 352: insulator, 354: insulator, 356: conductor, 360: insulator, 361: memory cell array, 362: insulator, 364: insulator, 365: peripheral circuit, 366: conductor, 370: insulator, 371: power switch, 372: insulator, 373: power switch, 374: insulator, 376: conductor, 380: insulator, 382: insulator, 384: insulator, 386: conductor, 401: antenna, 402: communication circuit, 404: insulator, 500: transistor, 500A: transistor, 500B: transistor, 503: conductor, 503a: conductor, 503b: conductor, 510: insulator, 512: insulator, 513: insulator, 514: insulator, 516: insulator, 518: conductor, 520: insulator, 522: insulator, 524: insulator, 530: oxide, 530a: oxide, 530b: oxide, 540a: conductor, 540b: conductor, 542: conductor, 542a: conductor, 542b: conductor, 543a: region, 543b: region, 544: insulator, 545: insulator, 546: conductor, 548: conductor, 550: transistor, 552: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 700: semiconductor device, 701: substrate, 702: circuit region, 703: separation region, 704: separation line, 705: chip, 710: sensor element, 710c: sensor element, 710d: sensor element, 711: sensing portion, 711a: sensing portion, 711b: sensing portion, 712: judgment circuit, 712a: judgment circuit, 712b: judgment circuit, 713: analog-digital converter circuit, 713a: analog-digital converter circuit, 713b: analog-digital converter circuit, 714: sample-and-hold circuit, 714A: sample-and-hold circuit, 714B: sample-and-hold circuit, 714c: sample-and-hold circuit, 714C: sample-and-hold circuit, 714d: sample-and-hold circuit, 715: memory, 717: control device, 750: electronic component, 752: printed circuit board, 753: semiconductor device, 754: circuit board, 755: lead, 799: object, 900: semiconductor device, 900A: block, 900B: block, 900C: block, 901: housing, 902: housing, 903: sensor circuit, 904: processing device, 905: socket, 6100: portable information terminal, 6101: housing, 6102: display portion, 6103: band, 6105: operation button, 6200: portable information terminal, 6201: housing, 6202: display portion, 6203: operation button, 6204: speaker, 6205: microphone, 6209: fingerprint sensor, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408:

moving mechanism, 6409: arithmetic device, 6500: flying object, 6501: propeller, 6502: camera, 6503: battery, 6504: electronic component, 7160: automobile, 8000: display device, 8001: housing, 8002: display portion, 8003: speaker portion, 8004: semiconductor device, 8005: power storage device, 8100: lighting device, 8101: housing, 8102: light source, 8103: semiconductor device, 8104: ceiling, 8105: power storage device, 8200: indoor unit, 8201: housing, 8202: air outlet, 8203: semiconductor device, 8204: outdoor unit, 8205: power storage device, 8300: electric refrigerator-freezer, 8301: housing, 8302: refrigerator door, 8303: freezer door, 8304: semiconductor device, 8305: power storage device, 8405: wall, 8406: floor, 8407: window.

The invention claimed is:

1. A semiconductor device comprising:
a sensor circuit; and
a processing unit comprising a power management unit and an arithmetic processing circuit,
wherein the sensor circuit comprises a sensor element, a judgement circuit, and a memory,
wherein the power management unit is configured to control power supply to the arithmetic processing circuit,
wherein the arithmetic processing circuit comprises a first circuit comprising a first storage circuit and a second circuit comprising a second storage circuit,
wherein the first circuit is configured to retain first data in the first storage circuit during a period where power is supplied to the arithmetic processing circuit,
wherein the second circuit is configured to read out the first data retained in the first storage circuit and write the first data to the second storage circuit during the period where power is supplied to the arithmetic processing circuit,
wherein the second circuit is configured to retain the first data in the second storage circuit during a period where power supply to the arithmetic processing circuit is stopped,
wherein the sensor element is configured to sense a signal indicating a state of an object,
wherein the judgement circuit is configured to judge a sensed signal of the sensor element by comparing the sensed signal with reference data stored in the memory and supply an interrupt signal to the processing unit in accordance with a judgment result, and
wherein the power management unit is configured to restart power supply to the arithmetic processing circuit in accordance with the interrupt signal.

2. The semiconductor device according to claim 1,
wherein the second circuit is configured to read out the first data from the second storage circuit and supply the first data to the first storage circuit after power supply to the arithmetic processing circuit restarts.

3. The semiconductor device according to claim 1, further comprising:
an antenna; and
a secondary battery,
wherein the power management unit is configured to supply power to the arithmetic processing circuit from the secondary battery, and
wherein the processing unit further comprises a communication circuit electrically connected to the antenna.

4. The semiconductor device according to claim 1,
wherein the sensor element is configured to measure one or more selected from force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, vibration, odor, and infrared rays.

5. The semiconductor device according to claim 1,
wherein the object is configured to be controlled in accordance with a control signal supplied from the processing unit when the judgement circuit judges that the sensor element senses an abnormal signal regarding the object.

6. A semiconductor device comprising:
a sensor circuit; and
a processing unit comprising a power management unit and an arithmetic processing circuit,
wherein the sensor circuit comprises an acceleration sensor, a judgement circuit, and a memory,
wherein the power management unit is configured to control power supply to the arithmetic processing circuit,
wherein the arithmetic processing circuit comprises a first circuit comprising a first storage circuit and a second circuit comprising a second storage circuit,
wherein the first circuit is configured to retain first data in the first storage circuit during a period where electric power is supplied to the arithmetic processing circuit,
wherein the second circuit is configured to read out the first data retained in the first storage circuit and write the first data to the second storage circuit during the period where electric power is supplied to the arithmetic processing circuit,
wherein the second circuit is configured to retain the first data in the second storage circuit during a period where power supply to the arithmetic processing circuit is stopped,
wherein the acceleration sensor is configured to sense vibration of an object,
wherein the judgement circuit is configured to judge a sensed signal of the acceleration sensor by comparing the sensed signal with reference data stored in the memory and supply an interrupt signal to the processing unit in accordance with a judgment result, and
wherein the power management unit is configured to restart power supply to the arithmetic processing circuit in accordance with the interrupt signal.

7. A control system comprising:
the semiconductor device according to claim 6; and
a control device,
wherein the control device is configured to control the object in accordance with a control signal supplied from the processing unit when the judgement circuit judges that the acceleration sensor senses abnormal vibration of the object.

8. The control system according to claim 7,
wherein the semiconductor device further comprises an antenna electrically connected to the processing unit, and
wherein the control signal is supplied from the antenna of the semiconductor device to the control device via wireless communication.

9. The control system according to claim 6,
wherein the semiconductor device further comprises a secondary battery, and
wherein the power management unit is configured to supply power from the secondary battery to the arithmetic processing circuit.

10. The semiconductor device according to claim 6, wherein the object is configured to be controlled in accordance with a control signal supplied from the processing unit when the judgement circuit judges that the acceleration sensor senses abnormal vibration of the object.

\* \* \* \* \*